(12) United States Patent
Komatsu et al.

(10) Patent No.: US 8,829,510 B2
(45) Date of Patent: Sep. 9, 2014

(54) ORGANIC ELECTROLUMINESCENCE DISPLAY PANEL AND ORGANIC ELECTROLUMINESCENCE DISPLAY DEVICE

(75) Inventors: Takahiro Komatsu, Osaka (JP); Satoru Ohuchi, Osaka (JP); Ryuuta Yamada, Kyoto (JP); Hirofumi Fujita, Ehime (JP); Shinya Fujimura, Osaka (JP); Seiji Nishiyama, Osaka (JP); Kenichi Nendai, Hyogo (JP); Kou Sugano, Hyogo (JP); Shuhei Yada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/995,205

(22) PCT Filed: Jan. 18, 2012

(86) PCT No.: PCT/JP2012/000288
§ 371 (c)(1),
(2), (4) Date: Jun. 18, 2013

(87) PCT Pub. No.: WO2012/114648
PCT Pub. Date: Aug. 30, 2012

(65) Prior Publication Data
US 2013/0285042 A1    Oct. 31, 2013

(30) Foreign Application Priority Data

Feb. 23, 2011    (JP) .................. 2011-036920

(51) Int. Cl.
*H01L 29/08*   (2006.01)
*H01L 51/56*   (2006.01)
*H01L 51/50*   (2006.01)
*H01L 27/32*   (2006.01)
*H01L 51/52*   (2006.01)

(52) U.S. Cl.
CPC ............ *H01L 51/5203* (2013.01); *H01L 51/56* (2013.01); *H01L 51/5088* (2013.01); *H01L 27/3279* (2013.01); *H01L 27/329* (2013.01)
USPC .............................................. 257/40; 438/82

(58) Field of Classification Search
USPC ............................................... 257/40; 438/82
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| EP | 2175504 | 4/2010 |
| JP | 05-163488 A | 6/1993 |

(Continued)

OTHER PUBLICATIONS

Meyer et al., "Charge generation layers comprising transition metal-oxide/organic interfaces: Electronic structure and charge generation mechanism", Applied Physics Letters, 96, 193302, pp. 1-3 (May 2010).

(Continued)

*Primary Examiner* — Douglas Menz
(74) *Attorney, Agent, or Firm* — Greenblum & Bernstein, P.L.C.

(57) ABSTRACT

The present invention provides an organic EL display panel and an organic EL display apparatus that can be driven at a low voltage and that exhibit excellent light-emitting efficiency. Sequentially fixated on a substrate are: a first electrode; auxiliary wiring; a hole injection layer; a functional layer; and a second electrode. The hole injection layer and the second electrode are both formed to be continuous above the first electrode and above the auxiliary wiring. The second electrode and the auxiliary wiring are electrically connected by the hole injection layer. The hole injection layer contains tungsten oxide and at least 2 nm thick so as to have, in an electronic state thereof, an occupied energy level in a range between 1.8 eV and 3.6 eV lower than a lowest energy level of a valence band in terms of a binding energy.

35 Claims, 28 Drawing Sheets

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 7,785,718 B2 | 8/2010 | Yatsunami et al. |
| 8,058,797 B2 | 11/2011 | Frey et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0178414 A1 | 9/2004 | Frey et al. |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0034864 A1 | 2/2007 | Liu |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0150422 A1 | 6/2008 | Ohara |
| 2008/0231179 A1 | 9/2008 | Abe et al. |
| 2008/0312437 A1 | 12/2008 | Inoue et al. |
| 2009/0160325 A1 | 6/2009 | Yatsunami et al. |
| 2009/0200917 A1 | 8/2009 | Yamagata et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0213827 A1 | 8/2010 | Yoshida et al. |
| 2010/0252857 A1 | 10/2010 | Yoshida |
| 2010/0258833 A1 | 10/2010 | Okumoto et al. |
| 2010/0302221 A1 | 12/2010 | Okumoto |
| 2011/0037068 A1 | 2/2011 | Yamazaki et al. |
| 2011/0042703 A1 | 2/2011 | Okumoto et al. |
| 2011/0140091 A1 | 6/2011 | Friend et al. |
| 2012/0061656 A1 | 3/2012 | Ohuchi et al. |
| 2012/0132934 A1 | 5/2012 | Ohuchi et al. |
| 2012/0132935 A1 | 5/2012 | Isobe et al. |
| 2012/0178191 A1 | 7/2012 | Sakanoue et al. |

FOREIGN PATENT DOCUMENTS

| | | |
|---|---|---|
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| JP | 2011-044445 | 3/2011 |
| WO | 2008/120714 A1 | 10/2008 |
| WO | 2008/149498 A1 | 12/2008 |
| WO | 2008/149499 A1 | 12/2008 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

United States Office Action in U.S. Appl. No. 13/742,593, dated Apr. 3, 2014.

United States Office Action in U.S. Appl. No. 13/746,485, dated Apr. 25, 2014.

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

(56) References Cited

OTHER PUBLICATIONS

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

United States Office Action in U.S. Appl. No. 13/298,528, dated Jan. 11, 2013.

United States Office Action in U.S. Appl. No. 13/298,528, dated May 17, 2013.

Japan Office Action in Japanese Patent Application No. 2009-189658, dated Apr. 8, 2013.

Stella Tsuushin (Stella communication), Stella Corporation, undated, available at http://www.stellacorp.co.jp/media/conference#past/0902sorst.html, accessed on Apr. 8, 2013, together with a partial English language translation.

L. Chkoda et al., "Work function of ITO substrates and band-offsets at the TPD/ITO interface determined by photoelectron spectroscopy", Synthetic metals 111-112, pp. 315-319 (2000).

U.S. Appl. No. 13/298,528 to Satoru Ohuchi et al., filed Nov. 27, 2011.

U.S. Appl. No. 13/739,363 to Seiji Nishiyama et al., filed Jan. 11, 2013.

U.S. Appl. No. 13/746,485 to Kenji Harada et al., filed Jan. 22, 2013.

U.S. Appl. No. 13/742,593 to Kenji Harada et al., filed Jan. 16, 2013.

U.S. Appl. No. 13/994,164 to Satoru Ohuchi et al., filed Jun. 14, 2013.

U.S. Appl. No. 13/660,291 to Takahiro Komatsu et al., filed Oct. 25, 2011.

International Search Report in PCT/JP2010/004471, dated Oct. 5, 2010.

International Search Report in PCT/JP2010/004987, dated Sep. 7, 2010.

International Search Report in PCT/JP2010/004993, dated Sep. 7, 2010.

International Search Report in PCT/JP2010/004989, dated Sep. 7, 2010.

International Search Report in PCT/JP2011/000324, dated Feb. 22, 2011.

International Search Report in PCT/JP2012/000288, dated Apr. 17, 2012.

International Search Report in PCT/JP2011/006448, dated Feb. 21, 2012.

International Search Report in PCT/JP2012/000963, dated May 15, 2012.

U.S. Appl. No. 14/000,977 to Satoru Ohuchi et al., filed Aug. 22, 2013.

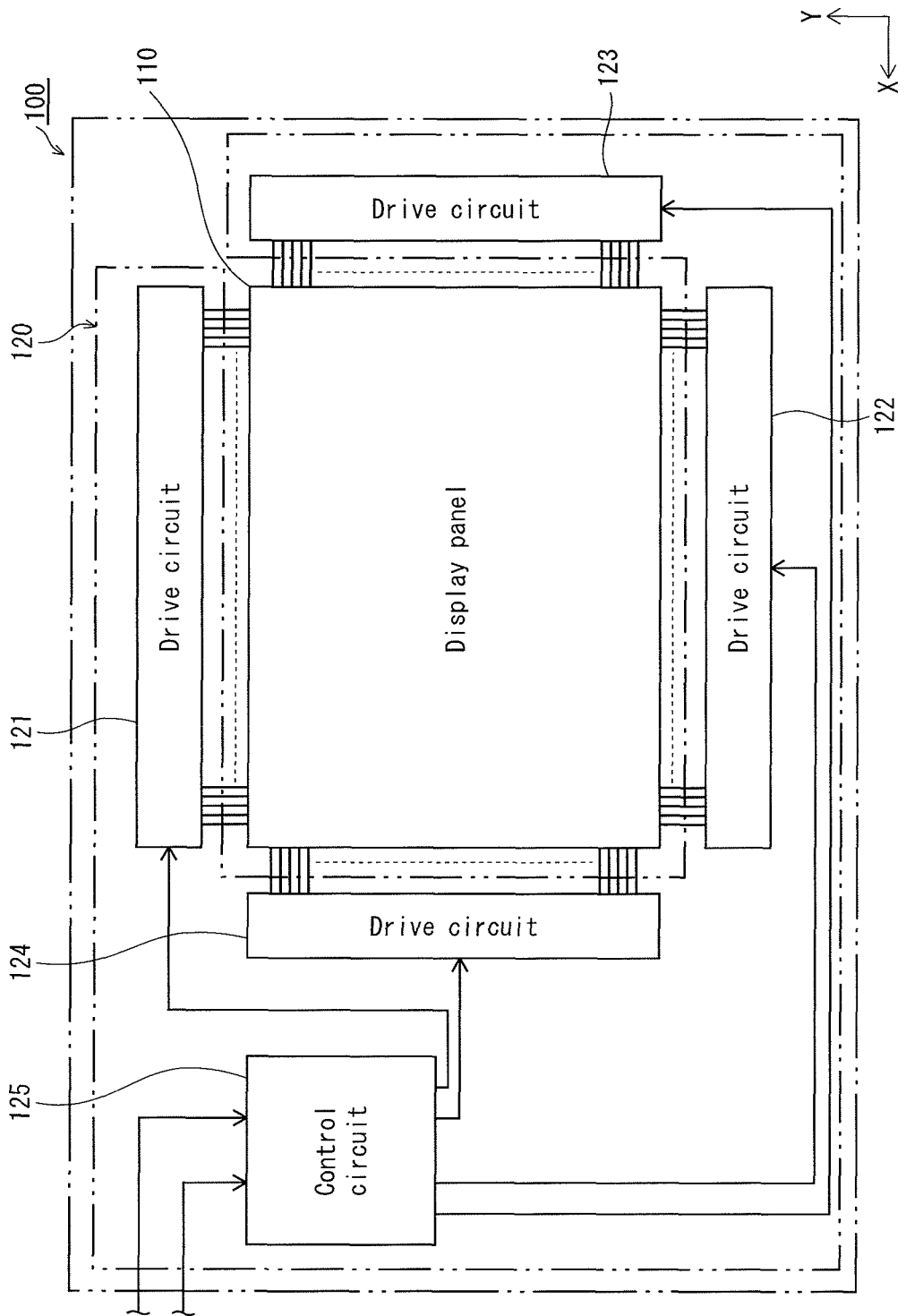

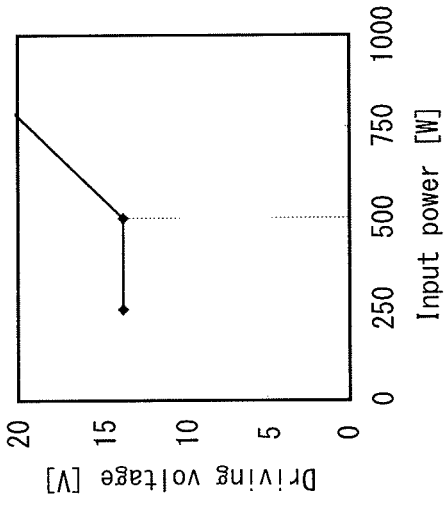
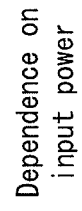
FIG. 12A Dependence on total pressure
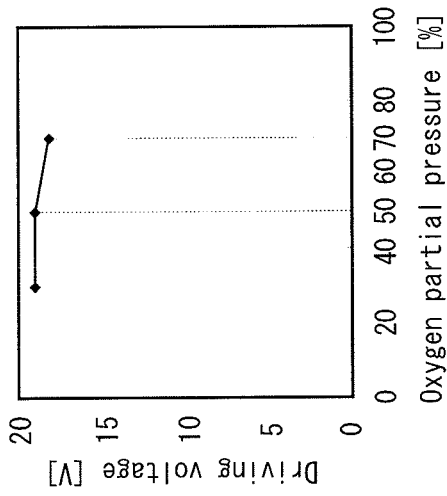
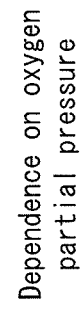
FIG. 12B Dependence on oxygen partial pressure
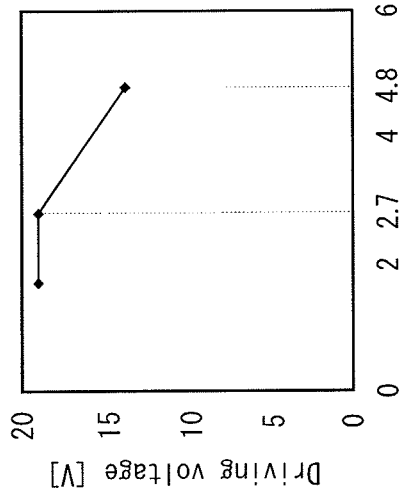
FIG. 12C Dependence on input power

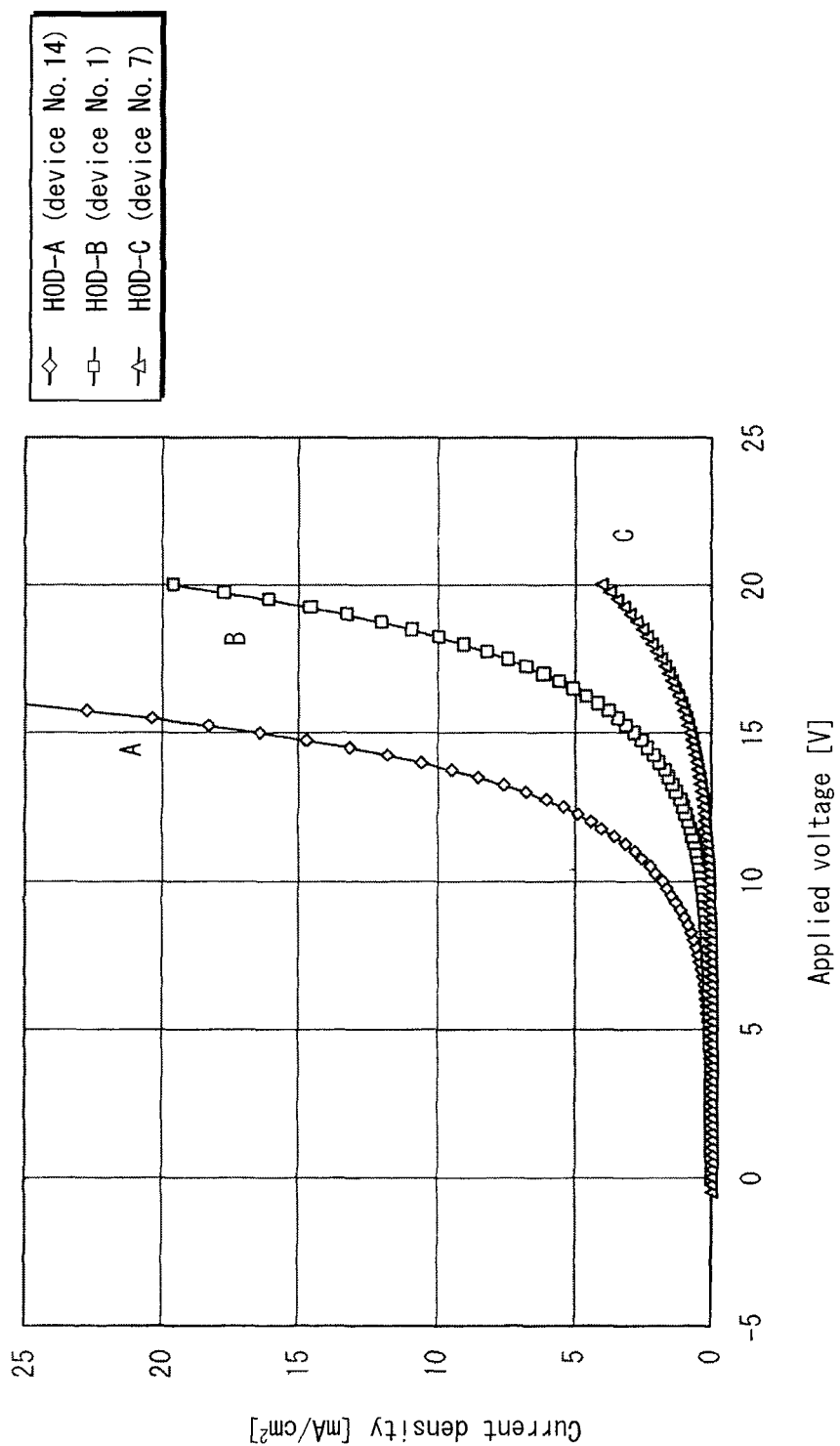

(A: Appropriate injection sites for tungsten oxide layer)

(B, C: No/insufficient injection sites for tungsten oxide layer)

ORGANIC ELECTROLUMINESCENCE DISPLAY PANEL AND ORGANIC ELECTROLUMINESCENCE DISPLAY DEVICE

TECHNICAL FIELD

The present invention relates to organic EL display panels and organic EL display apparatuses that use electric light-emitting elements that are organic electric-field light-emitting elements (hereinafter referred to as "organic EL elements").

BACKGROUND ART

In recent years, progress is being made in research and development of diverse functional elements that use organic semiconductors. Organic EL elements are among the most common of such functional elements. An organic EL element is a current-driven light emitter that includes a pair of electrodes, consisting of an anode and a cathode, and a functional layer disposed between the pair of electrodes. The functional layer includes a light-emitting layer formed from organic material. Voltage is applied between the pair of electrodes. The emission of light from the organic EL element is caused by an electric-field light-emitting phenomenon taking place as a result of the recombination of holes injected from the anode to the functional layer and electrons injected from the cathode to the functional layer. Given the high visibility of organic EL elements resulting from their self-luminescence, as well as their excellent shock resistance resulting from the fully solid-state structure thereof, more attention is now being given to the application of organic EL elements as a light emitter for various organic EL display panels and organic EL display apparatuses or a light source.

In order to increase the light emission efficiency of an organic EL element, efficient injection of carriers (holes and electrons) from the electrodes to the functional layer is essential. Generally, provision of an injection layer in between each of the electrodes and the functional layer is effective in realizing efficient injection of carriers to the functional layer, since an injection layer has the function of lowering the energy barrier during injection. An organic material, such as copper phthalocyanine or PEDOT (conductive polymer), or a metal oxide, such as molybdenum oxide or tungsten oxide, is used as the hole injection layer provided between the functional layer and the anode. An organic material, such as a metal complex or oxadiazole, or a metal such as barium is used as the electron injection layer provided between the functional layer and the cathode.

Among such injection layers, an improvement in hole injection efficiency as well as longevity of the organic EL element has been reported for an organic EL element using a metal oxide, such as molybdenum oxide or tungsten oxide, as the hole injection layer (see Patent Literature 1 and Non-Patent Literature 1). A report has also been made regarding the influence on the improvement by the electron level formed by structures similar to an oxygen vacancy of the metal oxide on the surface of the hole injection layer (Non-Patent Literature 2).

On the other hand, as organic EL display panels grow in size, it becomes necessary to reduce the resistance of the wiring portion that connects the power source to the electrodes in the organic EL pixels constituting the panel. In particular, in a top emission type active-matrix organic EL display panel, it is necessary to use transparent electrode material, such as ITO or IZO, as the common electrode. As these materials are relatively high resistance, it is desirable to limit their use as a wiring portion.

With respect to this point, for example, Patent Literature 2 discloses a top emission type organic EL element with a wiring portion structured so that the second electrode (common electrode) is connected to auxiliary wiring, thus providing a wiring portion that reduces the use of the relatively high-resistance common electrode. The auxiliary wiring is low-resistance wiring that provides electrons from the power source to the common electrode.

It is desirable to provide the auxiliary wiring in a non-light-emitting area, so as not to block the light-emitting cell. Furthermore, the auxiliary wiring may be provided either above or below the common electrode in the non-light-emitting area. A structure in which the auxiliary wiring is provided below can be considered more desirable, as the auxiliary wiring can be formed during the same processes as when forming other components such as the thin-film transistors and pixel electrodes.

CITATION LIST

Patent Literature

[Patent Literature 1]
Japanese Patent Application Publication No. 2005-203339
[Patent Literature 2]
Japanese Patent Application Publication No. 2002-318556

Non-Patent Literature

[Non-Patent Literature 1]
Jingze Li et al., Synthetic Metals 151, 141 (2005)
[Non-Patent Literature 2]
Kaname Kanai et al., Organic Electronics 11, 188 (2010)
[Non-Patent Literature 3]
Hiromi Watanabe et al., Yuki E L Tohronkai Dai 7 Kai Reikai Yokoushuu 17 (2008)
[Non-Patent Literature 4]
Hyunbok Lee et al., Applied Physics Letters 93, 043308 (2008)
[Non-Patent Literature 5]
Yasuo Nakayama et al., Yuki E L Tohronkai Dai 7 Kai Reikai Yokoushuu 5 (2008)

SUMMARY OF INVENTION

Technical Problem

In an organic EL element in which the auxiliary wiring is below the common electrode, patterning is typically performed after forming the pixel electrodes (anodes) and the auxiliary wiring as one film. The hole injection layer is subsequently layered thereon.

In this context, it is desirable that a hole injection layer made from copper phthalocyanine or PEDOT not be formed on the auxiliary wiring. This is not only because such hole injection layers are typically high resistance, but also because forming such hole injection layers on the auxiliary wiring prevents the supply of electrodes from the auxiliary wiring to the common electrode.

Specifically, such hole injection layers are designed so that the binding energy of the highest occupied molecular orbital is near (approximately equal to) the Fermi level of ITO or the like, which is typically used as the anode. Conversely, the lowest unoccupied molecular orbital is quite far from the Fermi level. As a result, although hole injection into the hole injection layers from the anode is relatively easy, electron injection is difficult. While this is advantageous in the light-emitting unit, it causes an increase in resistance of the wiring portion at the connecting portion between the auxiliary wiring and the common electrode, as electrons cannot be provided to the common electrode through the hole injection layers from the auxiliary wiring which is made from the same material as the anode.

Furthermore, many materials used for the hole injection layer are chemically unstable with respect to electrons and tend to decompose or degrade upon continual reception of electrons over an extended period of time. This may result in degradation of the panel characteristics.

It is therefore necessary that these hole injection layers not be formed by patterning on the auxiliary wiring. Methods for film formation by patterning include: 1) a method of selectively forming films on pixel electrodes using mask deposition, screen printing, inkjet printing, or the like; and 2) a method of first forming a film over the entire surface, and then using photolithography, dry etching, or the like to selectively remove only portions above the auxiliary wiring. However, both of these methods increase the number of processes involved, which in turn leads to an increase in manufacturing costs, as well as an increase in particles that lowers the yield. Furthermore, resist residue and the like from the patterning may remain on the auxiliary wiring, acting as a resistance component and further increasing the resistance of the wiring portion.

In view of such problems, the present invention aims to provide an organic EL display panel and an organic EL display apparatus that can be driven at a low voltage and that exhibit excellent light-emitting efficiency.

Solution to Problem

In order to achieve the above aim, an organic EL display panel according to one aspect of the present invention includes: a substrate; at least one first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode above the functional layer. The hole injection layer and the second electrode are both disposed to be continuous above the first electrode and above the auxiliary wiring. The second electrode and the auxiliary wiring are electrically connected by the hole injection layer. The hole injection layer contains tungsten oxide and has, in an electronic state thereof, an occupied energy level in a range between 1.8 electron volts and 3.6 electron volts lower than a lowest energy level of a valence band of the hole injection layer in terms of a binding energy.

Advantageous Effects of Invention

According to one aspect of the present invention, an organic EL display panel and an organic EL display apparatus is provided with a hole injection layer that contains tungsten oxide and has, in an electronic state thereof, an occupied energy level in a range between 1.8 electron volts and 3.6 electron volts lower than a lowest energy level of a valence band of the hole injection layer in terms of a binding energy. Therefore, the organic EL display panel and the organic EL display apparatus can be driven at a low voltage, and is expected to exhibit excellent light-emitting efficiency. Note that the unit electron volts may be abbreviated "eV"

Providing the hole injection layer having such an occupied energy level allows for reduction in the hole injection barrier between the hole injection layer and the functional layer in the light-emitting cell, while also allowing for the exchange of carriers with almost no barrier between the pixel electrode in the light-emitting cell and the hole injection layer, between the auxiliary wiring in the wiring portion and the hole injection layer, and between the hole injection layer and the common electrode. Consequently, the organic EL display panel is driven at a low voltage and exhibits excellent light-emitting efficiency.

BRIEF DESCRIPTION OF DRAWINGS

FIG. 2 is a diagram illustrating the overall configuration of an organic EL display apparatus according to an aspect of the present invention.

FIGS. 12A-12C are graphs illustrating a dependence of driving voltage of hole-only devices on film forming conditions of a hole injection layer.

FIG. 13 is a device characteristics diagram showing relation curves illustrating relations between applied voltage and current density of the hole-only devices.

DESCRIPTION OF EMBODIMENTS

Figure 1A:
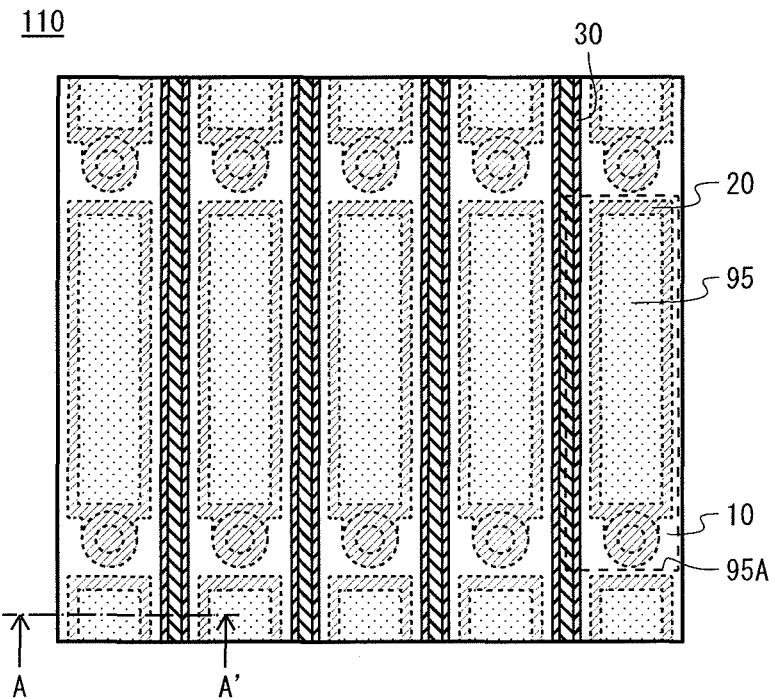
FIGS. 1A and 1B illustrate an organic EL display panel according an aspect of to the present invention.

Outline of an Aspect of the Present Invention

In order to achieve the above aim, an organic EL display panel according to one aspect of the present invention includes: a substrate; at least one first electrode on or in the substrate; auxiliary wiring on or in the substrate at a distance from the first electrode; a functional layer, including at least a light-emitting layer, above the first electrode; a hole injection layer for injecting holes to the functional layer, the hole injection layer being between the first electrode and the functional layer; and a second electrode above the functional layer. The hole injection layer and the second electrode are both disposed to be continuous above the first electrode and above the auxiliary wiring. The second electrode and the auxiliary wiring are electrically connected by the hole injection layer. The hole injection layer contains tungsten oxide and has, in an electronic state thereof, an occupied energy level in a range between 1.8 electron volts and 3.6 electron volts lower than a lowest energy level of a valence band of the hole injection layer in terms of a binding energy.

According to this aspect, the hole injection layer contains tungsten oxide. Further, the hole injection layer has, in an electronic state thereof, an occupied energy level which is 1.8 eV to 3.6 eV lower than the lowest energy level of a valence band of the hole injection layer, in terms of the binding energy. Providing the hole injection layer having such an occupied energy level allows for reduction in the hole injection barrier between the hole injection layer and the functional layer in the light-emitting cell, while also allowing for the exchange of carriers with almost no barrier between the pixel electrode in the light-emitting cell and the hole injection layer, between the auxiliary wiring in the wiring portion and the hole injection layer, and between the hole injection layer and the common electrode. Resultantly, the organic EL display panel has excellent hole injection efficiency, can be driven at a low voltage, and is expected to exhibit excellent light-emitting efficiency.

Furthermore, according to this aspect, carriers can be exchanged with almost no barrier between the auxiliary wiring in the wiring portion and the hole injection layer, and between the hole injection layer and the common electrode. It therefore poses no problem to form the hole injection layer on the auxiliary wiring, making a step to pattern the hole injection layer unnecessary. This not only reduces the number of processes but also allows for stable mass production.

Furthermore, according to this aspect, the hole injection layer is constituted by chemically stable tungsten oxide. Therefore, the hole injection layer can be prevented from deteriorating or decomposing in properties by the alkaline solution, water, organic solvent, or the like used during formation of the bank. Accordingly, after completion of the organic EL element, the hole injection layer is able to maintain its form, its excellent efficiency for injecting holes to the functional layer in the light emitting cell, and its excellent exchange of carriers with the common electrode in the wiring portion. This allows the manufacturing of an organic EL element which is able to withstand processing performed during the mass production of organic EL display panels.

The light-emitting layer of the organic EL element is layered after formation of the hole injection layer. Typically, the light-emitting layer is applied separately for each color of emitted light (for example, R, G, and B). To prevent colors from mixing between pixels and to ensure a high level of accuracy, barriers (hereinafter referred to as a bank) may be provided between pixels. The bank is typically formed with photolithography, for example by applying bank material composed of photosensitive resist material onto the surface of the hole injection layer, pre-baking the bank material, exposing the bank material to light with a pattern mask, removing unhardened, excess bank material with a developer composed of an alkaline solution or the like, and finally rinsing with pure water. In the process of forming the bank, an alkaline solution, water, an organic solvent, and the like are used. If the hole injection layer is composed of an organic material, such material will degrade or decompose in properties due to the above solutions, thereby damaging the hole injection layer and preventing the achievement of the desired hole injection efficiency. By contrast, the hole injection layer according to the aspect of the present invention is formed from tungsten oxide, which does not easily degrade or decompose in properties due to the above solvents. The risk of the above problem therefore is little.

In one mode of the organic EL display panel according to the aspect of the present invention, the second electrode is a transparent electrode.

In one mode of the organic EL display panel according to the aspect of the present invention, the transparent electrode is one of ITO and IZO.

As described above, in a top emission type organic EL element, a transparent electrode material such as ITO or IZO needs to be used for the common electrode (second electrode), but these materials have a higher resistivity than metallic materials. As a result, extensive use of the common electrode in the wiring portion leads to differences in the length of the common electrode between light-emitting pixels, the differences becoming greater as the display panel increases in area. A large voltage drop thus occurs between the center of the display panel and the edge of the power supply unit, causing a corresponding difference in luminance that makes the center appear dark. In other words, this may lead to the problem of fluctuations in voltage, depending on the position of the organic EL element within the display panel, and the problem of degradation in display quality. Therefore, as described above, the wiring portion also adopts low-voltage auxiliary wiring in order to minimize usage of the common electrode.

The tungsten oxide provided with predetermined properties as per the present invention also forms Schottky ohmic contact with these metals and therefore does not lead to an increase in the resistance of the wiring portion even when the hole injection layer containing the tungsten oxide is formed between the auxiliary wiring and the transparent electrode material. Specifically, carriers can be exchanged with almost no barrier between the auxiliary wiring and the hole injection layer, as well as between the hole injection layer and the common electrode composed of ITO, IZO, or the like. Resultantly, the organic EL display panel which is the aspect of the present invention can be driven at a low voltage, and is expected to exhibit excellent light-emitting efficiency.

In one mode of the organic EL display panel according to the aspect of the present invention, the second electrode contains one of Al (aluminum) and Ag (silver) as a primary component.

In one mode of the organic EL display panel according to the aspect of the present invention, the organic EL display panel further includes a metal layer that is continuous above the first electrode and above the auxiliary wiring. Above the first electrode, the metal layer is between the second electrode and the light-emitting layer. Above the auxiliary wiring, the metal layer is between the second electrode and the hole injection layer.

In one mode of the organic EL display panel according to the aspect of the present invention, the metal layer is an electron injection layer that, above the first electrode, injects electrons from the second electrode (common electrode) to the light-emitting layer.

In one mode of the organic EL display panel according to the aspect of the present invention, the metal layer includes Ba (barium).

In one mode of the organic EL display panel according to the aspect of the present invention, in a bottom emission type organic EL element, a highly reflective metallic material, such as Ag or Al, may be used as the second electrode (common electrode).

The tungsten oxide provided with predetermined properties as per the present invention also forms Schottky ohmic contact with these metals and therefore does not lead to an increase in the resistance of the wiring portion even when the hole injection layer containing the tungsten oxide is formed on the auxiliary wiring. Specifically, carriers can be exchanged with almost no barrier between the auxiliary wiring and the hole injection layer, as well as between the hole injection layer and the common electrode or metal layer composed of Ba, Al, Ag, or the like. Resultantly, the organic EL display panel according to the aspect of the present invention can be driven at a low voltage, and is expected to exhibit excellent light-emitting efficiency.

In one mode of the organic EL display panel according to the aspect of the present invention, the auxiliary wiring is one of ITO and IZO.

As described above, carriers can be exchanged with almost no barrier between the hole injection layer and the auxiliary wiring composed of ITO or IZO. Accordingly, the organic EL display panel according to the aspect of the present invention can be expected to allow for driving at a low voltage while exhibiting excellent light-emitting efficiency.

In one mode of the organic EL display panel according to the aspect of the present invention, the hole injection layer above the auxiliary wiring has properties identical to the hole injection layer above the first electrode.

In one mode of the organic EL display panel according to the aspect of the present invention, at least above the auxiliary wiring, the hole injection layer is at least 4 nanometers thick. Note that the unit "nanometers" may be abbreviated "nm".

The above structure according to the aspect of the present invention is even more desirable, since Schottky ohmic contact stably forms between the auxiliary wiring in the wiring portion and the hole injection layer, as well as between the hole injection layer and the metal layer. Stable carrier exchange can therefore be expected. In other words, it is desirable to guarantee at least 2 nm for stable Schottky ohmic contact between the auxiliary wiring in the hole injection layer, and to guarantee at least 2 nm for stable Schottky ohmic contact between the hole injection layer and the metal layer. A thickness of at least 4 nm in total is therefore considered even more desirable.

In one mode of the organic EL display panel according to the aspect of the present invention further includes a bank on the hole injection layer defining at least one aperture exposing the first electrode and including a region exposing the auxiliary wiring. The light-emitting layer is disposed above the first electrode in the aperture defined by the bank.

In one mode of the organic EL display panel according to the aspect of the present invention, the at least one first electrode comprises a plurality of first electrodes, one per pixel. The at least one aperture in the bank comprises a plurality of apertures in one-to-one correspondence with the first electrodes.

In one mode of the organic EL display panel according to the aspect of the present invention, the at least one first electrode comprises a plurality of first electrodes, one per pixel, arranged in lines. The at least one aperture in the bank comprises a plurality of apertures, one for each of the lines of the first electrodes.

In one mode of the organic EL display panel according to the aspect of the present invention, the hole injection layer is at least 2 nanometers thick.

In one mode of the organic EL display panel according to the aspect of the present invention, a UPS spectrum of the hole injection layer exhibits an upward protrusion in the range between 1.8 electron volts and 3.6 electron volts lower than the lowest energy level of the valence band in terms of the binding energy.

In one mode of the organic EL display panel according to the aspect of the present invention, an XPS spectrum of the hole injection layer exhibits an upward protrusion in the range between 1.8 electron volts and 3.6 electron volts lower than the lowest energy level of the valence band in terms of the binding energy.

In one mode of the organic EL display panel according to the aspect of the present invention, a differential spectrum obtained by differentiating a UPS spectrum of the hole injection layer exhibits a shape expressed by a non-exponential function throughout a range between 2.0 electron volts and 3.2 electron volts lower than the lowest energy level of the valence band in terms of the binding energy.

In one mode of the organic EL display panel according to the aspect of the present invention, the occupied energy level of the hole injection layer is in a range between 2.0 electron volts and 3.2 electron volts lower than the lowest energy level of the valence band in terms of the binding energy.

In one mode of the organic EL display panel according to the aspect of the present invention, at an interface between the hole injection layer and the functional layer, the occupied energy level of the hole injection layer causes a highest occupied molecular orbital of the functional layer, to be approximately equal to the occupied energy level in terms of the binding energy.

In one mode of the organic EL display panel according to the aspect of the present invention, at the interface between the hole injection layer and the functional layer, a gap between the occupied energy level and the highest occupied molecular orbital of the functional layer is at most 0.3 electron volts in terms of the binding energy.

In one mode of the organic EL display panel according to the aspect of the present invention, at an interface between the first electrode and the hole injection layer, the occupied energy level of the hole injection layer causes the binding energy of the occupied energy level to be approximately equal to a Fermi level of the first electrode.

In one mode of the organic EL display panel according to the aspect of the present invention, at the interface between the first electrode and the hole injection layer, a gap between the occupied energy level of the hole injection layer and the Fermi level of the first electrode is at most 0.3 electron volts in terms of the binding energy.

In one mode of the organic EL display panel according to the aspect of the present invention, at an interface between the auxiliary wiring and the hole injection layer, the occupied energy level of the hole injection layer causes the binding energy of the occupied energy level to be approximately equal to a Fermi level of the auxiliary wiring.

In one mode of the organic EL display panel according to the aspect of the present invention, at the interface between the auxiliary wiring and the hole injection layer, a gap between the occupied energy level of the hole injection layer and the Fermi level of the auxiliary wiring is at most 0.3 electron volts in terms of the binding energy.

In one mode of the organic EL display panel according to the aspect of the present invention, at an interface between the hole injection layer and the second electrode, the occupied energy level of the hole injection layer causes the binding energy of the occupied energy level to be approximately equal to a Fermi level of the second electrode.

In one mode of the organic EL display panel according to the aspect of the present invention, at the interface between the hole injection layer and the second electrode, a gap between the occupied energy level of the hole injection layer and the Fermi level of the second electrode is at most 0.3 electron volts in terms of the binding energy.

In one mode of the organic EL display panel according to the aspect of the present invention, at an interface between the hole injection layer and the electron injection layer, the occupied energy level of the hole injection layer causes the binding energy of the occupied energy level to be approximately equal to a Fermi level of the electron injection layer.

In one mode of the organic EL display panel according to the aspect of the present invention, at the interface between the hole injection layer and the electron injection layer, a gap between the occupied energy level of the hole injection layer and the Fermi level of the electron injection layer is at most 0.3 electron volts in terms of the binding energy.

According to another aspect of the present invention, an organic EL display panel includes: a substrate; at least one first electrode on or in the substrate; wiring on or in the substrate at a distance from the first electrode; an organic layer above the first electrode, the organic layer containing organic material; a tungsten oxide layer between the organic layer and the first electrode, the tungsten oxide layer containing tungsten oxide; and a second electrode above the organic layer. The tungsten oxide layer and the second electrode are both disposed to be continuous above the first electrode and above the wiring. The second electrode and the wiring are electrically connected by the tungsten oxide layer. The tungsten oxide layer has, in an electronic state thereof, an occupied energy level in a range between 1.8 electron volts and 3.6 electron volts lower than a lowest energy level of a valence band of the tungsten oxide layer in terms of the binding energy.

According to a yet another aspect of the present invention, an organic EL display apparatus include: the organic EL display panel according to any one of the modes and aspects described above.

According to a yet another aspect of the present invention, a manufacturing method for an organic EL display panel includes: a first step of forming a first electrode on or in a substrate; a second step of forming auxiliary wiring on or in the substrate at a distance from the first electrode; a third step of forming a hole injection layer to be continuous above the first electrode and above the auxiliary wiring; a fourth step of forming, above the first electrode, a functional layer including at least a light-emitting layer; and a fifth step of forming a second electrode to be continuous above the functional layer and above the hole injection layer formed above the auxiliary wiring. The second electrode and the auxiliary wiring are electrically connected by the hole injection layer. The hole injection layer contains tungsten oxide and has, in an electronic state thereof, an occupied energy level in a range between 1.8 electron volts and 3.6 electron volts lower than a lowest energy level of a valence band of the hole injection layer in terms of a binding energy.

In one mode of the manufacturing method according to the aspect of the present invention, the manufacturing method further includes, between the third step and the fourth step, a step of forming a bank on the hole injection layer defining at least one aperture exposing the first electrode and including a region exposing the auxiliary wiring. In the fourth step, the functional layer is formed within the aperture defined by the bank.

In one mode of the method of manufacturing an organic EL display panel according to the aspect of the present invention, in the third step, the hole injection layer formed above the auxiliary wiring has identical properties to the hole injection layer formed above the first electrode.

According to a yet another aspect of the present invention, a manufacturing method for an organic EL display panel includes: a first step of forming a first electrode on or in a substrate; a second step of forming wiring on or in the substrate at a distance from the first electrode; a third step of forming a tungsten oxide layer, containing tungsten oxide, to be continuous above the first electrode and above the wiring; a fourth step of forming an organic layer, containing organic material, above the first electrode; a fifth step of forming a second electrode to be continuous above the functional layer and above the tungsten oxide layer formed above the wiring. The second electrode and the wiring are electrically connected by the tungsten oxide layer. The tungsten oxide layer has, in an electronic state thereof, an occupied energy level in a range between 1.8 electron volts and 3.6 electron volts lower than a lowest energy level of a valence band of the tungsten oxide layer in terms of a binding energy.

Note that when a numerical range is indicated in the present disclosure, both the upper and lower limits are included in the numerical range. For example, a range between 1.8 eV and 3.6 eV includes both 1.8 eV and 3.6 eV.

Discovery Leading to the Present Invention

The present inventors observed the following through an experiment described below: if an occupied energy level near the Fermi surface, formed by a structure similar to an oxygen vacancy, exists along the surface of a hole injection layer formed from a metal oxide, then at the interface between the hole injection layer and the functional layer, the difference (i.e., gap) between the lowest binding energy of the occupied energy level near the Fermi surface and the binding energy of the highest occupied molecular orbital in the functional layer becomes small.

Focusing on this observation, the inventors discovered that if the occupied energy level near the Fermi surface exists in the hole injection layer, then the difference (i.e., gap) between the lowest binding energy of the occupied energy level near the Fermi surface and the Fermi level of the electrode is also small at the interface with the electrodes such as the anode, the cathode, and the auxiliary wiring. This suggested the possibility of favorable carrier exchange.

The inventors then discovered that a hole injection layer made from metal oxide that has an occupied energy level near the Fermi surface can achieve Schottky ohmic contact with electrodes that are relatively low-resistance and are made from a metal material such as Al, or electrodes made from a transparent electrode material with a relatively high resistance, such as ITO or IZO. For this reason, even if formed on the auxiliary wiring, the hole injection layer does not increase the resistance of the wiring portion.

Next, the inventors also examined the material for forming a hole injection layer that does not easily degrade or decompose in the bank forming process.

As described above, a metal oxide, which is an inorganic material, is a good material for forming a hole injection layer with improved driving voltage and longevity of the organic EL element. However, actual manufacturing of an organic EL element using molybdenum oxide for the hole injection layer suggested that the hole injection layer might degrade in properties or decompose due to the alkaline solution, water, organic solvent, or the like use during the bank forming process. Degradation in properties or decomposition of the hole injection layer would impair the expected ability of the hole injection layer to inject holes above the pixel electrode in the light-emitting cell and would increase the resistance of the wiring portion above the auxiliary wiring, thus preventing normal driving of the organic EL element. Moreover, such a hole injection layer would not be able to withstand the mass production process of organic EL elements and organic EL display panels incorporating such organic EL elements. Therefore, it cannot always be considered desirable to form the hole injection layer from molybdenum oxide, which may cause degradation or decomposition.

Therefore, focusing on tungsten oxide which has a lower probability of causing degradation or decomposition, the inventors discovered that tungsten oxide provided with certain physical properties has low solubility and does not easily degrade in the above solution and the like. Furthermore, such tungsten oxide has a strong capability to inject holes.

Embodiments

The following is a description of an organic EL display panel and an organic EL display apparatus according to an aspect of the present invention, followed by the results of experiments to confirm performance and an analysis thereof. It is to be noted that, in each of the accompanying figures, the relation between sizes of each of the members are not illustrated directly reflecting the actual relation.

<Structure of Organic EL Display Panel>

Figure 1B:
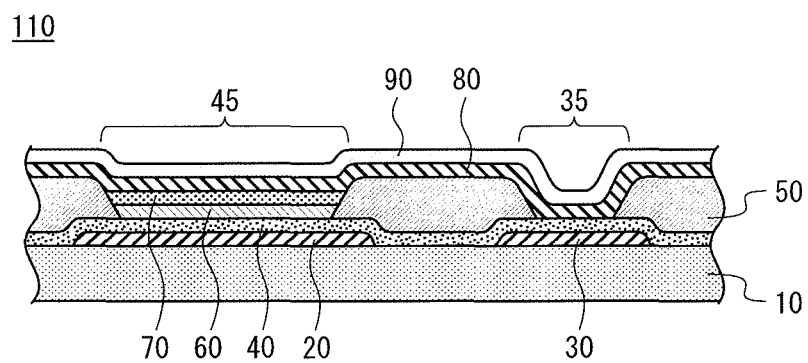

FIGS. 1A and 1B illustrate an organic EL display panel according to an aspect of the present invention. FIG. 1A is a partial plan view illustrating the main portions of the organic EL display panel. FIG. 1B is a cross-section diagram taken along the line from A to A' in FIG. 1A.

As shown in FIG. 1A, an organic EL display panel 110 according to the present embodiment is provided with a matrix of a plurality of light-emitting pixels 95A each having a light-emitting cell 95. A plurality of anodes (pixel electrodes, first electrodes) 20 are provided, one for each pixel, and auxiliary wiring (also corresponding to the wiring) 30 is provided along the light-emitting cells 95 for each row of light-emitting pixels.

As shown in FIG. 1B, the organic EL display panel 110 includes the following: a substrate 10; the anodes 20 and the auxiliary wiring 30 formed on the substrate 10; a hole injection layer 40 (also corresponding to the tungsten oxide layer) formed above the anodes 20 and the auxiliary wiring 30; banks 50 formed on the hole injection layer 40 and having pixel apertures 45 above the anodes 20 and connection apertures 35 above the auxiliary wiring 30; buffer layers 60 formed within the pixel apertures 45 of the banks 50; light-emitting layers 70 (also corresponding to the organic layers) formed on the buffer layers 60 within the pixel apertures 45 of the banks 50; an electron injection layer 80 (also corresponding to the metal layer) formed on the upper surface of the above components; a cathode 90 (common electrode, second electrode) formed on the electron injection layer 80; and the like.

A hole injection layer with properties identical to the hole injection layer 40 formed above the anode 20 is also formed above the auxiliary wiring 30. In other words, the hole injection layer 40 is formed across the entire surface shown in the partial plan view of FIG. 1A. The electron injection layer 80 and the cathode 90 are also formed across the entire surface shown in the partial plan view of FIG. 1A.

The auxiliary wiring 30 and the cathode 90 are electrically connected via the hole injection layer 40 and the electron injection layer 80 within the connection apertures 35 provided along the auxiliary wiring 30, thus constituting the wiring portion that connects the cathode 90 to the power source. The layer structure between the cathode 90 and the auxiliary wiring 30 in the connection apertures 35 is not limited to the above structure. For example, a layer other than the hole injection layer 40 and the electron injection layer 80 may be included, or alternatively the electron injection layer 80 may be excluded. Any layer structure that does not prevent electrons from flowing from the auxiliary wiring 30 to the cathode 90 is acceptable. Organic EL display panels including such a multilayered structure are included in the scope of the present invention and achieve the same advantageous effects as the organic EL display panel 110 according to the present embodiment.

Each light-emitting cell 95 is composed of the hole injection layer 40, the buffer layer 60, the light-emitting layer 70, and the electron injection layer 80 provided within the pixel apertures 45. Through the cathode 90, the light-emitting cell 95 emits light produced by recombination of holes and electrons injected into the light-emitting layer 70. Note that the anodes 20 are provided separately for each pixel in correspondence with the light-emitting cells 95. In other words, when the light-emitting cell is composed of subpixels, such as R, G, B subpixels, the light-emitting cell 95 and the anode 20 are provided separately in correspondence with each subpixel.
(Substrate)

The substrate 10 is the base material for the organic EL element and may be formed with one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not shown in the figures, TFTs (thin film transistors) are provided on the surface of the substrate 10 for driving the organic EL elements.
(Anode)

The anode 20 is formed by, for example, layering a 20 nm-thick transparent conductive film of ITO on a 400 nm-thick metal film of Al. Note that the structure of the anode 20 is not limited in this way and may instead be formed from a single layer, such as a transparent conductive film of ITO, IZO, or the like; a metal film of Al, Ag, or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conductive films, metal films, and metal alloy films.
(Auxiliary Wiring)

The auxiliary wiring 30 is formed by, for example, layering a 20 nm-thick transparent conductive film of ITO on a 400 nm-thick metal film of Al. Note that the structure of the auxiliary wiring 30 is not limited in this way and may instead be formed from a single layer, such as a transparent conductive film of ITO, IZO, or the like; a metal film of Al, Ag, or the like; or an alloy film of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conductive films, metal films, and metal alloy films.
(Hole Injection Layer)

The hole injection layer 40 is, for example, formed as a layer of tungsten oxide that is at least 2 nm thick (in the present example, 30 nm). In the composition formula (WOx) denoting the composition of tungsten oxide, x is a real number existing within a range of approximately 2<x<3. A thickness under 2 nm is not desirable, as such a thickness makes it difficult to form the hole injection layer 40 uniformly and to form Schottky ohmic contact between the anode 20 and the hole injection layer 40 of the light-emitting cell. The above Schottky ohmic contact can be stably formed when the thickness of the tungsten oxide layer is at least 2 nm. Therefore, by forming the hole injection layer 40 to at least this thickness, a stable efficiency of hole injection from the anode 20 to the hole injection layer 40 of the light-emitting cell can be expected.

Furthermore, it is even more desirable for the thickness of the tungsten oxide layer to be at least 4 nm, since the Schottky ohmic contact stably forms between the auxiliary wiring 30 and the hole injection layer 40 as well as between the hole injection layer 40 and the electron injection layer 80 in the wiring portion. At this thickness, stable carrier exchange can therefore be expected.

While it is desirable for the hole injection layer 40 to be formed only from tungsten oxide, the inclusion of a trace level of impurities is acceptable, provided that the amount does not exceed the amount of impurities that might normally be incorporated.

By being formed under predetermined conditions, the hole injection layer 40 has an electron level formed by a structure similar to an oxygen vacancy of a metal oxide. The existence of this electron level allows for good hole injection from the anode 20 to the hole injection layer 40 and from the hole injection layer 40 to the buffer layer 60 in the light-emitting cell, as well as good carrier exchange between the auxiliary wiring 30 and the hole injection layer 40, and between the hole injection layer 40 and the electron injection layer 80, in the wiring portion.

In greater detail, the above reference to having an "electron level formed by a structure similar to an oxygen vacancy" means that the hole injection layer 40 has, in an electronic state thereof, an occupied energy level between 1.8 eV and 3.6 eV lower than the upper end of the valence band of the hole injection layer, i.e. the lowest energy level of the valence band, in terms of the binding energy. This occupied energy level corresponds to the highest occupied energy level of the hole injection layer 40 and is closest to the Fermi level (Fermi surface) of the hole injection layer 40 in terms of the binding energy. As such, the occupied energy level of the hole injection layer is referred to as "the occupied energy level near the Fermi surface" in the following description.

The existence of the occupied energy level near the Fermi surface results in a so-called interface energy level alignment being formed at an interface between the hole injection layer 40 and the functional layer (in this example, the buffer layer 60). By formation of the interface energy level alignment, the binding energy of the highest occupied molecular orbital of the buffer layer 60 is approximately equal to the binding energy of the occupied energy level near the Fermi surface of the hole injection layer 40.

Note that the expressions "approximately equal to" and "interface energy level alignment being formed" as referred to herein indicate that at the interface between the hole injection layer 40 and the buffer layer 60, the difference (i.e., gap) between the lowest binding energy at the occupied energy level near the Fermi surface and the lowest binding energy at the highest occupied molecular orbital is ±0.3 eV.

Furthermore, the expression "interface" as referred to here denotes an area that includes a surface of the hole injection layer 40 and a portion of the buffer layer 60 within a distance of 0.3 nm from the surface of the hole injection layer 40.

Additionally, a characteristic of the hole injection layer 40 is the formation of a so-called Schottky ohmic contact at the interface with the anode 20, the auxiliary wiring 30, and the electron injection layer 80.

The expression "Schottky ohmic contact" as referred to here denotes that the Fermi level of the anode 20, the auxiliary wiring 30, and the electron injection layer 80 differs from the above-described lowest binding energy of the occupied energy level near the Fermi surface of the hole injection layer 40 by a small amount, specifically ±0.3 eV, at a position that is 2 nm away from the surface of the anode 20, auxiliary wiring 30, or the electron injection layer 80 towards the hole injection layer 40. Furthermore, the expression "interface" as referred to here denotes a region that includes a surface of the anode 20, the auxiliary wiring 30, or the electron injection layer 80 and the Schottky barrier formed on the side of the surface facing the hole injection layer 40.

Concerning the occupied energy level, it is preferable that the occupied energy level near the Fermi surface is provided to all portions of the hole injection layer 40. However, it is sufficient that the occupied energy level near the Fe surface is provided at least at the interface between the hole injection layer 40 and the anode 20, between the hole injection layer 40 and the auxiliary wiring 30, between the hole injection layer 40 and the buffer layer 60, or between the hole injection layer 40 and the electron injection layer 80. Note that not all tungsten oxide has such an occupied energy level near the Fermi surface; rather, within the hole injection layer and at the interface with the buffer layer 60, this particular energy level only forms under the predetermined film forming conditions described below.

(Banks)

The banks 50 are, for example, composed of an organic material with insulating properties (such as acrylic resin, polyimide resin, novolac-type phenolic resin, and the like). The banks 50 are formed in a pixel bank structure, with pixel apertures 45 in one-to-one correspondence with a plurality of anodes 20, or in a line bank structure, with one pixel aperture 45 corresponding to a plurality of anodes 20 arranged in a line. Note that the banks 50 are not essential to the present invention, and when an organic EL element is to be used alone, the banks need not be formed.

(Buffer Layer)

The buffer layer 60 is, for example, a 20 nm-thick layer of TFB (poly(9,9-di-n-octylfluorene-alt-(1,4-phenylene-((4-sec-butylphenyl)imino)-1,4-phenylene)), which is an amine-containing organic polymer.

(Light-Emitting Layer)

The light-emitting layer 70 is, for example, a 70 nm-thick layer of F8BT (poly(9,9-di-n-octylfluorene-alt-benzothiadiazole)), which is an organic polymer. However, the material to be used in forming the light-emitting layer 70 is not limited to this, and the light-emitting layer 70 may include a commonly-known organic material. Examples of such commonly-known organic material for the light-emitting layers 70 include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(Functional Layer)

The functional layer of the present invention is either one of, a combination of more than two of, or all of layers such as a hole transfer layer, a light-emitting layer, and a buffer layer. The hole transfer layer transfers holes, the light-emitting layer emits light as a result of recombination of holes and electrons which are injected thereto, and the buffer layer is used for adjusting optical characteristics of the organic EL element or for blocking electrons. Although the target of the present invention is the hole injection layer, an organic EL element commonly includes layers having each of the functions of the above-described hole transfer layer, light-emitting layer and the like, in addition to the hole injection layer. As such, the expression "functional layer" in the embodiment refers to all such layers which need to be included in the organic EL element, in addition to the hole injection layer.

(Electron Injection Layer)

The electron injection layer 80 is, for example, a 5 nm-thick barium layer and has the function of injecting electrons from the cathode 90 to the light-emitting layer 70. The electron injection layer 80 is formed to be continuous above the anodes 20 and above the auxiliary wiring 30. Above the anodes 20, the electron injection layer 80 is located between the cathode 90 and the light-emitting layer 70, whereas above the auxiliary wiring 30, the electron injection layer 80 is located between the cathode 90 and the hole injection layer 40. When light is emitted through the top (i.e. top emission), as in the present embodiment, the electron injection layer 80 needs to be light-transmissive. Forming the electron injection layer as a 5 nm-thick barium layer makes the electron injection layer light-transmissive. Note that when light is emitted through the bottom (i.e. bottom emission), depending on the element structure, the electron injection layer need not always be light-transmissive.

(Cathode)

The cathode 90 is formed by, for example, layering a 35 nm-thick transparent conductive film of ITO. Note that the structure of the cathode 90 is not limited in this way and may instead be formed from a thin layer of a transparent conductive film of IZO, or the like; a metal such as Al, Ag, or the like; or an alloy of APC (alloy of silver, palladium, and copper), ARA (alloy of silver, rubidium, and gold), MoCr (alloy of molybdenum and chromium), NiCr (alloy of nickel and chromium), or the like. Furthermore, a structure may be adopted having a plurality of layers selected from the above transparent conductive films, metal films, and metal alloy films.

A direct current power supply is connected to the anodes 20 and to the auxiliary wirings 30 to supply power from an external source to the organic EL display panel 110.

<Structure of Organic EL Display Apparatus>

Based on FIG. 2, an organic EL display apparatus according to an aspect of the present invention is now described. FIG. 2 is a diagram illustrating the overall configuration of an organic EL display apparatus according to the aspect of the present invention.

As illustrated in FIG. 2, an organic EL display apparatus 100 is provided with the organic EL display panel 110 according to an aspect of the present invention as well as a drive control unit 120 connected thereto. The organic EL display apparatus 100 is used in monitors, televisions, cellular telephones, and the like. The drive control unit 120 includes four drive circuits 121-124 and a control circuit 125. Note that in an actual organic EL display apparatus 100, the layout and the connection of the drive control unit 120 with respect to the display panel 110 are not limited to the depiction in FIG. 2.

<Method of Manufacturing Organic EL Display Panel>

With reference to the drawings, the following provides details on a method of manufacturing an organic EL display panel according to the present embodiment.

FIGS. 3A-3E and 4A-4D are cross-section diagrams illustrating the method of manufacturing an organic EL display panel according to an aspect of the present invention.

Figure 3A:
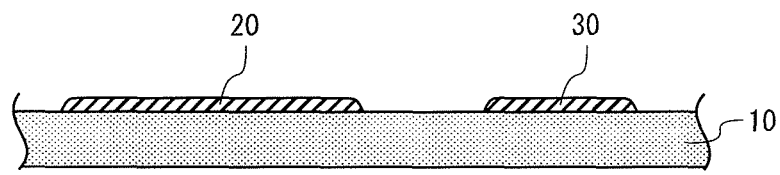
FIGS. 3A-3E are cross-section diagrams illustrating a method of manufacturing an organic EL display panel according to an aspect of the present invention.

First, as illustrated in FIG. 3A, a substrate 10 is prepared. The substrate 10 is provided with a drive circuit (not shown in the drawings) composed of, for example, TFTs (Thin Film Transistors), capacitors, and the like. Using, for example, vacuum deposition or sputtering, a metal film of Al and a transparent conductive film such as ITO are formed in this order across the entire substrate 10. Subsequently, using photolithography, the metal film and the transparent conductive layer are etched to form anodes 20 at predetermined positions as well as auxiliary wiring 30 at predetermined positions electrically insulated from the anodes 20.

At this point, the anodes 20 are formed individually in correspondence with the light-emitting units, whereas the auxiliary wiring 30 is provided in a one-dimensional arrangement along the rows or columns, for example, of light-emitting pixels provided in the two-dimensional matrix. Note that a planarizing layer, for example, may be provided on the substrate 10 as necessary to eliminate unevenness due to the drive circuit or other factors, with the anodes 20 and auxiliary wiring 30 being formed on top of the planarizing layer.

Figure 3B:
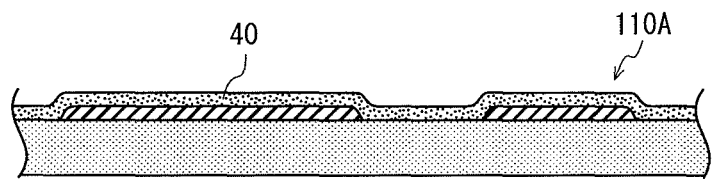

Next, as illustrated in FIG. 3B, the hole injection layer 40 is formed on the anodes 20 in the auxiliary wiring 30 by the reactive sputtering method. Specifically, the target of reactive sputtering method is metal tungsten. Argon gas and oxygen gas are respectively introduced into the chamber as the sputtering gas and the reactive gas. Under these conditions, the argon is ionized by the application of high voltage and caused to bombard the sputtering target. The metal tungsten ejected as a result of the sputtering phenomenon reacts with the oxygen gas to produce tungsten oxide. The hole injection layer 40 thus forms as a continuous film along the anodes 20 and the auxiliary wiring 30 on the substrate 10, yielding an intermediate product 110A.

The above hole injection layer 40 is formed without controlling substrate temperature and under the following conditions where: (1) gas pressure (total gas pressure) is equal to 4.8 Pa; (2) the ratio of oxygen partial pressure to the total gas pressure is equal to 50%; and (3) input power per unit surface area of the sputtering target (input power density) is equal to 1.4 W/cm$^2$. The hole injection layer 40, composed of tungsten oxide, resulting from film formation under these conditions has an electron level formed by a structure similar to an oxygen vacancy at the surface thereof.

Next, the intermediate product 110A is removed from the chamber.

Figure 3C:
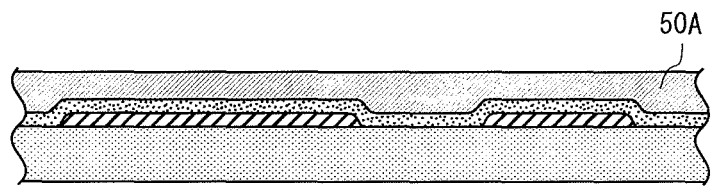

As illustrated in FIG. 3C, a negative photoresist 50A is then applied to the entire surface.

Figure 3D:
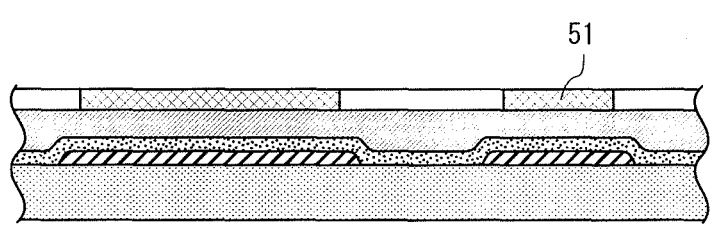

Subsequently, as illustrated in FIG. 3D, a photomask 51 having light-blocking portions at positions corresponding to the light-emitting cells and connecting portions is layered on the negative photoresist 50A. The photoresist 50A is exposed through the photomask 51 using photolithography.

Figure 3E:
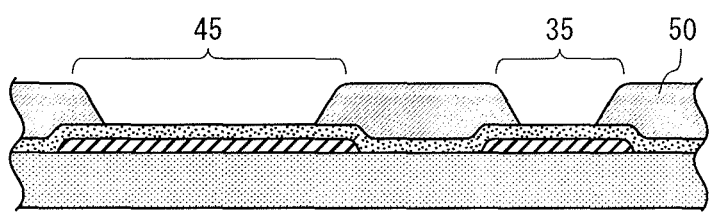

Next, as illustrated in FIG. 3E, the intermediate product 110A is developed to form the banks 50 defining the pixel apertures 45 and connection apertures 35.

Figure 4A:
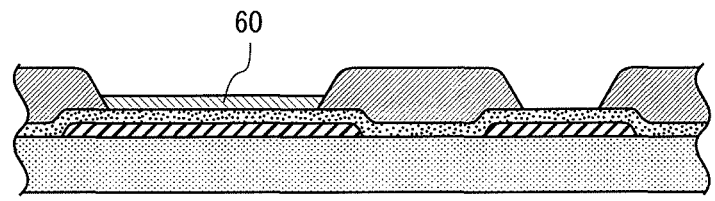
FIGS. 4A-4D are cross-section diagrams illustrating the method of manufacturing an organic EL display panel according to the aspect of the present invention.

Next, as illustrated in FIG. 4A, drops of ink composition containing organic amine-containing molecular material are ejected into the pixel apertures 45 by a wet process, such as spin coating or an inkjet method, and then the solvent is removed by volatilization. Thus, the buffer layer 60 is formed.

Figure 4B:
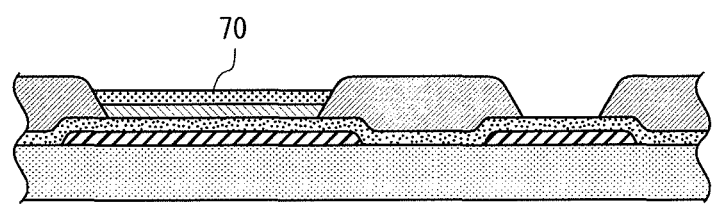

Subsequently, as illustrated in FIG. 4B, drops of ink composition containing organic light-emitting material are ejected onto the surface of the buffer layer 60 in the pixel apertures 45 by the same method, and then the solvent is removed by volatilization. Thus, the light-emitting layer 70 is formed.

Here, it should be noted that the method for forming the buffer layer 60 and the light-emitting layer 70 is not limited to the above method. Other than spin coating and the inkjet method, ink may be ejected/applied by another commonly-known method such as the gravure printing method, the dispenser method, the nozzle coating method, the intaglio printing method, or the relief printing method.

Figure 4C:
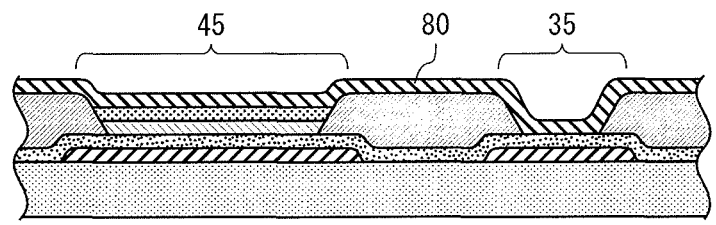

Subsequently, as illustrated in FIG. 4C, the electron injection layer 80 is formed to be continuous on the light-emitting layer 70 and on the hole injection layer 40 in the connection aperture 35 with, for example, the vacuum deposition method.

Figure 4D:
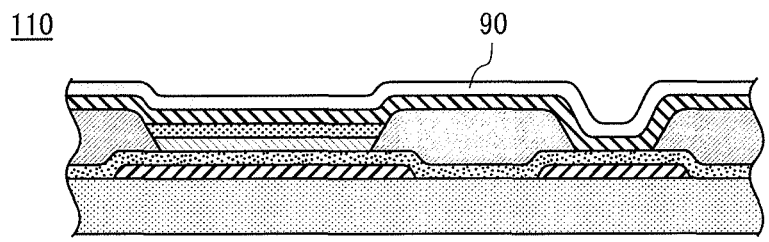

Furthermore, as illustrated in FIG. 4D, by the same method, the cathode 90 is formed on the electron injection layer 80.

Note that while not illustrated in FIGS. 1A and 1B, a sealing layer may be additionally provided on the surface of the cathode 90, or a sealing cap may be provided to isolate the entire organic EL element from external space, in order as to prevent the organic EL element from being exposed to the atmosphere after completion. The sealing layer may be formed, for instance, by using materials such as SiN (silicon nitride) and SiON (silicon oxynitride), and may be disposed such that the organic EL element is sealed therein. When using a sealing cap, the sealing cap may be formed by using, for instance, the same material as the substrate 10, and a getter which absorbs moisture and the like may be provided within the sealed space formed by the substrate 10 and the sealing cap.

Performance of the above steps completes the organic EL display panel 110.

The following now describes a method of manufacturing an organic EL display panel 110C according to a modification of the present embodiment, with reference to FIGS. 5A-7C. The structure of the organic EL display panel 110C according to the modification is substantially the same as that of the organic EL display panel 110 described above. Yet, the organic EL display panel 110C has a characteristic that a hole injection layer 40C is provided with a nanocrystal structure, which exhibits food carrier conduction characteristics.

<Method of Manufacturing Organic EL Display Panel 110C>

Figure 5A:
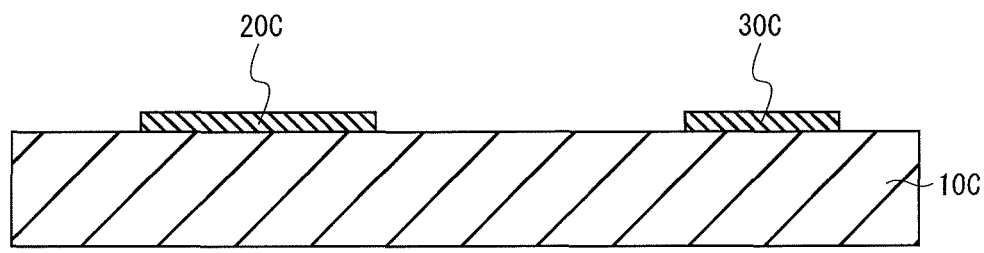
FIGS. 5A-5C are cross-section diagrams illustrating a method of manufacturing an organic EL display panel according to the aspect of the present invention.

First, a thin film of silver is formed by sputtering, for example, on the substrate 10C. The thin film is then patterned by, for example, photolithography to foim anodes 20C and auxiliary wiring 30C in a matrix (FIG. 5A). Note that the thin film may be formed by another method such as vacuum deposition.

Next, an ITO thin film is formed by sputtering, for example, and is patterned by photolithography, for example, to form an ITO layer 25C on each anode 20C and auxiliary wiring 30C.

In the organic EL display panel 110C, the ITO layers 25C and the anodes 20C are separate, but the ITO layers 25C may be considered part of the anodes 20C.

The ITO layer 25C is also provided between the auxiliary wiring 30C and the hole injection layer 40C. In the organic EL display panel 110C, the ITO layers 25C and the auxiliary wirings 30C are separate, but the ITO layers 25C may be considered part of the auxiliary wirings 30C.

Figure 5B:
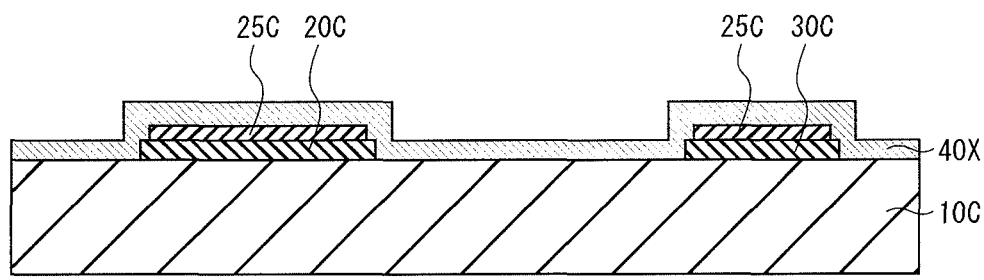

Subsequently, a thin film 40X containing tungsten oxide is then formed under the predetermined film forming conditions described below (FIG. 5B).

Figure 5C:
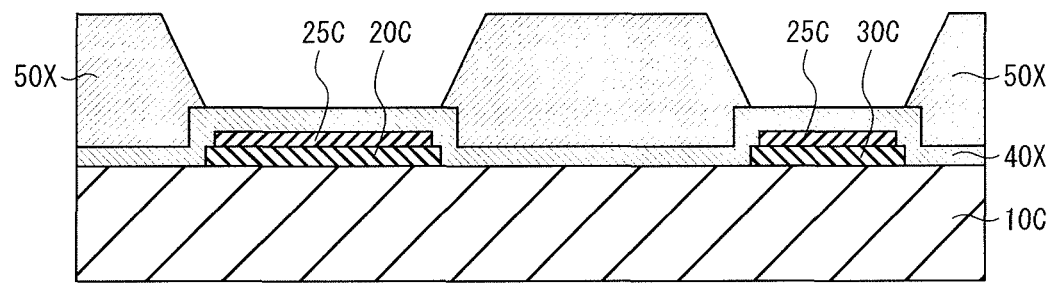

Subsequently, a bank material layer 50X is formed on the thin film 40X with bank material composed of organic material. A portion of the bank material layer 50X is removed to expose a portion of the thin film 40X (FIG. 5C). The bank material layer 50X is formed by application or by another method. The bank material layer 50X can be removed by patterning with a predetermined developer (a solution of tetramethylammonium hydroxide (TMAH) or the like).

Figure 6A:
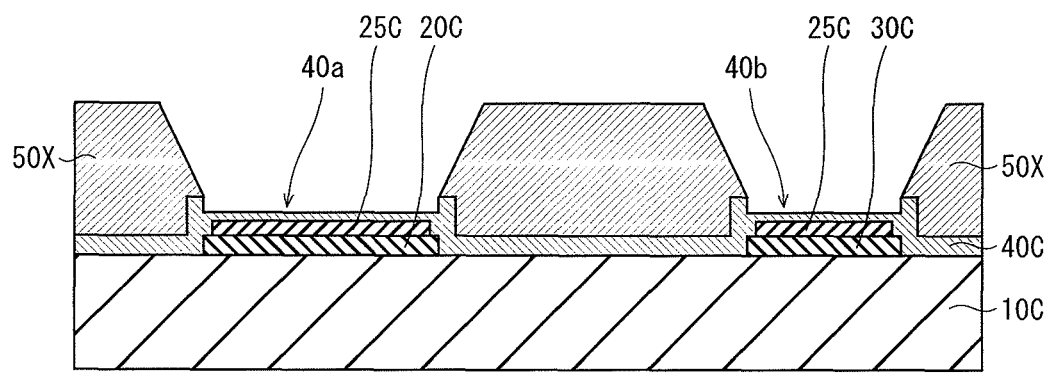
FIGS. 6A and 6B are cross-section diagrams illustrating the method of manufacturing an organic EL display panel according to the aspect of the present invention.

While the tungsten oxide forming the thin film 40X has good chemical resistance, it has the property of slightly dissolving in TMAH solution. Therefore, washing off the bank residue remaining on the surface of the thin film 40X with the above developer causes the exposed portion of the thin film 40X to erode, leading to formation of a concave structure (FIG. 6A). As a result, the hole injection layer 40C includes a concavity 40a corresponding to the anode 20C and a concavity 40b corresponding to the auxiliary wiring 30C.

Figure 6B:
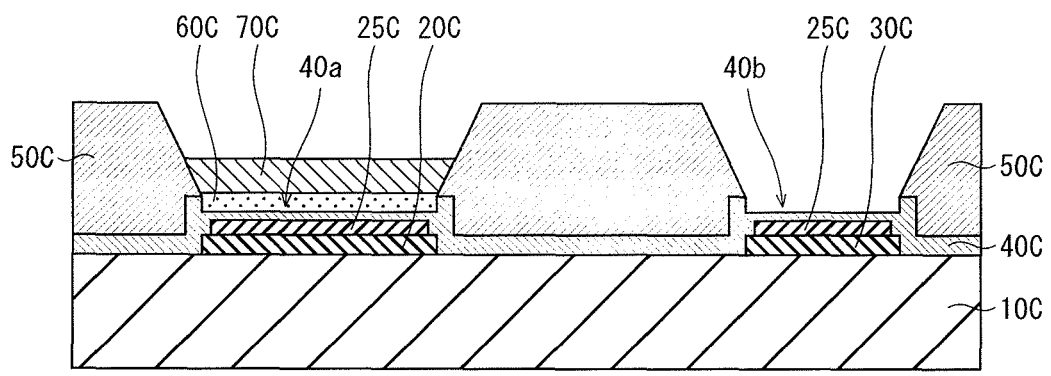

Next, repellency treatment is performed on the surface of the bank material layer 50X using fluorine plasma, for example, to form the banks 50C. Subsequently, an ink composition containing organic material is dripped, for example using the inkjet method, into a region corresponding to the anode 20C as defined by the banks 50C. The ink is then dried, thereby forming a buffer layer 60C and a light-emitting layer 70C (FIG. 6B). The buffer layer 60C and the light-emitting layer 70C are not formed in a region corresponding to the auxiliary wiring 30C as defined by the banks 50C. Note that ink may be dripped with a different method such as the dispenser method, the nozzle coating method, the spin coating method, intaglio printing, or relief printing.

Figure 7A:
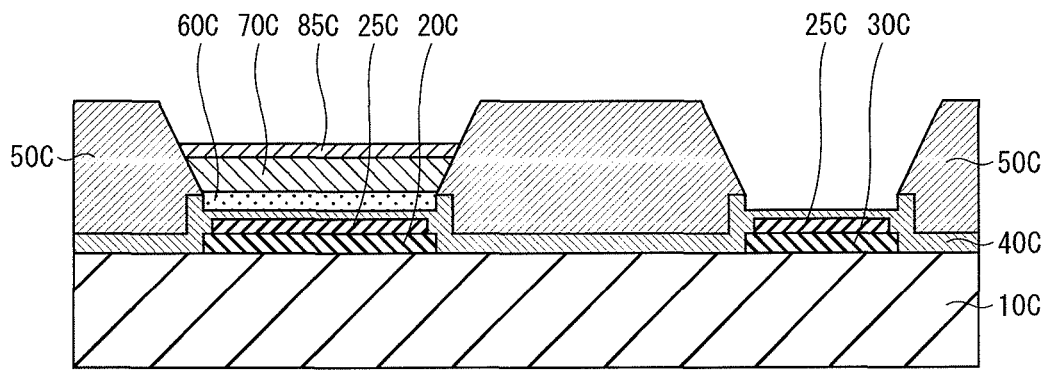
FIGS. 7A-7C are cross-section diagrams illustrating the method of manufacturing an organic EL display panel according to the aspect of the present invention.

Next, a thin film of barium constituting an electron injection layer 85C is formed on the light-emitting layer 70C with vacuum deposition, for example (FIG. 7A).

Figure 7B:
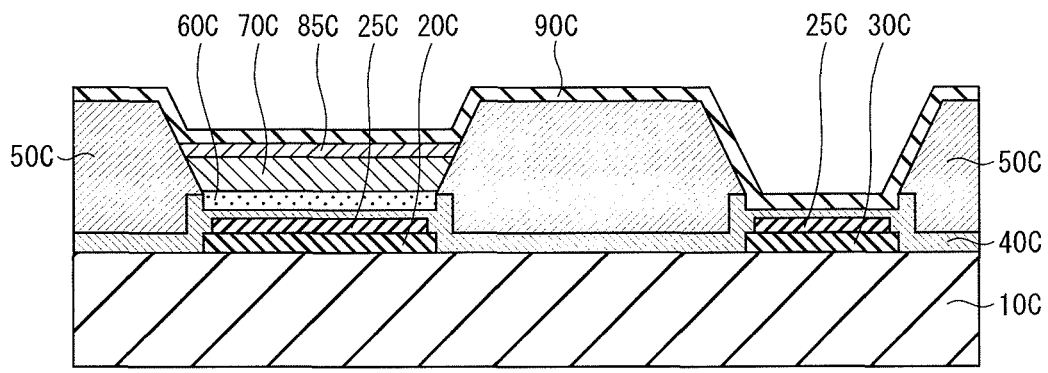

An ITO thin film constituting the cathode 90C is then formed across the entire surface by sputtering, for example (FIG. 7B).

Figure 7C:
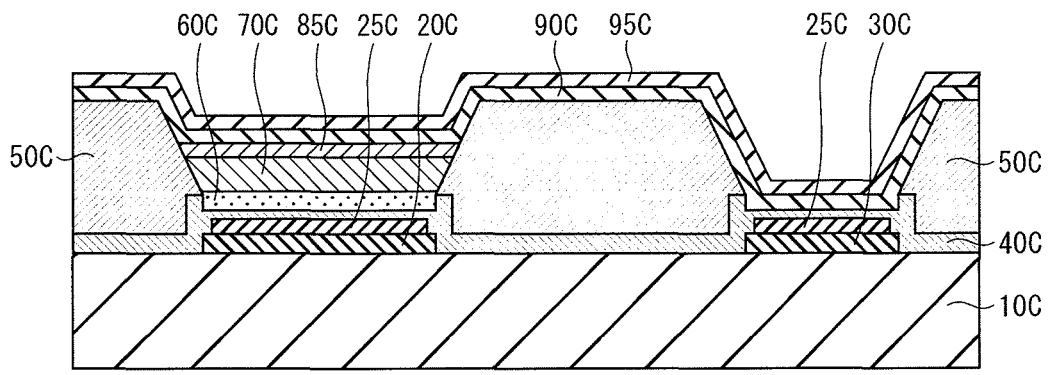

Next, on the cathode 90C, a sealing layer 95C is formed (FIG. 7C).

Performance of the above steps completes the organic EL display panel 110C.

The following describes the film forming conditions for the hole injection layer 40C (thin film 40X). It is preferable that the hole injection layer 40C (thin film 40X) be formed with the reactive sputtering method. Specifically, metal tungsten is placed in the chamber as the sputtering target, with argon gas as the sputtering gas and oxygen gas as the reactive gas. Under this condition, argon is ionized by the application of high voltage, and the ionized argon is caused to bombard the sputtering target. The metal tungsten ejected as a result of the sputtering phenomenon reacts with the oxygen gas to produce tungsten oxide, thus forming the tungsten oxide layer on the ITO layer 25C.

To give details of the film forming conditions, it is desirable to form the hole injection layer 40C under the conditions where: (1) the total pressure of the gas in the chamber is at least 2.3 Pa and at most 7.0 Pa; (2) the ratio of oxygen partial pressure to the total pressure of the gas is at least 50% and at most 70%; (3) the input power per unit surface area of the target (input power density) is at least 1.5 W/cm$^2$ and at most 6.0 W/cm$^2$; and (4) the value yielded by dividing the total pressure by the input power density should be larger than 0.7 Pa·cm$^2$/W. The hole injection layer 40C composed of tungsten oxide having a nanocrystal structure is formed under these film forming conditions.

(Another Example of Steps from Formation of Anodes and Auxiliary Wiring to Formation of Banks)

Next, with reference to FIGS. 8A-9C, another example of the process from the formation of anodes and auxiliary wiring to the formation of banks is described. Note that in this process, an example of a structure for forming a planarizing layer 17C on the surface of the substrate 10C is described.

Figure 8A:
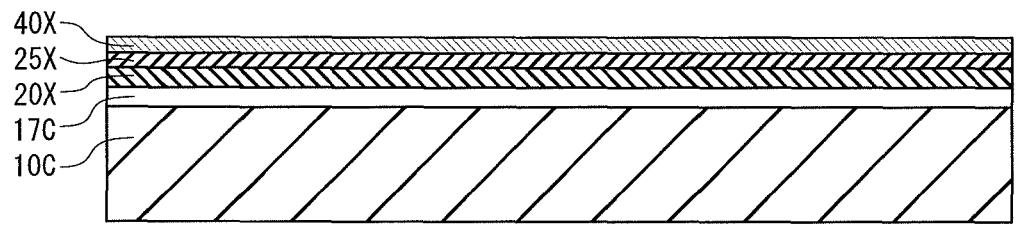
FIGS. 8A-8D are cross-section diagrams illustrating a method of manufacturing an organic EL display panel according to an aspect of the present invention.

First, a planarizing layer 17C is formed on the substrate 10C from an insulating resin material such as polyimide or acrylic. With the vapor deposition method, the following three layers are layered sequentially on the planarizing layer 17C: an Al alloy thin film 20X, an IZO thin film 25X, and a thin film (tungsten oxide film) 40X (FIG. 8A). ACL (aluminum-cobalt-lanthanum) material, for example, is used as the Al alloy material.

Figure 8B:
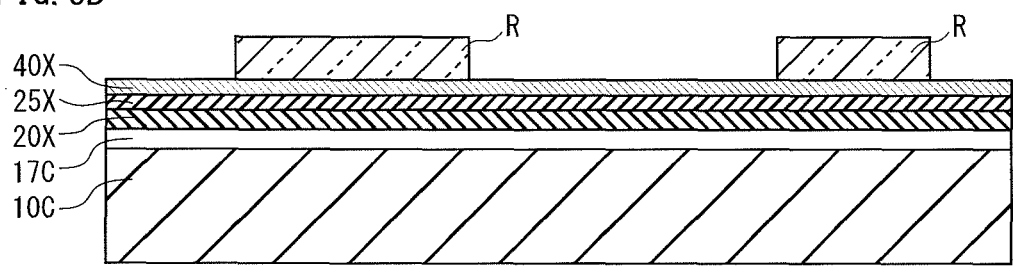

Next, a resist pattern R is formed by photolithography in the regions in which the three layers for the anode 20C, an IZO layer 25D, and a hole injection layer 40D are formed, as well as the regions in which the three layers for the auxiliary wiring 30C, the IZO layer 25D, and the hole injection layer 40D are formed (FIG. 8B).

Figure 8C:
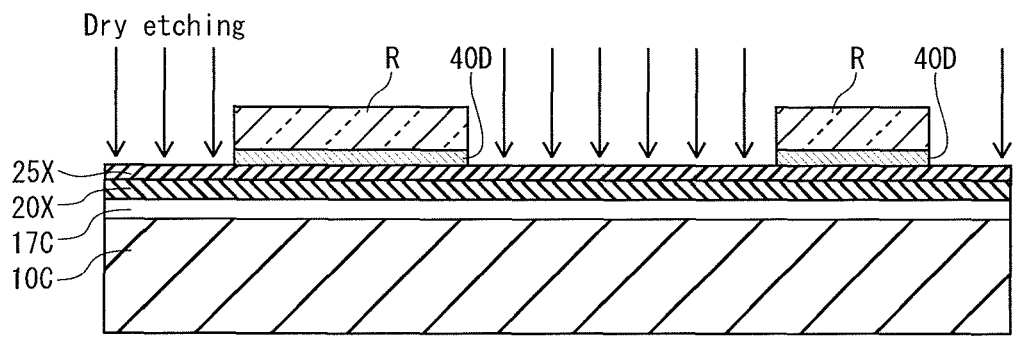

Next, patterning is performed by dry etching (D/E) of the regions of the thin film 40X not covered by the resist pattern R (FIG. 8C). During this dry etching, only the thin film 40X is selectively etched with either a mixture of fluorinated gas and $N_2$ gas, or a mixture of fluorinated gas and $O_2$ gas. The following is an example of specific setting conditions for the dry etching.

[Conditions for Dry Etching]
  Target of treatment: tungsten oxide film
  Etching gas: fluorine-containing gas ($SF_6$, $CF_4CHF_3$)
  Mixed gas: $O_2$, $N_2$
  Mixed gas ratio: $CF_4:O_2=160:40$
  Supplied power: Source 500 W, Bias 400 W
  Pressure: between 10 mTorr and 50 mTorr
  Etching temperature: room temperature Performing the above dry etching yields the hole injection layer 40D. Subsequently, ashing is performed with 0, gas to facilitate removal of the resist pattern during the following wet etching (W/E) process.

Figure 8D:
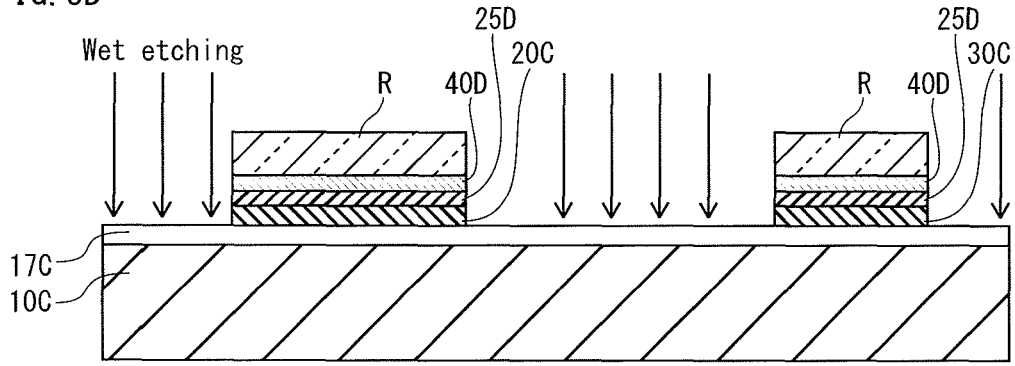

Via wet etching, the regions of the IZO thin film 25X and the Al alloy thin film 20X not covered by the resist pattern R are patterned (FIG. 8D). Using a mixed solution of nitric acid, phosphoric acid, acetic acid, and water as the etchant, wet etching is performed simultaneously on both the IZO thin film 25X and the Al alloy thin film 20X.

The following is an example of specific setting conditions for the wet etching.

[Conditions for Wet Etching]
  Target of treatment: IZO thin film and Al alloy thin film
  Etchant: mixed aqueous solution of nitric acid, phosphoric acid, and acetic acid
  Blend ratio of solvent: not specified (mixing is possible under typical conditions)
  Etching temperature: lower than room temperature Note that to perform the wet etching well, it is desirable that the IZO thin film 25X, which is the uppermost layer, be a thickness of 20 nm or less. This is because the amount of side etching grows large if the thickness exceeds 20 nm.

Instead of forming an IZO layer from an IZO thin film, an ITO layer may of course be formed from an ITO thin film.

Figure 9A:
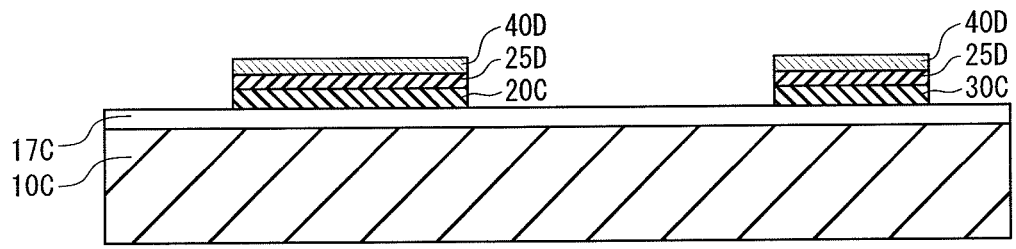
FIGS. 9A-9C are cross-section diagrams illustrating the method of manufacturing an organic EL display panel according to the aspect of the present invention.

The anode 20C and the IZO layer 25D, as well as the auxiliary wiring 30C and the IZO layer 25D, are formed through the above processes. Subsequently, the resist pattern R is removed through a resist removing step, yielding a patterned triple layer structure composed of the anode 20C, the IZO layer 25D, and the hole injection layer 40D and a pattern triple layer structure composed of the auxiliary wiring 30C, the IZO layer 25D, and the hole injection layer 40D (FIG. 9A). During this process, the hole injection layer 40D is formed in locations corresponding to the anode 20C and the IZO layer 25D as well as locations corresponding to the auxiliary wiring 30C and the IZO layer 25D.

Figure 9B:
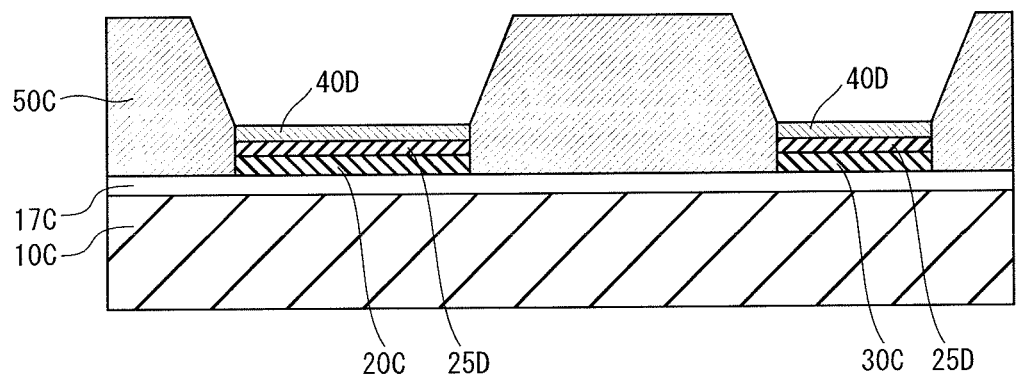

Next, the bank material layer 50X (not shown in the figures) is formed on the exposed surface of the planarizing layer 17C and is patterned to form the banks 50C (FIG. 9B).

Figure 9C:
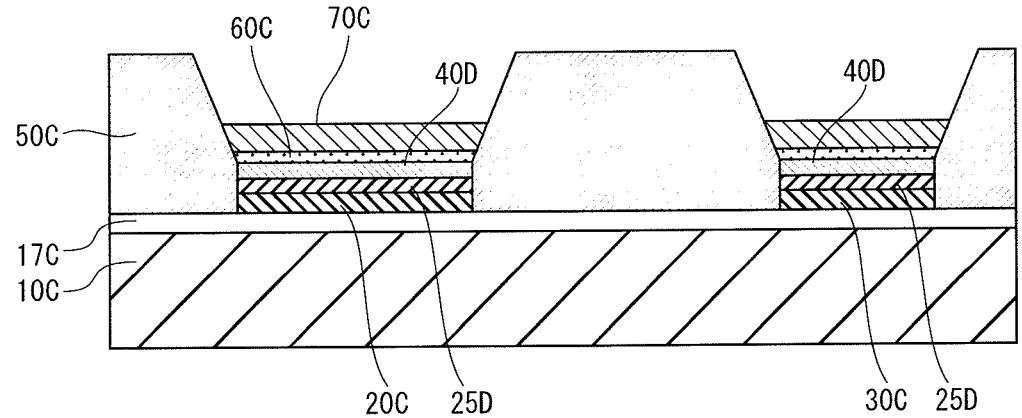

Note that with the above-described method, the buffer layers 60C and the light-emitting layers 70C can be formed by adjusting the predetermined ink, dripping the ink successively into regions partitioned by the banks 50C, and drying the ink (FIG. 9C).

<Experiments and Observations>
(Conditions for Forming Tungsten Oxide Layer)

In the embodiment of the present invention, the hole injection layer is yielded by forming a layer of tungsten oxide under predetermined conditions. The forming of the tungsten oxide layer under such film forming conditions provides the hole injection layer with the occupied energy level near the Fermi surface, which results in the hole injection barrier between the injection layer and the buffer layer being reduced. Furthermore, the organic EL display panel 110 having such a hole injection layer formed can be driven at a low voltage.

A method for obtaining a tungsten oxide layer having the above-described characteristics employs a DC magnetron sputtering device, with metal tungsten as the sputtering target. The film is formed without controlling substrate temperature, and by introducing argon gas and oxygen gas into the chamber of the sputtering device. It is considered desirable to form the tungsten oxide layer with the reactive sputtering method under the following conditions: (1) the total gas pressure of the gas is higher than 2.7 Pa and at most 7.0 Pa; (2) the ratio of oxygen partial pressure to the total pressure of the gas is at least 50% and at most 70%; and (3) the input power per unit surface area of the target (input power density) is at least 1 W/cm$^2$ and at most 2.8 W/cm$^2$.

The effectiveness of such film forming conditions have been proved through the following experiments.

Figure 10:
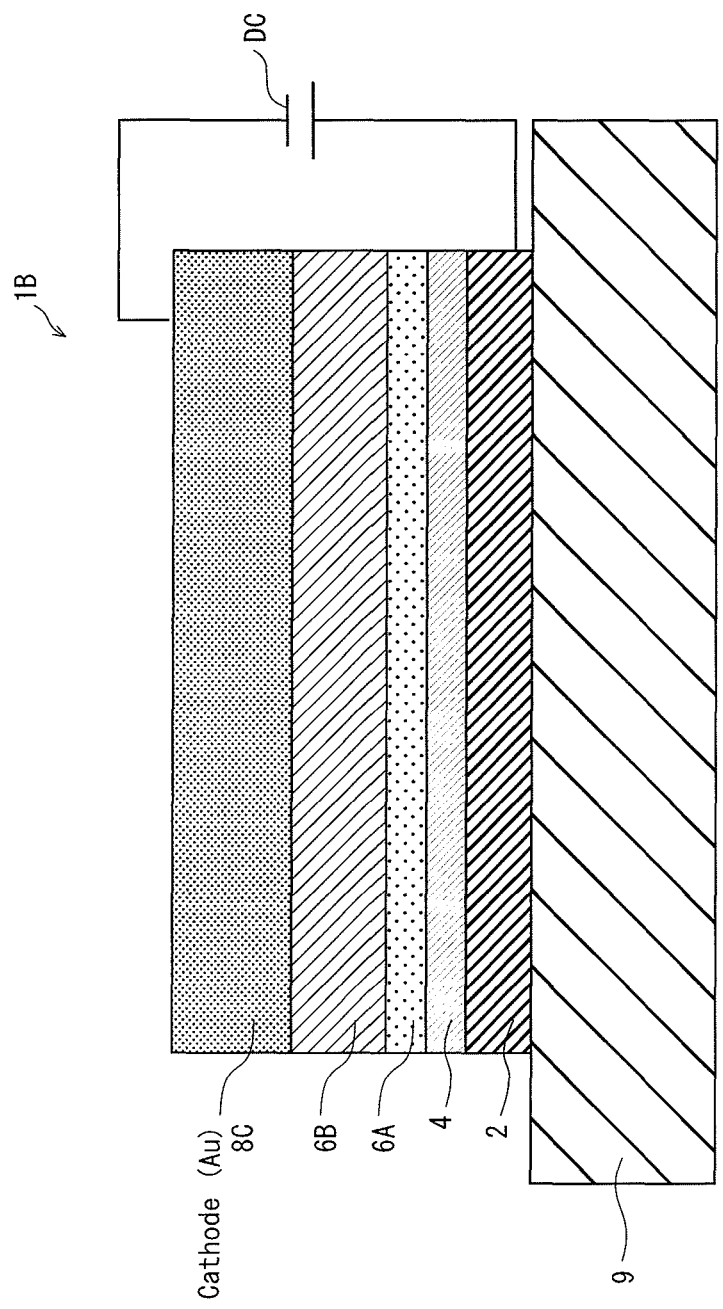
FIG. 10 is a schematic cross-section diagram illustrating a structure of a hole-only device.

First, hole-only devices shown in FIG. 10 were prepared as assessment devices to be used in accurately assessing the dependence of the efficiency of hole injection, from the hole injection layer to the buffer layer, on the film forming conditions.

In an organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the electrical current consists almost entirely of hole current, and the carriers can be considered almost entirely to be holes. A hole-only device is therefore desirable when assessing hole injection efficiency.

Specifically, a hole-only device 1B has the structure illustrated in FIG. 10 and was created as follows. An anode 2 composed of a thin ITO film was formed by sputtering on a substrate 9 to a thickness of 50 nm. A hole injection layer 4 composed of tungsten oxide was formed under the conditions listed below on the anode 2 to a thickness of 30 nm. A buffer layer 6A and a light-emitting layer 6B were then formed by spin coating. The buffer layer 6A was composed of TFB, which is an organic amine-containing polymer, and was formed on the hole injection layer 4 to a thickness of 20 nm. The light-emitting layer 6B was composed of F8BT, which is an organic polymer, and was formed to a thickness of 70 nm. A cathode 8C composed of Au (gold) was then formed by vapor deposition to a thickness of 100 nm. Note that since the hole-only devices 1B are only assessment devices for examining the efficiency of hole injection from the hole injection layer to the buffer layer in the light-emitting unit of an organic EL display panel, other components such as the banks and the wiring portion were omitted.

In the manufacturing of the hole-only devices 1B, the hole injection layers of the hole-only devices were formed by applying the reactive sputtering method with a DC magnetron sputtering device. The gas introduced into the chamber was composed of at least one of argon gas and oxygen gas, and the sputtering target used was metal tungsten. Further, no control was performed regarding substrate temperature, while control of argon partial pressure, oxygen partial pressure, and total gas pressure within the chamber was performed by adjusting the flow amount of the respective gases. Further, in order as to obtain the hole-only devices, changes were made to certain film forming conditions, namely total gas pressure, oxygen partial pressure, and input power, as illustrated in Table 1. As a result, hole-only devices 1B (devices No. 1 through 14), each having a hole injection layer formed under different film forming conditions, were obtained. Note that, hereinafter, oxygen partial pressure is indicated as a ratio (%) with respect to the total pressure of the gases in the chamber of the sputtering device.

TABLE 1

Film Forming Conditions of the Hole-only Devices 1B

| | Device No. | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| Oxygen Partial Pressure (%) | 70 | 50 | 100 | 50 | 70 | 100 | 70 | 50 | 100 | 50 | 70 | 30 | 30 | 50 |
| Total Pressure (Pa) | 2.7 | 4.8 | 1.7 | 1.7 | 2.7 | 1.7 | 2.7 | 4.8 | 1.7 | 2.7 | 1.7 | 1.7 | 2.7 | 4.8 |
| Input Power (W) | 500 | 500 | 500 | 500 | 250 | 250 | 1000 | 1000 | 1000 | 500 | 500 | 500 | 500 | 250 |
| T-S (mm) | 113 | 113 | 113 | 113 | 113 | 113 | 113 | 113 | 113 | 113 | 113 | 113 | 113 | 113 |
| Film Forming Rate (nm/s) | 0.164 | 0.14 | 0.111 | 0.181 | 0.057 | | 0.308 | 0.311 | 0.246 | 0.154 | 0.153 | 0.364 | 0.177 | 0.049 |
| Film Thickness (nm) | 30 | 30 | 30 | 30 | 30 | 30 | 30 | 30 | 30 | 30 | 30 | 30 | 30 | 30 |

Table 2 illustrates a relation between input power and input power density of the above-presented DC magnetron sputtering device.

TABLE 2

| Input Power (W) | Input Power Density (W/cm$^2$) |
|---|---|
| 250 | 1.4 |
| 500 | 2.8 |
| 1000 | 5.6 |

The completed hole-only devices 1B were then connected to a direct current power supply DC, and voltage was applied thereto. Furthermore, by changing the applied voltage, an electric current value per unit surface area (current density) was calculated for different voltages. Note that hereinafter, the expression "driving voltage" refers to different voltages applied when the current density value is 10 mA/cm$^2$.

In short, it could be said that the smaller the driving voltage, the higher the hole injection efficiency from the hole injection layer to the buffer layer is. This is since, the members composing the hole-only devices 1B, other than the hole injection layer, are prepared according to the same manufacturing method, and thus, it could be assumed that the hole injection barrier between two adjacent layers, other than the hole injection layer, is uniform in each of the hole-only devices 1B. Furthermore, as described below, it was confirmed through another experiment that the anode 2 and the hole injection layer used in this experiment are in Schottky ohmic contact. Accordingly, the differences in driving voltage depending on the conditions for forming the hole injection layer strongly reflect the hole injection efficiency from the hole injection layer to the buffer layer and the hole conduction efficiency of the hole injection layer itself.

It can be assumed that in addition to the hole injection efficiency from the hole injection layer to the buffer layer, the hole conduction efficiency of the hole injection layer also influences the characteristics of the devices in the experiments described in the embodiment. The below assessment of energy diagrams, however, also clearly indicates that the hole injection barrier between the hole injection layer and the buffer layer is strongly reflected in the characteristics of the devices.

Table 3 illustrates the driving voltages obtained through experiments for each hole-only device 1B under various film forming conditions of total pressure, oxygen partial pressure, and input power. Note that the numbers enclosed in circles in Table 3 indicate the device number of each of the hole-only devices 1B.

Further, FIGS. 12A-12C are graphs illustrating the dependence of driving voltages of the hole-only devices 1B on the film forming conditions. Each of the points in FIG. 12A indicate, from left to right in the figure, a driving voltage of the devices No. 4, 10, and 2. Similarly, each of the points in FIG. 12B indicates, from left to right in the figure, a driving voltage of the devices No. 13, 10, and 1. Finally, each of the points in FIG. 12C indicates, from left to right in the figure, a driving voltage of the devices No. 14, 2, and 8.

Here, it should be noted that in the following cases, film formation was not successfully performed due to limitations of the sputtering device, such as gas flow amount: total pressure of 2.7 Pa and oxygen partial pressure of 100%, total pressure of 4.8 Pa and oxygen partial pressure of 30%, total pressure of 4.8 Pa and oxygen partial pressure of 70%, and total pressure of 4.8 Pa and oxygen partial pressure ratio of 100%.

Firstly, concerning the dependence of driving voltage on total pressure, when the oxygen partial pressure ratio was set to 50% and the input power was set to 500 W, a clear reduction in driving voltage was observed when the total pressure was set higher than 2.7 Pa and lower than or equal to 4.8 Pa, as illustrated in FIG. 12A. In addition, as a result of a different experiment, it was found that this trend of reduction in driving voltage continues at least until the total pressure is lower than or equal to 7.0 Pa. Taking this into account, it is preferable that total pressure during the forming of the hole injection layer be set higher than 2.7 Pa and lower than or equal to 7.0 Pa.

Next, concerning the dependence of driving voltage on oxygen partial pressure ratio, when the total pressure was set to 2.7 Pa and the input power was set to 500 W, it was observed that driving voltage decreases as oxygen partial pressure ratio increases, at least when the oxygen partial pressure ratio was set higher than or equal to 50% and lower than or equal to 70%, as illustrated in FIG. 12B. However, as a result of a different experiment, it was found that when the oxygen partial pressure ratio exceeds this range, the driving voltage begins to increase adversely. Taking this into account, it is preferable that oxygen partial pressure ratio during the forming of the hole injection layer be set higher than or equal to 50%, while setting an upper limit at approximately 70%.

Finally, concerning the dependence of driving voltage on input power, when total pressure was set to 4.8 Pa and oxygen partial pressure ratio was set to 50%, a rapid increase in driving voltage was observed when the input power exceeded 500 W, as illustrated in FIG. 12C. Taking this into account, it is preferable that input power be restricted to be lower than or

TABLE 3

Film Forming Conditions and Driving Voltages of the Hole-only Devices 1B
(Applied Voltage Value under Electric Current Density of 10 mA/cm$^2$)

| | | Total Pressure | | |
|---|---|---|---|---|
| | | 1.7 Pa | 2.7 Pa | 4.8 Pa |
| Oxygen Partial Pressure | 30% | ⑫ 500 W (Unmeasured) | ⑬ 500 W (19 V) | Film could not be formed |
| | 50% | ④ 500 W (19 V) | ⑩ 500 W (19 V) | ⑭ 250 W (13.7 V) ② 500 W (13.7 V) ⑧ 1000 W (>20 V) |
| | 70% | ⑪ 500 W (Unmeasured) | ⑤ 250 W (14.7 V) ① 500 W (18.2 V) ⑦ 1000 W (>20 V) | Film could not be formed |
| | 100% | ⑥ 250 W (Unmeasured) ③ 500 W (>20 V) ⑨ 1000 W (>20 V) | Film could not be formed | Film could not be formed |

*Numbers enclosed in circles indicate device No., numbers without parenthesis indicate input electricity, and numbers placed in parenthesis indicate driving voltage.

equal to 500 W. Here, it should be noted that, when referring to devices No. 1 and 3 in Table 3, it could be seen that, even when the input power was set to 500 W, driving voltage increased when the total pressure was set lower than or equal to 2.7 Pa.

The subsequent FIG. 13 illustrates an electric current density-applied voltage curve of the hole-only devices 1B, taking devices No. 14, 1, and 7 as examples. In FIG. 13, the vertical axis indicates electric current density (mA/cm$^2$), whereas the horizontal axis indicates applied voltage (V). Furthermore, device No. 14 fulfills all desirable film forming conditions explained in the above of total pressure, oxygen partial pressure, and input power, while on the other hand, each of devices No. 1 and 7 do not fulfill at least one of the desirable film forming conditions.

Concerning the film forming conditions under which the hole injection layer (and the later-described tungsten oxide layer 12) is formed, in order as to facilitate the explanations to be provided in the following, hereinafter, the film forming conditions under which the hole injection layer was formed in device 14 is referred to as film forming conditions A, the film forming conditions under which the hole injection layer was formed in device 1 is referred to as film forming conditions B, and the film forming conditions under which the hole injection layer was formed in device 7 is referred to as film forming conditions C. In addition, devices No. 14, 1, and 7 are respectively illustrated as HOD-A, HOD-B, and HOD-C in FIG. 13.

As illustrated in FIG. 13, the electric current density-applied voltage curve indicating HOD-A indicates that HOD-A has a higher degree of responsiveness to an increase in applied voltage compared with HOD-B and HOD-C. Further, it could be seen that HOD-A requires for the lowest level of applied voltage to reach a high electric current density compared with HOD-B and HOD-C. As a result, as compared to HOD-B and HOD-C, the hole injection efficiency from the hole injection layer to the buffer layer can be inferred to be superior in HOD-A. Here, it should be noted that HOD-A operates at the lowest driving voltage among the hole-only devices 1B.

Thus far, observation has been made of the hole injection efficiency from the hole injection layer to the buffer layer in the hole-only devices 1B. In an organic EL element within the light-emitting cell in an organic EL display panel according to the present invention, the dependence on film forming conditions of the hole injection efficiency from the hole injection layer to the buffer layer is essentially the same as the hole-only devices 1B. In order as to confirm the existence of such a similar dependence on the film forming conditions under which the hole injection layer is formed, the inventors prepared three separate organic EL elements 1 shown in FIG. 11, each having a hole injection layer formed under a corresponding one of film forming conditions A, film forming conditions B, and film forming conditions C.

Figure 11:
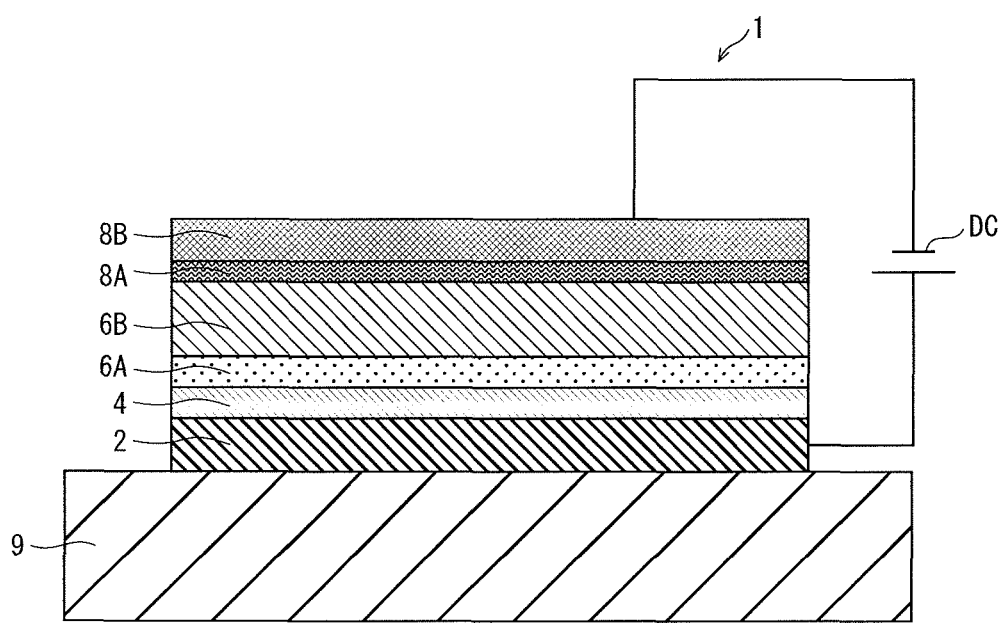
FIG. 11 is a schematic cross-section diagram illustrating a structure of an organic EL element as an assessment device.

As illustrated in FIG. 11, apart from the cathode, the organic EL elements 1 thus prepared have an identical structure to the hole-only devices 1B. Specifically, an anode 2 composed of a thin ITO film was formed by sputtering on a substrate 9 to a thickness of 50 nm. A hole injection layer 4 composed of tungsten oxide was formed under conditions A, B, and C on the anode 2 to a thickness of 30 nm. A buffer layer 6A and a light-emitting layer 6B were then formed by spin coating. The buffer layer 6A was composed of TFB, which is an organic amine-containing polymer, and was formed on the hole injection layer 4 to a thickness of 20 nm. The light-emitting layer 6B was composed of F8BT, which is an organic polymer, and was formed to a thickness of 70 nm. An electron injection layer 8A composed of Ba was then formed to a thickness of 5 nm, and a cathode 8B composed of Al was then formed by vapor deposition to a thickness of 100 nm. Note that since the organic EL elements 1 are only assessment devices for examining the efficiency of hole injection from the hole injection layer to the buffer layer in the light-emitting unit of an organic EL display panel, other components such as the banks and the wiring portion were omitted.

Figure 14:
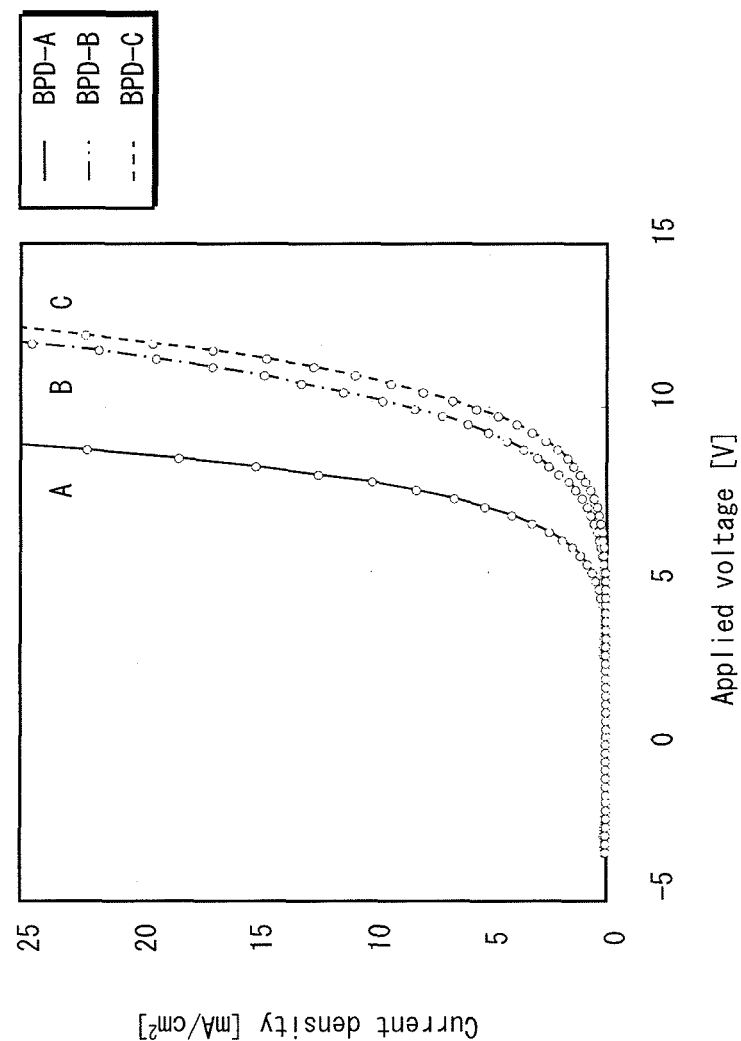
FIG. 14 is a device characteristics diagram showing relation curves illustrating relations between applied voltage and current density of organic EL elements.

The organic EL elements 1 prepared under film forming conditions A, C, and C were then connected to a direct current power supply DC, and voltage was applied thereto. FIG. 14 is a diagram illustrating the current density-applied voltage curve at this point. In FIG. 14, the vertical axis indicates electric current density (mA/cm$^2$), whereas the horizontal axis indicates applied voltage (V).

Note that, in order as to facilitate the explanations to be made in the following, the organic El elements 1 prepared under film forming conditions A, B, and C are respectively illustrated as BPD-A, BPD-B, and BPD-C in FIG. 14.

As illustrated in FIG. 14, the electric current density-applied voltage curve indicating BPD-A indicates that HOD-A has a higher degree of responsiveness to an increase in applied voltage compared with BPD-B and BPD-C. Further, it could be seen that BPD-A requires for the lowest level of applied voltage to reach a high electric current density compared with BPD-B and BPD-C. This trend is similar to the trend which could be seen in the hole-only devices HOD-A, HOD-B, and HOD-C, which were prepared under the same respective film forming conditions as BPD-A, BPD-B, and BPD-C.

Figure 15:
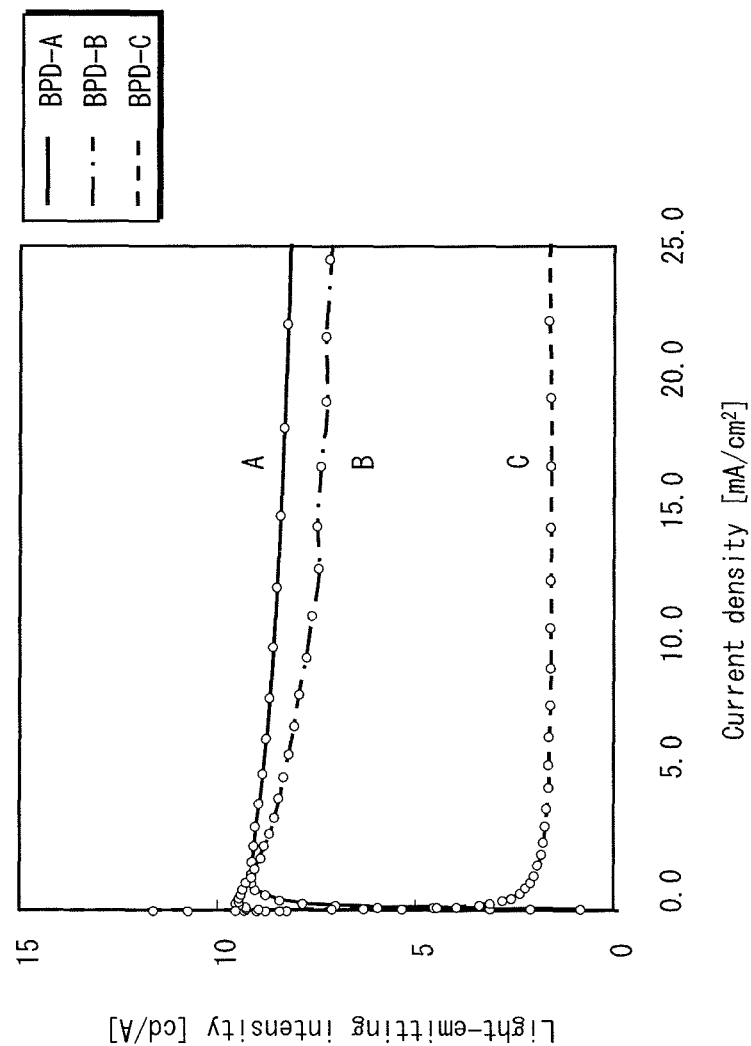
FIG. 15 is a device characteristics diagram relation curves illustrating relations between current density and light-emitting intensity of organic EL elements.

In addition, FIG. 15 illustrates light-emitting intensity-electric current density curves corresponding to the organic EL elements 1 prepared in the above. Each light-emitting intensity-electric current density curve indicates the relation between the change in electric current density and the resultant change in light-emitting intensity of the corresponding organic EL element 1. In FIG. 15, the vertical axis indicates light-emitting intensity (cd/A), whereas the horizontal axis indicates electric current density (mA/cm$^2$). FIG. 15 shows that the light-emitting intensity was strongest for BPD-a, at least over the range in which the current density was measured.

From the above results, it can be inferred that in the organic EL elements 1, the hole injection efficiency from the hole injection layer to the buffer layer depends on the film forming conditions in the same way as was the case with the hole-only devices 1B. Namely, in the organic EL elements 1 of the present experiment, the tungsten oxide constituting the hole injection layer was formed using metal tungsten as the sputtering target in a DC magnetron sputtering device, applying the reactive sputtering method without controlling the substrate temperature. The chamber gas was composed of argon gas and oxygen gas, with a total pressure higher than 2.7 Pa and lower than or equal to 7.0 Pa, an oxygen partial pressure ratio of at least 50% and at most 70%, and input power density at least 1 W/cm$^2$ and at most 2.8 W/cm$^2$. Under these conditions, it can be inferred that the hole injection efficiency from the hole injection layer to the buffer layer was good, thereby achieving a superb low driving voltage and high light-emitting efficiency.

Note that among the above conditions, the condition concerning input power is represented in terms of input power density based on Table 2. When using a DC magnetron sputtering device that is different from the DC magnetron sputtering device used in the present experiment, a hole injection layer that achieves an organic EL element 1 with a superb low driving voltage and high light-emitting efficiency, as in the present experiment, can be yielded by adjusting the input power according to the size of the sputtering target so that the input power density fulfills the above condition. Conditions on total pressure and oxygen partial pressure, on the other hand, are independent of the device and the sputtering target.

Additionally, as already explained in the above, no intentional adjustment of the substrate temperature was performed while forming the hole injection layer by applying the reactive sputtering method. And during the experiment, the sputtering device was placed under room temperature. Therefore, the substrate was at room temperature at least before the forming of the hole injection layer was performed. However, while forming of the hole injection layer is being performed, there is a possibility that the substrate temperature may rise by several tens of degrees Celsius.

The organic EL display panel 110 according to the present embodiment is provided with the holes injection layer formed under the film forming conditions A and therefore having the occupied energy level near the Fermi surface. Detailed observation is to be made regarding this point in the following.

(Electronic State of the Hole Injection Layer)

The tungsten oxide composing the hole injection layer of the organic EL display panel 110 pertaining to the embodiment of the present invention has the occupied energy level near the Fermi surface. The occupied energy level near the Fermi surface is formed by adjusting the film forming conditions under which the hole injection layer is formed as description has been provided in the above. Details concerning this point are provided in the following.

The inventors conducted an experiment to determine whether the occupied energy level near the Fermi surface exists in each of the tungsten oxide layers formed under a corresponding one of film forming conditions A, B, and C.

Figure 16:
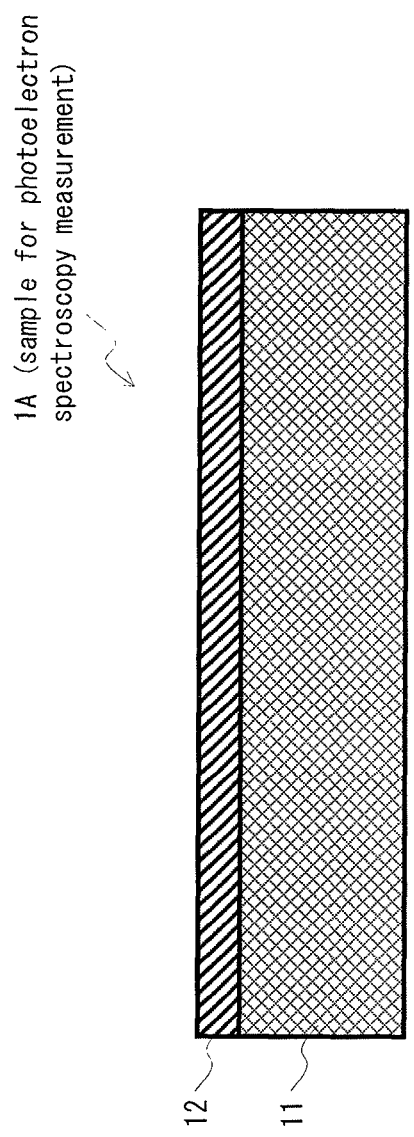
FIG. 16 is a schematic cross-section diagram illustrating a structure of a sample device which is used for photoelectron spectroscopy measurement.

The inventors prepared sample devices to be subjected to photoelectron spectroscopy measurement. Each of the sample devices was prepared under a corresponding one of the film forming conditions A, B, and C. In detail, each of the sample devices were prepared by forming a 10 nm-thick tungsten oxide layer (corresponding to the hole injection layer) on a conductive silicon substrate 11 by applying the reactive sputtering method as described in the above. Note that 1A in FIG. 16 indicates a sample device having such a structure. So as to facilitate explanation provided in the following, a sample device 1A formed under film forming conditions A is hereinafter referred to as sample device A, a sample device 1A formed under film forming conditions B is hereinafter referred to as sample device B, and a sample device 1A formed under film forming conditions C is hereinafter referred to as sample device C.

The forming of the tungsten oxide layer 12 of each of the sample devices was performed inside a sputtering device. Then, to prevent atmospheric exposure, the sample devices A, B, and C were transported to a glovebox which was connected to the sputtering device and which was filled with nitrogen gas. Subsequently, the sample devices were sealed inside transfer vessels in the glovebox, and were mounted on a photoelectron spectroscopy device. Thus, ultraviolet photoelectron spectroscopy (UPS) measurement of the sample devices was performed while preventing the tungsten oxide layer 12 having been formed on the sample devices from undergoing atmospheric exposure.

In general, a UPS spectrum obtained as a result of the UPS measurement reflects a state of occupied energy levels, such as a valence band and the like, within several nanometers in distance from the surface of the target of measurement. As such, the present experiment was conducted in order as to observe the state of occupied energy levels at a surface portion of the tungsten oxide layer 12 by utilizing UPS measurement.

The conditions under which the UPS measurement was conducted are as follows. Here, it should be noted that, since the sample devices A, B, and C commonly include the conductive silicon substrate 11, charge-up did not occur during the UPS measurement.

Figure 17:
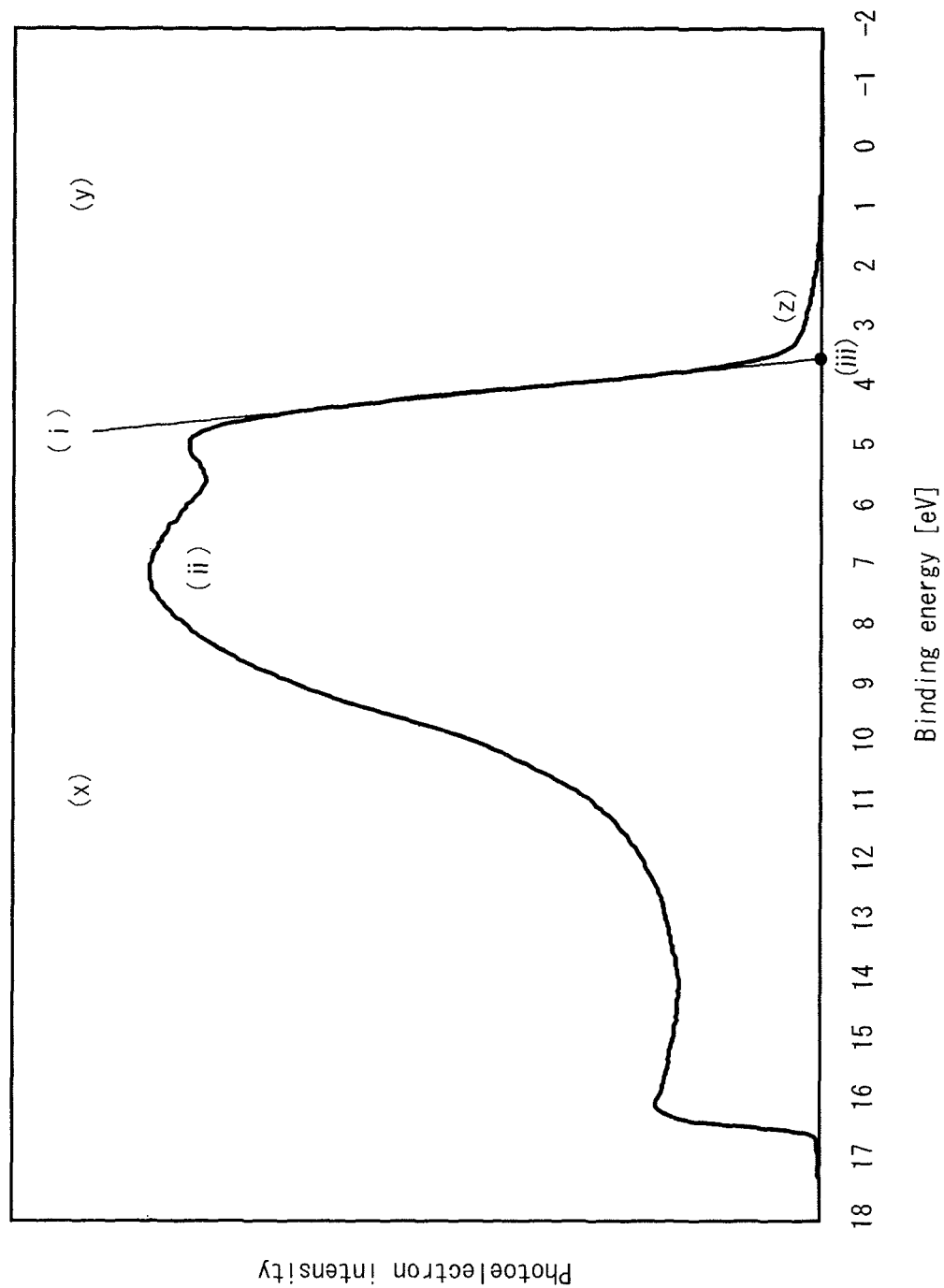
FIG. 17 illustrates a UPS spectrum of a tungsten oxide layer.

Light source: He I line
Bias: None
Electron emission angle: Normal line direction of the substrate surface
Interval between measurement points: 0.05 eV FIG. 17 illustrates a UPS spectrum of the tungsten oxide layer 12 of the sample device A. The origin of the horizontal axis, which represents binding energy, corresponds to the Fermi level of the conductive silicon substrate 11, and the left direction with respect to the origin is positive.

In the following, description is provided on each of the occupied energy levels of the tungsten oxide layer 12 with reference to FIG. 17.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction from point (iii), and area y that extends in the low binding energy direction from point (iii).

Here, according to Table 4, each of the sample devices A, B, and C has a tungsten oxide layer 12 whose composition ratio between tungsten atoms and oxygen atoms is approximately 1:3. The composition ratios illustrated in Table 4 were obtained by performing X-ray photoelectron spectroscopy (XPS) measurement. More specifically, XPS measurement of the sample devices was performed by using the photoelectron spectroscopy device while preventing atmospheric exposure of the tungsten oxide layer 12 having been formed on the sample devices, in a similar way as in the conduction of the UPS measurement. By conducting the XPS measurement, the composition ratio of tungsten to oxygen within several nanometers in distance from the surface of the tungsten oxide layer 12 was estimated for each of the sample devices A, B, and C. Note that the film forming conditions under which the tungsten oxide layer 12 in each of the corresponding sample devices was formed are also illustrated in Table 4.

TABLE 4

| | Sample Device | | |
|---|---|---|---|
| | Sample Device A | Sample Device B | Sample Device C |
| | Film Forming Conditions | | |
| | Film Forming Conditions A | Film Forming Conditions B | Film Forming Conditions C |
| Total Pressure (Pa) | 4.8 | 2.7 | 2.7 |
| Oxygen Partial Pressure (%) | 50 | 70 | 70 |
| Input Power (W) | 250 | 500 | 1000 |
| Composition Ratio (Oxygen/Tungsten) | 3.0 | 2.9 | 2.8 |

Based on the composition ratios, it can be assumed that in each of the sample devices A, B, and C, the tungsten oxide layer 12, at least within several nanometers in distance from the surface thereof, has an atomic arrangement basically in accordance with tungsten trioxide. That is, in the basic structure of the tungsten oxide layer 12, six oxygen atoms bond with one tungsten atom in octahedral coordination such that octahedrons share oxygen atoms at corners thereof with adjacent octahedrons. Accordingly, the area x in FIG. 17 has either the structure of tungsten trioxide or an amorphous structure in which the crystalline order is disturbed (yet in which bonds are not broken, thus preserving the above basic structure). The area x thus corresponds to a valence band with an occupied energy level deriving from the above basic structure. Note that the inventors of the present invention have performed X-ray absorption fine structure (XAFS) measurement with respect to the tungsten oxide layer 12 of each of the sample devices A, B, and C, and have confirmed that the above-mentioned basic structure is formed therein.

Accordingly, the area y illustrated in FIG. 17 corresponds to a band gap between the valence band and the conduction band. It is commonly known, however, that an occupied energy level that differs from the occupied energy level of the valence band may exist in this area of the tungsten oxide, as is suggested by the UPS spectrum in FIG. 17. The occupied energy level in area y derives from another structure that is different from the above-mentioned basic structure, and is referred to as a so-called band gap (in-gap state or gap state) energy level.

Figure 18:
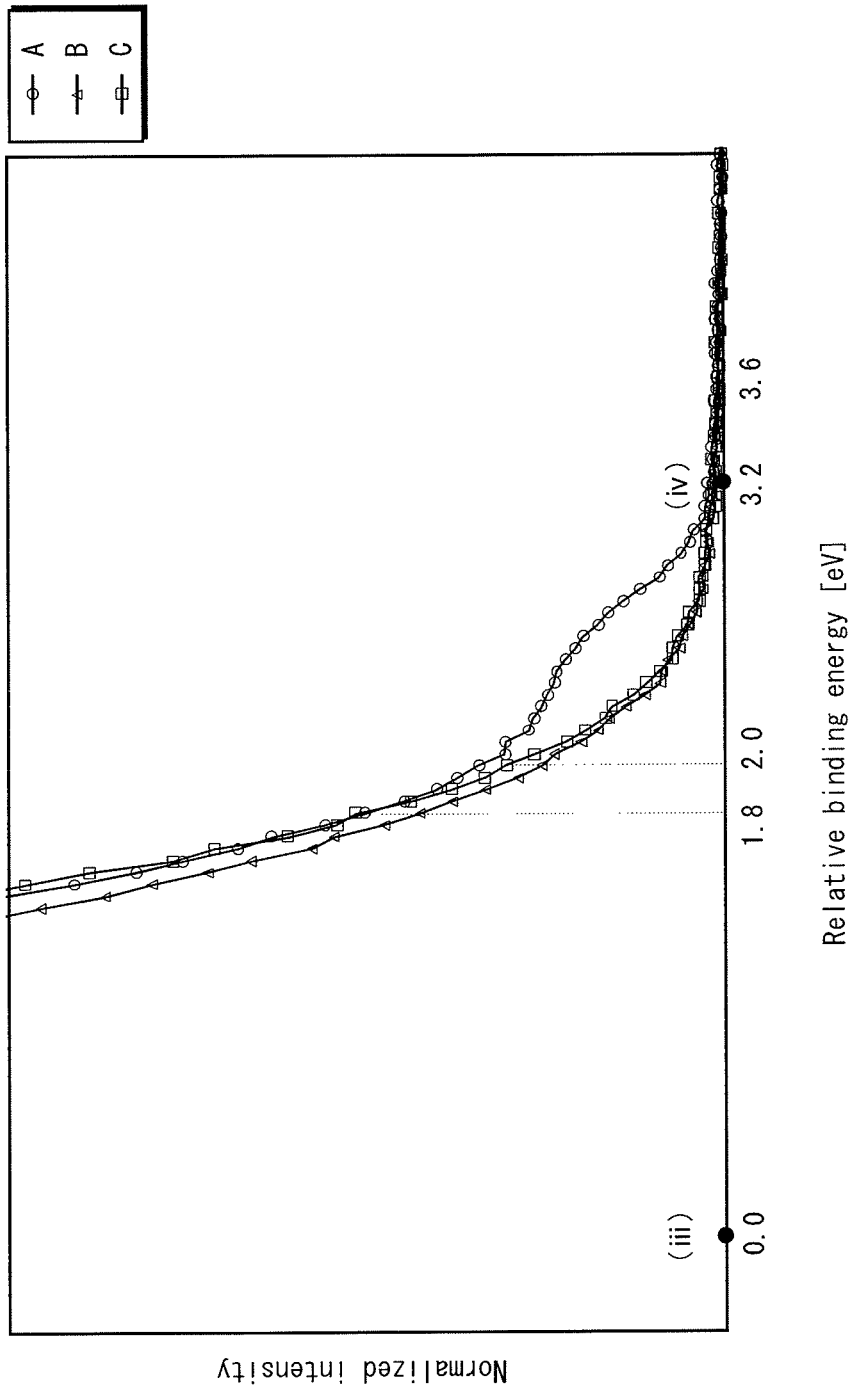
FIG. 18 illustrates UPS spectra of a tungsten oxide layer.

The subsequent FIG. 18 illustrates a UPS spectrum of the tungsten oxide layer 12 of each of the sample devices A, B, and C, particularly within area y. The spectrum intensity indicated by the vertical axis in FIG. 18 has been normalized using the peak-top intensity value of a peak (ii) in FIG. 17, which is located approximately 3 eV to 4 eV to the high binding energy direction from point (iii). In addition, note that point (iii) in FIG. 18 is illustrated at the same point on the horizontal axis as in FIG. 17. In FIG. 18, the horizontal axis indicates a relative value (relative binding energy) with respect to point (iii), and the binding energy decreases from left to right.

As illustrated in FIG. 18, the spectrum indicating the tungsten oxide layer 12 of the sample device A exhibits a peak in an area between a point which is 3.6 eV lower in terms of the binding energy than point (iii) and a point which is 1.8 eV lower in terms of the binding energy than point (iii). Point (iv) in FIG. 18 indicates a point at which such a peak in the spectrum indicating the tungsten oxide layer 12 of the sample device A is first obviously observed. That is, point (iv) is a point at which the peak begins. The existence of such a peak is not observed in the spectra corresponding to sample devices B and C.

The present invention uses, for forming the hole injection layer, tungsten oxide whose UPS spectrum indicates an upward protrusion (not necessarily a peak) in an area which is 1.8 eV to 3.6 eV lower in terms of the binding energy than point (iii). Hence, the organic EL display panel 110 exhibits excellent hole injection efficiency.

Furthermore, it has been found that hole injection efficiency tends to increase when the upward protrusion has a higher degree of sharpness. Therefore, as illustrated in FIG. 18, it can be said that the area that is between 2.0 eV and 3.2 eV lower than point (iii) in terms of the binding energy is particularly important, since the upward protrusion is relatively easier to confirm in this area and has a relatively sharper inclination.

Note that, in the following description, the upward protrusion as observed in the UPS spectrum is referred to as "a spectral protrusion near the Fermi surface". Furthermore, the energy level corresponding to this spectral protrusion near the Fermi surface is the "the occupied energy level near the Fermi surface", which has been already described in the above.

Subsequently, the inventors performed differentiation on the normalized intensity of the UPS spectrum of each of the sample devices A, B, and C indicated in FIG. 18. The differentiation was performed for the purpose of making the spectral protrusion near the Fermi surface more distinguishable.

In specific, by using the graph analysis software IGOR Pro 6.0, binomial smoothing (where smoothing factor was set to 1) was conducted eleven times with respect to the UPS spectra illustrated in FIG. 18, and differentiation was subsequently performed applying the central difference method. Such processing of data was conducted so as to remove fluctuation factors such as background noise generated during the UPS measurement, to smoothen the differential curves, and to convey the arguments presented in the following in a clear manner as possible.

Figure 19:
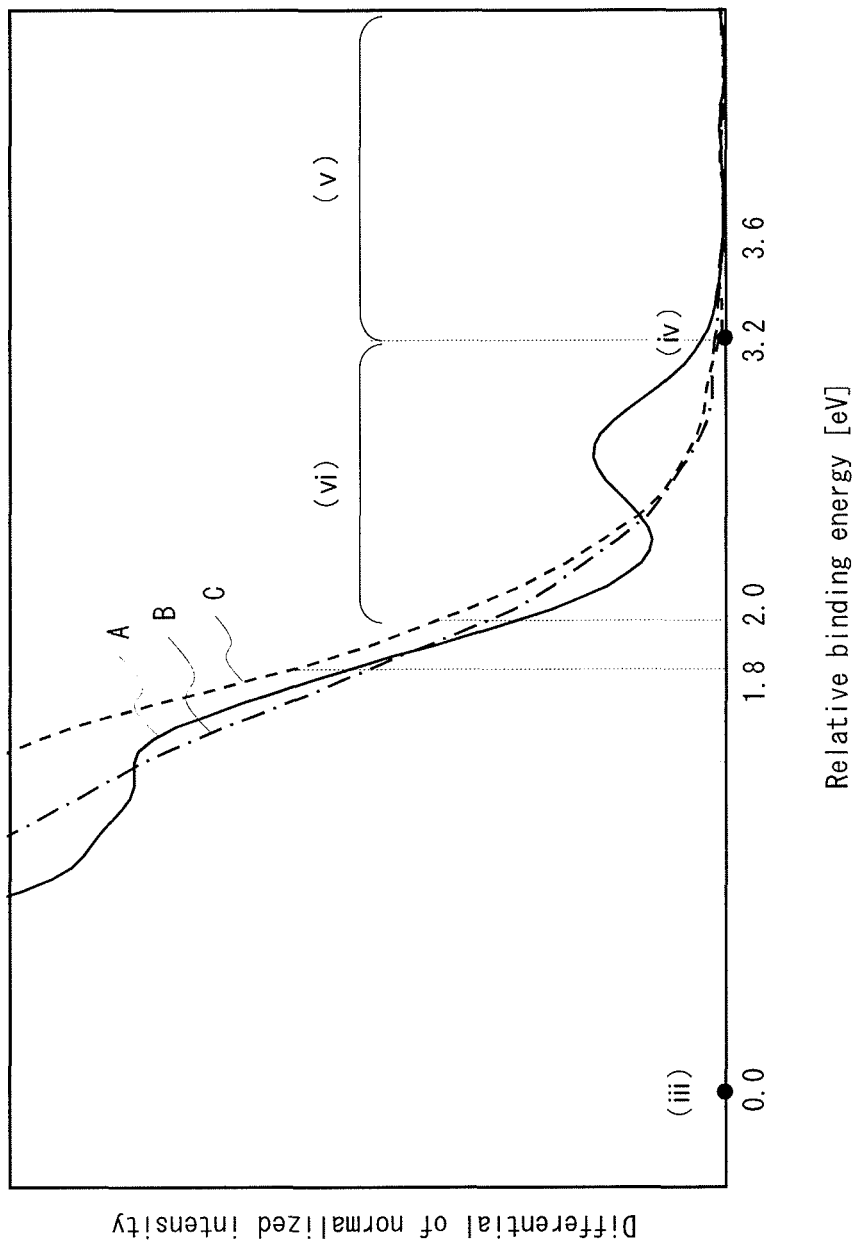
FIG. 19 illustrates differential curves corresponding to the respective UPS spectra illustrated in FIG. 18.

FIG. 19 illustrates differential curves yielded as a result of the above processing. Points (iii) and (iv) in FIG. 19 are provided at the same points on the horizontal axis as the respective points (iii) and (iv) in FIG. 18.

According to the differential curves illustrated in FIG. 19, the derivatives of normalized intensities of the tungsten oxide layers 12 corresponding to sample devices B and C do not depart from the vicinity of "0" within an area (v). Area (v) indicates an area which extends from a point which indicates a minimal binding energy that can be measured by using the photoelectron spectroscopy device to point (iv). Furthermore, in an area (vi) extending approximately 1.2 eV in the high binding energy direction from point (iv), the derivatives corresponding to sample devices B and C exhibit only a slight increase as approaching the high binding energy direction, although increase is seen in the increase rates thereof. In addition, the shapes of the differential curves corresponding to sample devices B and C within areas (v) and (vi) turn out to exhibit similarity with the respective UPS spectra illustrated in FIG. 18, from which the differential curves of FIG. 19 have been derived. Therefore, it can be said that the shapes of the UPS spectrum and the differential curve derived therefrom of each of sample devices B and C within areas (v) and (vi) resemble the shape of an exponential function curve.

On the other hand, for the tungsten oxide layer 12 of sample device A, the differential curve exhibits a rapid rise from the vicinity of point (iv) towards the direction of higher binding energy. Thus, the shape of the differential curve within the areas (v) and (vi) clearly differs from the shape of an exponential function curve. Similarly, in FIG. 18, the spectrum for sample device A from which FIG. 19 is derived begins to protrude in the vicinity of point (iv). At the same time, it is clear that the spectrum in FIG. 18 exhibits a spectral protrusion near the Fermi surface differing from the shape of an exponential function curve.

In other words, such a sample device A is characterized in that an occupied energy level near the Fermi surface is found in an area which is approximately 1.8 eV to 3.6 eV lower than the lowest binding energy of the valence band. In particular, a spectral protrusion near the Fermi surface corresponding to the occupied energy level near the Fermi surface can be clearly seen in the UPS spectrum in an area that is approximately between 2.0 eV and 3.2 eV lower than the lowest binding energy of the valence band.

Figure 20:
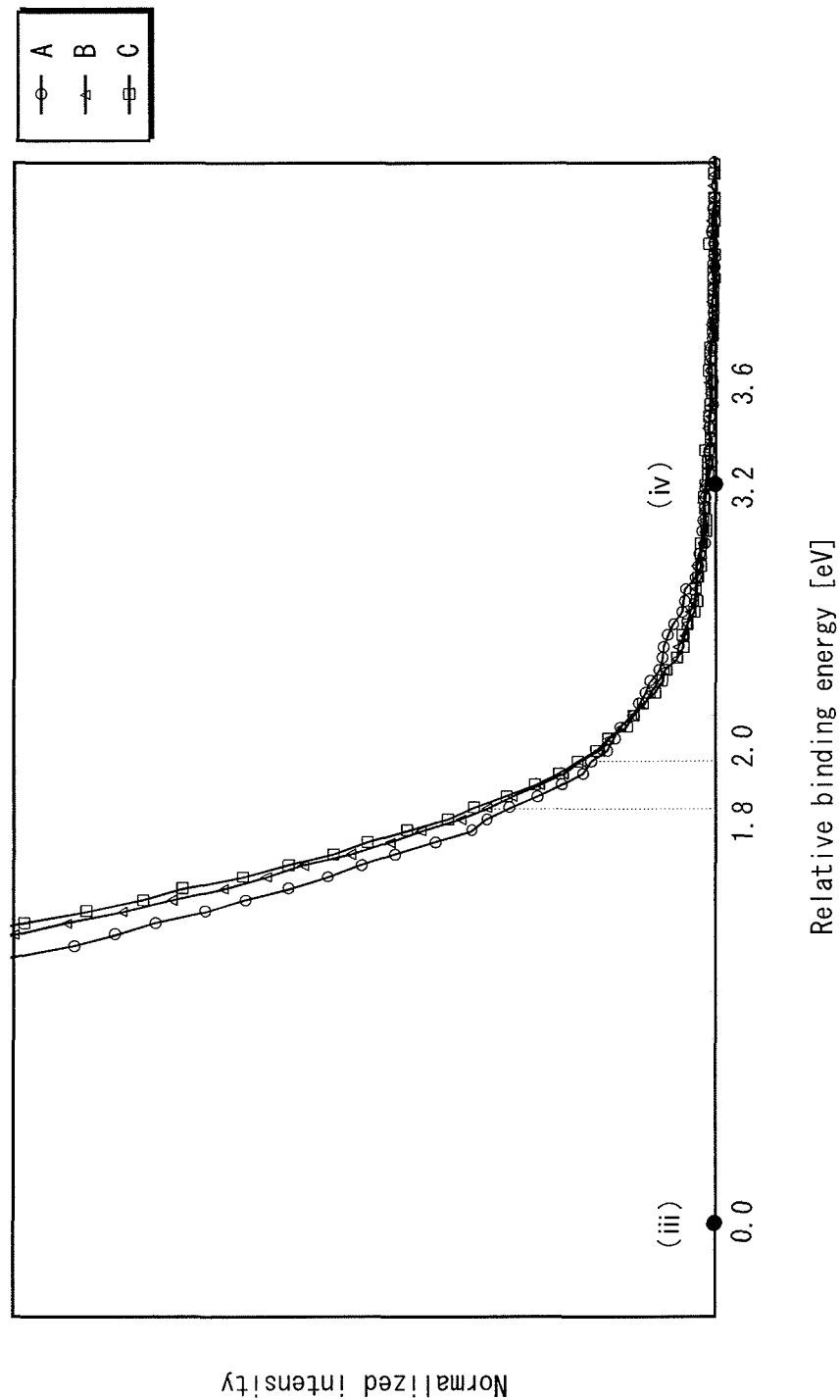
FIG. 20 illustrates UPS spectra of tungsten oxide layers that have been subjected to atmospheric exposure.

Next, the inventors conducted atmospheric exposure, at room temperature for a period of one hour, of the tungsten oxide layer 12 of each of the sample devices A, B, and C on which the UPS spectra measurement illustrated in FIG. 18 had been performed. These sample devices had not previously been exposed to the atmosphere after film formation. Following atmospheric exposure, the inventors then conducted UPS measurement again to confirm changes in the spectra. FIG. 20 illustrates UPS spectra within the above-mentioned area y. The horizontal axis in FIG. 20 is similar to the horizontal axis in FIG. 18, and points (iii) and (iv) in FIG. 20 are provided at the same points on the horizontal axis as the respective points (iii) and (iv) in FIG. 18.

According to the UPS spectra illustrated in FIG. 20, the tungsten oxide layer 12 of each of the sample devices B and C do not exhibit the spectral protrusion near the Fermi surface. Thus, it has been seen that the UPS spectra corresponding to the sample devices B and C do not exhibit the spectral protrusion both before or after atmospheric exposure. Contrariwise, it can be seen that the tungsten oxide layer 12 of the sample device A still exhibits the spectral protrusion near the Fermi surface, although the spectrum differs in intensity and shape when compared to before atmospheric exposure. Hence, it is observed that the tungsten oxide layer 12 of the sample device A maintains the same characteristics as before atmospheric exposure, even after conducting exposure thereof to the atmosphere for a certain period of time. Therefore, it can be concluded that the tungsten oxide layer 12 of the sample device A has a certain level of stability with respect to ambient atmosphere.

Thus far, the measured UPS spectra of the sample devices A, B, and C have been discussed. It should be noted, however, that the spectral protrusion near the Fermi surface can similarly be observed in the spectra obtained by XPS measurement or hard X-ray photoelectron spectroscopy measurement.

Figure 21:
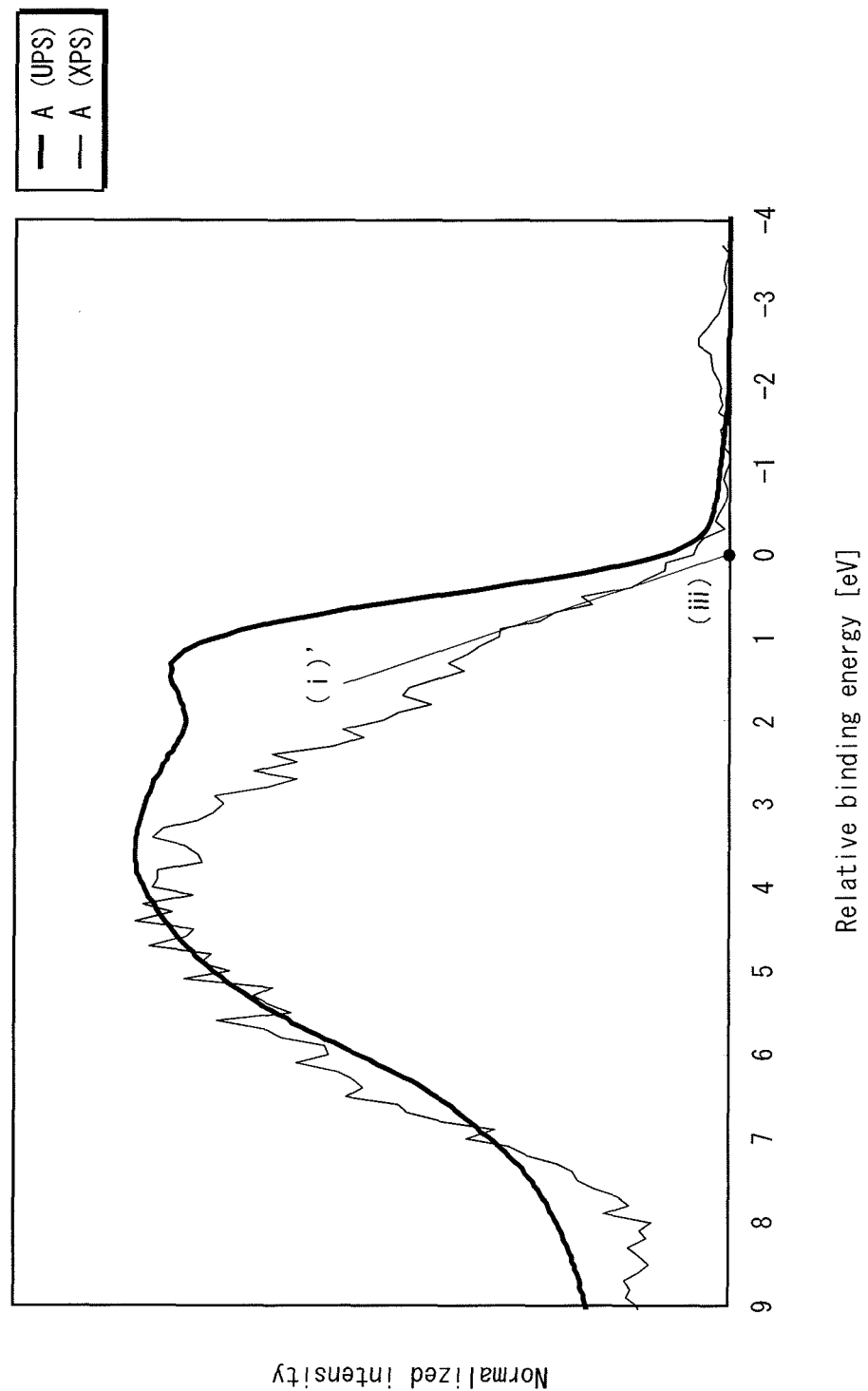
FIG. 21 illustrates both a UPS spectrum and an XPS spectrum of a tungsten oxide layer according to the present invention.

FIG. 21 illustrates an XPS spectrum of the tungsten oxide layer 12 of the sample device A after atmospheric exposure thereof. Note that, in FIG. 21, the XPS spectrum is overlaid with a UPS spectrum of the tungsten oxide layer 12 of the sample device A (the same UPS spectrum as illustrated in FIG. 17), so as to enable comparison between the two spectra.

The conditions under which the XPS measurement was conducted are similar to the conditions under which the UPS measurement was conducted as already described in the above, differing only in that an Al—Kα line was used as the light source. The interval between measurement points, however, was 0.1 eV. In FIG. 21, point (iii) is provided at the same point on the horizontal axis as point (iii) in FIG. 17, and further, the horizontal axis indicates a relative binding energy with respect to point (iii) in a manner similar to the horizontal axis in FIG. 18. In addition, a line in the XPS spectrum corresponding to the line (i) in FIG. 17 is illustrated as line (i)' in FIG. 21.

As illustrated in FIG. 21, the spectral protrusion near the Fermi surface of the tungsten oxide layer 12 of the sample device A is found in the XPS spectrum, as well as in the UPS spectrum, as a protrusion of a considerable degree within an area approximately between 1.8 eV and 3.6 eV lower than the lowest binding energy of the valence band. Further, the spectral protrusion near the Fermi surface was similarly found when a hard X-ray photoemission spectroscopy measurement was conducted.

In the above, the sample device 1A (illustrated in FIG. 16) was used, instead of the organic EL element 1 which is illustrated in FIG. 11, as the sample device for conducting the photoelectron spectroscopy measurements. The sample device 1A has a structure which differs from the organic EL element 1, and is formed by disposing a tungsten oxide layer 12 on the conductive silicon substrate 11. Here, it should be noted that this measure has been taken merely for the sake of preventing the occurrence of charge-up, and thus, the structure of the organic EL display panel 110 pertaining to the present invention is not to be limited to such a structure.

According to another experiment conducted by the inventors of the present invention, when UPS measurement and XPS measurement were conducted against a sample device having the structure of the organic EL element 1 as illustrated in FIG. 11 (the structure where the anode composed of ITO and the hole injection layer composed of tungsten oxide are layered in the stated order on one surface of the substrate 10), charge-up occurred during measurement of the tungsten oxide layer under film forming conditions B and C.

However, by using a neutralizing electron gun that cancels such charge-up, a similar spectrum as for sample device 1A was obtained at least in the range extending from the band gap to the lowest binding energy in the valence band, even though in some cases the absolute value of the binding energy indicated by each of the occupied energy levels of the hole injection layer (for example, the binding energy value when the Fermi level of the photoelectron spectroscopy device itself is set as a reference point) differed from the corresponding value of the tungsten oxide layer 12 of the sample device 1A for photoelectron spectroscopy measurement.

(Analysis of Hole Injection Efficiency from the Hole Injection Layer to the Functional Layer)

The principle of the effect that the existence of the occupied energy level near the Fermi surface in the hole injection layer composed of tungsten oxide has on the efficiency of hole injection from the hole injection layer to the functional layer can be explained as provided in the following. Note that the existence of the occupied energy level near the Fermi surface is to be observed as a spectral protrusion near the Fermi surface in, for instance, a UPS spectrum of the hole injection layer.

It has been frequently reported, with reference to results of experiments and first principles calculations, that existence of the occupied energy level near the Fermi surface, which can be seen in a thin film or a crystal of tungsten oxide, derives from a structure similar to an oxygen vacancy.

More specifically, assumption has been made that the existence of the occupied energy level near the Fermi surface derives from a binding orbital formed by 5d orbitals of adjacent tungsten atoms due to a deficiency of oxygen atoms, or from a 5d orbital of a singular tungsten atom which is not terminated with an oxygen atom and which exists at the surface of a film or within a film. Further, it is assumed that such 5d orbitals, when either in semi-occupied state or unoccupied state, are capable of pulling an electron off of the highest occupied molecular orbital of an organic molecule when contact is formed therebetween. The pulling of an electron from the organic molecule performed by the 5d orbital is believed to have the effect of stabilizing the energy state of both the tungsten atom and the organic molecule.

As a matter of fact, a report has been made that, when a layer composed of α-NPD, which is a small organic molecule, is layered on a thin film of molybdenum oxide, electrons transfer from the α-NPD molecule to the molybdenum oxide thin film (Non-Patent Literature 3). Note that molybdenum oxide has many common physical properties similar to those of tungsten oxide, such as a catalyst effect, electrochromism, and photochromism.

Further in detail, the inventors of the present invention have arrived at the conception that, in the case of tungsten oxide, a semi-occupied 5d orbital or a structure similar thereto of a single tungsten atom corresponds to the occupied energy level near the Fermi surface. The semi-occupied 5d orbital is lower in terms of the binding energy than a binding orbital of 5d orbitals of adjacent tungsten atoms.

Figure 22:
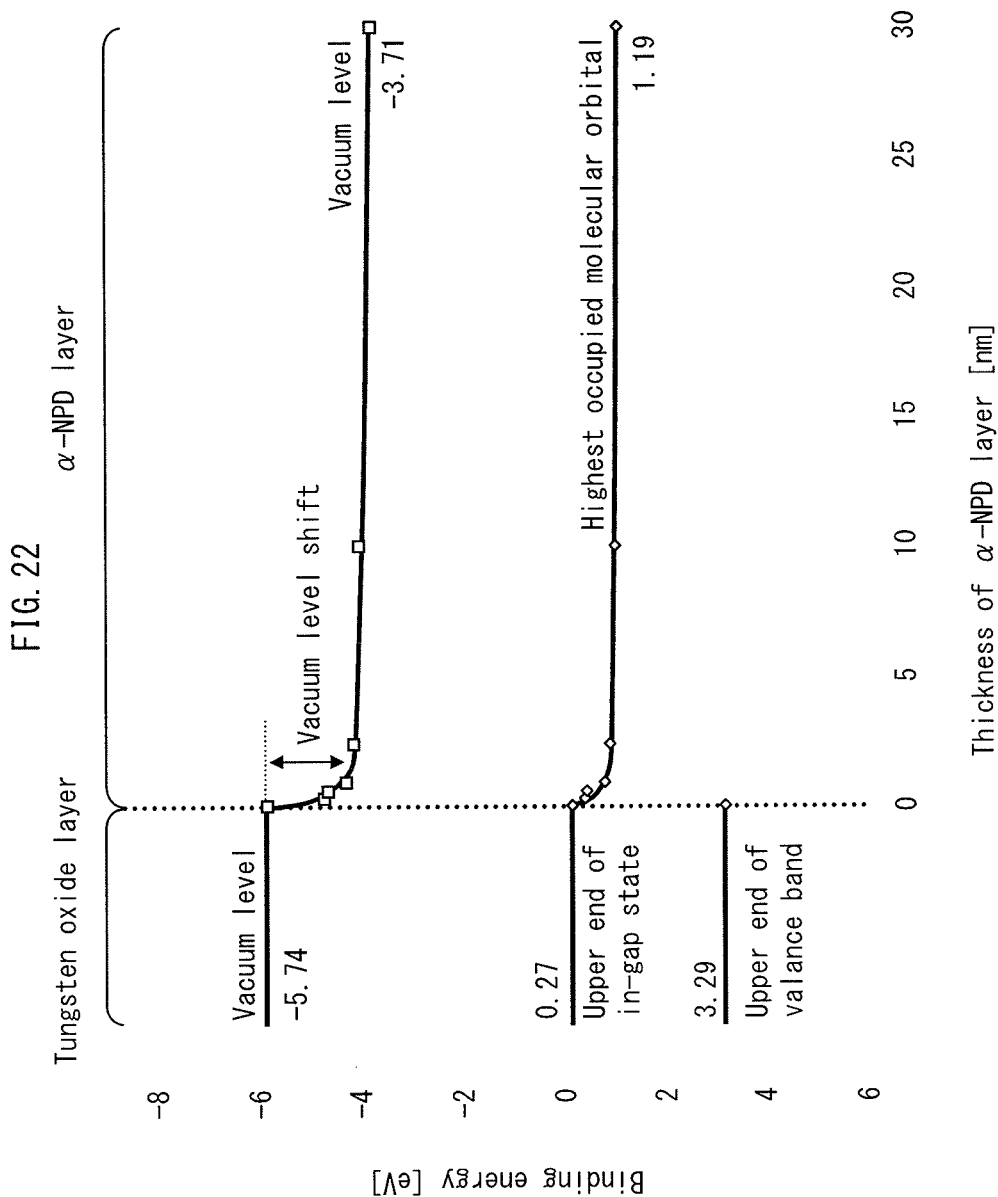
FIG. 22 is a diagram illustrating an energy state at an interface between the tungsten oxide layer according to the present invention and an α-NPD layer.

FIG. 22 is a diagram illustrating an energy state at an interface between an α-NPD layer and the tungsten oxide layer according to the present invention and thus having the occupied energy level near the Fermi surface.

Within the tungsten oxide layer (corresponding to the hole injection layer), FIG. 22 illustrates the lowest binding energy of the valence band (the "upper end of the valence band" in FIG. 22) and the lowest binding energy of the occupied energy level near the Fermi surface, corresponding to the point at which the occupied energy level near the Fermi surface rises (the "upper end of the in-gap state" in FIG. 22). Seen in relation to the UPS spectrum of the tungsten oxide layer, the upper end of the valence band in FIG. 22 corresponds to point (iii) in FIG. 17, and the upper end of the in-gap state in FIG. 22 corresponds to point (iv) in FIG. 18.

In addition, FIG. 22 illustrates a thickness of the α-NPD layer and a binding energy of the highest occupied molecular orbital of the α-NPD, in a case where the α-NPD layer (corresponding to the functional layer) is disposed on the tungsten oxide layer. Furthermore, a vacuum level of each of tungsten oxide layer and the α-NPD layer is provided as well, in relation to the other energy levels illustrated. Here, the binding energy of the highest occupied molecular orbital of the α-NPD layer corresponds to the binding energy at a point at which a peak in the highest occupied molecular orbital begins in the UPS spectrum, i.e. the lowest binding energy of the highest occupied molecular orbital in the α-NPD.

More specifically, the energy diagram illustrated in FIG. 22 is obtained through repeated alternate execution of the UPS measurement and the ultra high vacuum vapor deposition of the α-NPD, where the tungsten oxide layer formed on the ITO substrate is transferred back and forth between a photoelectron spectroscopy device and a ultra high vacuum vapor deposition device connected to the photoelectron spectroscopy device. Since the occurrence of charge-up was not encountered during the UPS measurement, the binding energy on the vertical axis in FIG. 22 is indicated as an absolute value taken with respect to a reference point, which is the Fermi surface of the ITO substrate.

It could be seen in FIG. 22 that, at least within a range of between 0 and 0.3 nm from the surface of the α-NPD layer facing the tungsten oxide layer, or that is, in a vicinity of the interface between the tungsten oxide layer and the α-NPD layer, the upper end of the in-gap state of the tungsten oxide layer and the highest occupied molecular orbital of the α-NPD layer are substantially equivalent in terms of the binding energy. Thus, a state can be seen where, so to speak, the energy levels of the tungsten oxide layer and the α-NPD layer are in alignment with each other (hereinafter, this state is referred to as an "interface energy level alignment"). Here, it should be noted that the state of "substantially equivalent" as referred to in the above actually includes a state where a slight difference exists between the binding energies of the two layers, and denotes a range of ±0.3 eV inclusive, to be specific.

Further, it can be seen from FIG. 22 that the interface energy level alignment is formed as a result of interaction between the tungsten oxide and the α-NPD, and not by mere coincidence. Refer to the following for reasons as to why such an indication can be made.

For instance, the change in vacuum level (vacuum level shift) observed at the interface between the tungsten oxide layer and the α-NPD layer indicates that an electrical double layer is formed at the interface. Further, considering the direction in which the vacuum level shift is oriented, it can be seen that the electrical double layer is formed to be negative in the direction of the tungsten oxide layer, and positive in the direction of the α-NPD layer. In addition, since the magnitude of the vacuum level shift is considerably large near 2 eV, it can be reasonably assumed that the electrical double layer has been formed not due to physical adsorption or the like, but rather as a result of an effect similar to a chemical bond. Thus, it can be reasonably assumed that the interface energy level alignment has been formed as a result of interaction between the tungsten oxide and the α-NPD.

Further, the inventors of the present invention assume that the interaction, in specific, is caused by a mechanism as described in the following.

First of all, as described above, the occupied energy level near the Fermi surface derives from the 5d orbital of a tungsten atom that has a structure similar to an oxygen vacancy. In the following, the 5d orbital of the tungsten atom is referred to as a "W5d orbital corresponding to the spectral protrusion".

When the highest occupied molecular orbital of an α-NPD molecule approaches the W5d orbital corresponding to the spectral protrusion at the surface of the tungsten oxide layer, an electron transfers from the highest occupied molecular orbital of the α-NPD molecule to the W5d orbital corresponding to the spectral protrusion. Such transfer of an electron takes place since both the tungsten oxide layer and the α-NPD molecule seek for stabilization of energy state. Hence, an electrical double layer is formed at the interface between the tungsten oxide layer and the α-NPD layer, which brings about a vacuum level shift and an interface energy level alignment observed in FIG. 22.

More specifically, many reports have been made, as a result of first principles calculations, that the highest occupied molecular orbital of an organic amine-containing molecule, such as α-NPD, is characterized in that the electron density thereof typically exhibits a distribution biased towards a nitrogen atom of the amine structure, and that the structure thereof includes, as the main component, a lone pair of electrons of the nitrogen atom. It can therefore be assumed that, particularly at the interface between the tungsten oxide layer and the layer of an organic amine-containing molecule, an electron transfers from the lone pair of electrons of the nitrogen atom in the amine structure of the amine-containing molecule, to the W5d orbital corresponding to the spectral protrusion.

This assumption is supported by reports made of interface energy level alignments, similar to the interface energy level alignment between the tungsten oxide layer and the α-NPD layer illustrated in FIG. 22, at interfaces formed between both α-NPD and F8BT and a vapor deposition film of molybdenum oxide, which has a physical property similar to tungsten oxide, as described above (see Non-Patent Literature 2, 4, and 5).

In the organic EL display panel pertaining to the present invention, the excellent efficiency of the hole injection layer for hole injection into the functional layer can be explained according to the interface energy level alignment as described above. That is, an interface energy level alignment occurs between the hole injection layer composed of tungsten oxide that has the occupied energy level near the Fermi surface and the adjacent functional layer. As a result, the binding energy at the point at which the occupied energy level near the Fermi surface begins to rise and the binding energy of the highest occupied molecular orbital of the functional layer become approximately equal. The injection of holes takes place between such energy levels having the interface energy level alignment formed therebetween. Therefore, the hole injection barrier between the hole injection layer and the functional layer pertaining to the present invention is nearly nonexistent.

The cause behind formation of the occupied energy level near the Fermi surface is a structure similar to an oxygen vacancy, and it is highly unlikely for tungsten oxide that is completely free of such a structure to actually exist. For example, it can be reasonably assumed that, even in such tungsten oxide as used to prepare the above-described sample devices B and C, which does not exhibit the spectral protrusion near the Fermi surface in the photoelectron spectroscopy spectrum, structures similar to an oxygen vacancy exist, however minimal they may be in number.

Figure 23A:
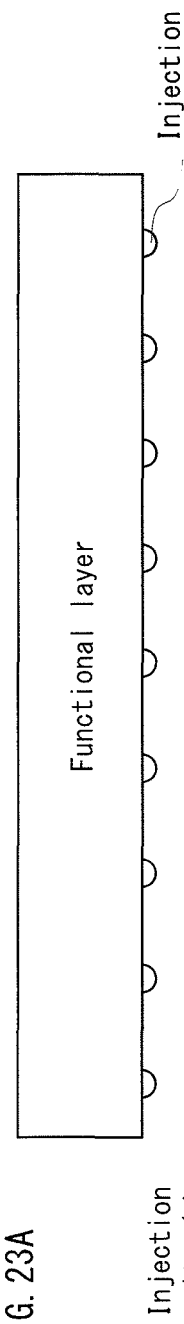
FIGS. 23A and 23B are diagrams for explanation of effects yielded by injection sites of the hole injection layer and a functional layer.
Figure 23B:
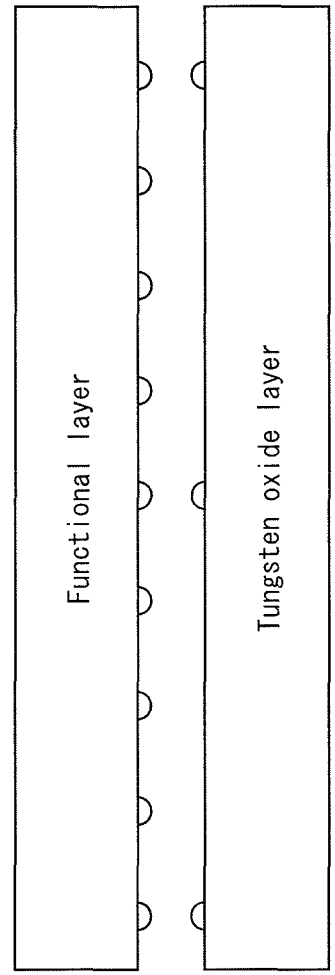

With respect to this point, explanation is now provided, with reference to FIGS. 23A and 23B, of the reason for which the hole-only device HOD-A and the organic EL element BPD-A, both having the hole injection layer which corresponds to the tungsten oxide layer 12 of the sample device A, exhibit the superb low driving voltage observed in the above experiments.

To bring about the interaction between the highest occupied molecular orbital of the organic molecule composing the functional layer and the occupied energy level near the Fermi surface of the tungsten oxide layer, the following condition needs to be fulfilled when disposing the tungsten oxide layer on the functional layer. Namely, at the interface between the layers, a portion of the organic molecule where the electron density of the highest occupied molecular orbital is high and a structure similar to an oxygen vacancy on the surface of the tungsten oxide layer (illustrated as "injection site x" in FIG. 23A) needs to approach (i.e. contact) each other to within a distance at which the interaction is triggered. The portion of the organic molecule (illustrated as "injection site y" in FIG. 23A) is, for instance, a nitrogen atom in the amine structure of an organic amine-containing molecule.

However, in a tungsten oxide layer as incorporated in the sample devices B and C, the number density of the injection sites x, if any, is extremely small, as illustrated in FIG. 23B. Accordingly, the upward protrusion near the Fermi surface does not appear in the UPS spectra thereof. Thus, the possibility of the injection site y and the injection site x coming into contact is extremely low. Since the injection of holes takes place where the injection site x and the injection site y fall into contact, it is clear that hole injection efficiency in sample devices B and C is extremely low.

In contrast to this, an abundance of injection sites y exists in the tungsten oxide layer which exhibits the spectral protrusion near the Fermi surface, as illustrated in FIG. 23A. Note that the tungsten oxide layer exhibiting the spectral protrusion near the Fermi surface is, for instance, the tungsten oxide layer incorporated in the above-mentioned sample device A. Thus, there is a high possibility of the injection sites y and the injection sites x coming into contact, thereby providing a high hole injection efficiency from the hole injection layer to the functional layer.

To further substantiate the analysis made thus far, the energy diagram at the interface with the α-NPD layer was also measured, as in FIG. 22, for the tungsten oxide layer formed under film forming conditions C, i.e. the tungsten oxide layer in which no protrusion near the Fermi surface could be confirmed.

Figure 24:
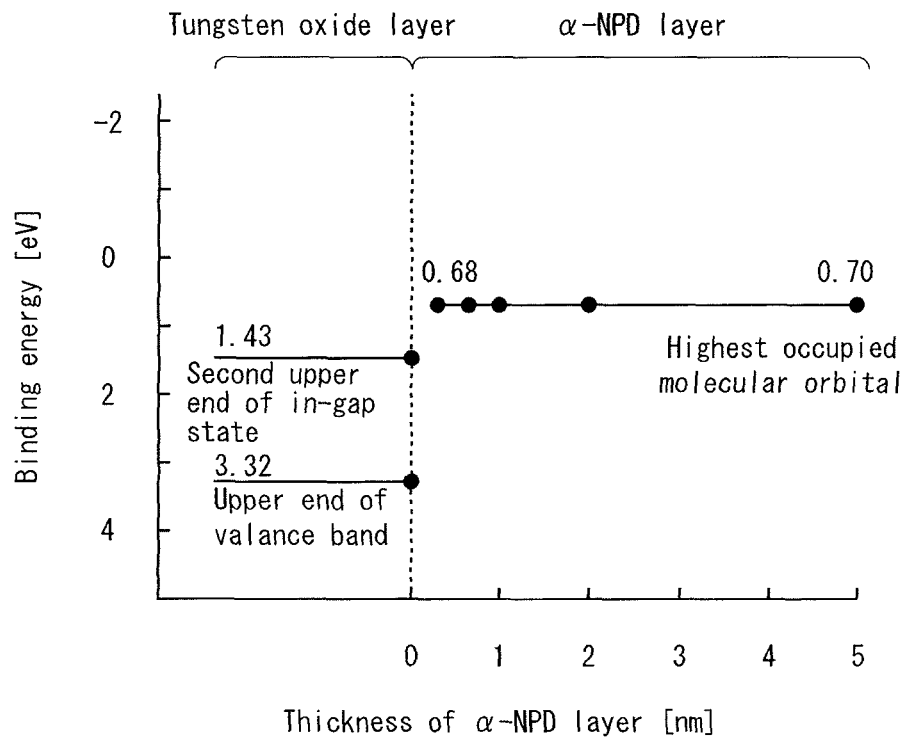
FIG. 24 is a diagram illustrating an energy state at an interface between the tungsten oxide layer formed under film forming conditions C and an α-NPD layer.

FIG. 24 shows the results. As described above, the upper end of the in-gap state of the tungsten oxide layer, which corresponds to the spectral protrusion near the Fermi surface, could not be confirmed at all. As a candidate for another energy level used in hole injection, FIG. 24 shows the point at which a structure different from the spectral protrusion ((z) in FIG. 17) rises (the "second upper end of the in-gap state"), this point being observed at a higher binding energy than the location of the spectral protrusion near the Fermi surface in the UPS spectrum. FIG. 24 also shows the upper end of the valence band.

However, the highest occupied molecular orbital of the α-NPD in FIG. 24 completely differs from FIG. 22 and approaches neither the second upper end of the in-gap state nor the upper end of the valence band. In other words, interface energy level alignment does not occur at all. This means that the second in-gap state and the valence band both hardly interact with the highest occupied molecular orbital of the α-NPD. Even if holes are injected from the second upper end of the in-gap state to the highest occupied molecular orbital of the α-NPD, the injection barrier is 0.75 eV, an extremely large value compared to FIG. 22, in which the injection barrier is nearly zero.

It is considered that this difference in the injection barrier greatly affects the driving voltage and the light-emitting efficiency of the hole-only devices 1B and the organic EL elements 1 formed under film forming conditions A, B, and C. Specifically, the differences in characteristics between the hole-only devices 1B and the organic EL elements 1 formed under film forming conditions A, B, and C strongly suggest that the organic EL display panel 110 according to the present invention has excellent hole injection efficiency from the hole injection layer to the functional layer.

To summarize the above analysis, the excellent hole injection efficiency of the organic EL display panel 110 according to the present invention can be explained as follows.

Firstly, a hole injection layer composed of tungsten oxide exhibits, in the photoelectron spectroscopy spectrum thereof, an upward protrusion near the Fermi surface. This means that a considerable number of structures similar to an oxygen vacancy, as well as occupied energy levels near the Fermi surface deriving from the structures, exist along the surface of the hole injection layer.

The occupied energy level near the Fermi surface pulls an electron off from the organic molecule composing the functional layer adjacent to the hole injection layer. As a result, the occupied energy level near the Fermi surface establishes an interface energy level alignment with the highest occupied molecular orbital of the organic molecule.

As such, if a considerable number of structures similar to an oxygen vacancy is found along the surface of the hole injection layer, the probability increases of contact between the occupied energy level near the Fermi surface and a portion of the highest occupied molecular orbital with a high electron density in the organic molecule. Thus, the interface energy level alignment occurs efficiently, whereby the tungsten oxide layer exhibits excellent hole injection efficiency from the hole injection layer to the functional layer.

(Analysis of Hole Injection Efficiency from the Anodes to the Hole Injection Layer)

The following describes the Schottky ohmic contact formed between the anode and the hole injection layer composed of tungsten oxide according to the present invention. The stability of this contact (as dependent on the material and surface conditions of the anode) is also described.

1. Hole Injection Barrier Between Anode and Hole Injection Layer

FIGS. 25-28 are energy diagrams near the interface between the anode and the functional layer in a conventional organic EL element, in which the anode in the functional layer is directly laminated together. Here, α-NPD was used as the functional layer. The binding energy along the vertical axis in the figures represents absolute values, with the Fermi level of the anode at the origin.

Figure 25:
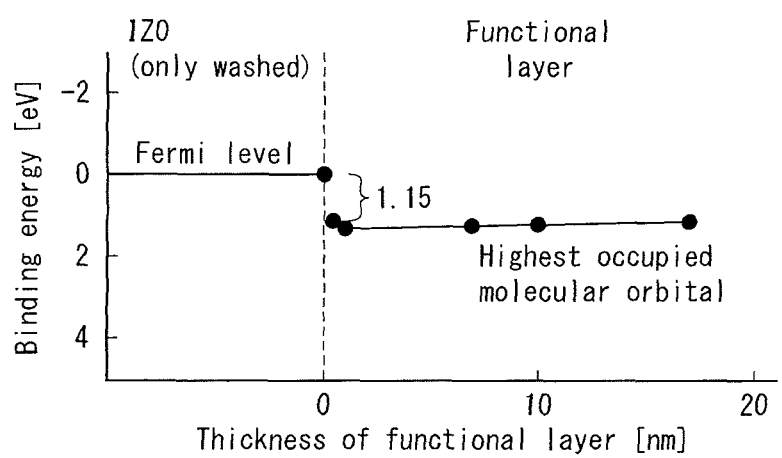
FIG. 25 is a diagram illustrating an energy state at an interface between the functional layer and an IZO anode cleaned with pure water.
Figure 26:
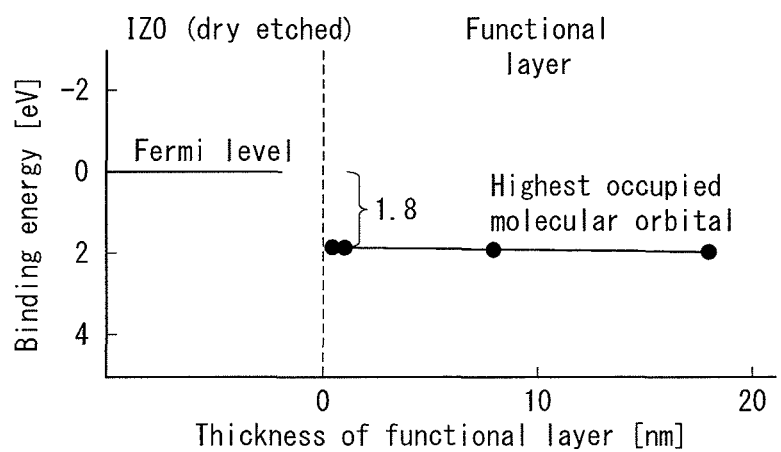
FIG. 26 is a diagram illustrating an energy state at an interface between the functional layer and an IZO cleaned with pure water and subsequently dry etched.

When the anode is formed from IZO, as in FIGS. 25 and 26, the hole injection barrier between the Fermi level of the anode and the highest occupied molecular orbital of the functional layer was quite large, exceeding 1 eV both when the surface of the anode was cleaned only with pure water, as in FIG. 25, and when dry etching was performed on the surface of the anode after cleaning with pure water, as in FIG. 26. The magnitude of the hole injection barrier has also been shown to vary greatly depending on differences in how the IZO surface is processed.

Figure 27:
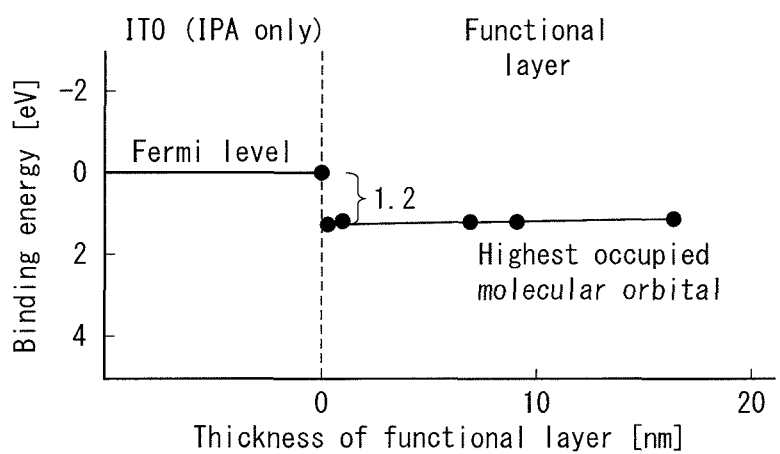
FIG. 27 is a diagram illustrating an energy state at an interface between the functional layer and an ITO anode cleaned with IPA.
Figure 28:
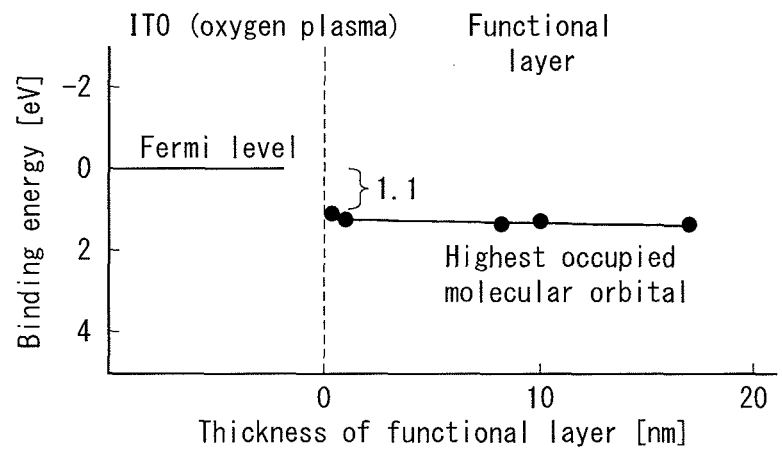
FIG. 28 is a diagram illustrating an energy state at an interface between the functional layer and an ITO anode cleaned with IPA and subsequently subject to oxygen plasma treatment.

When the anode is formed from ITO, as in FIGS. 27 and 28, is also clear that a very high hole injection barrier exists both when the surface of the anode is only cleaned with IPA (isopropanol), as in FIG. 27, and when the surface of the anode is further treated with oxygen plasma after cleaning with IPA, as in FIG. 28.

As illustrated in FIGS. 25-28, in a conventional organic EL element, the hole injection barrier between the anode and the functional layer varies greatly depending on the type of anode material and on the surface condition of the anode. Moreover, the barrier itself is large, thus clearly pointing to the potential for improvement with regards to driving voltage.

On the other hand, FIGS. 29-33 are energy diagrams near the interface between an anode and a hole injection layer when the anode is laminated with the hole injection layer composed of tungsten oxide according to the present invention.

Figure 29:
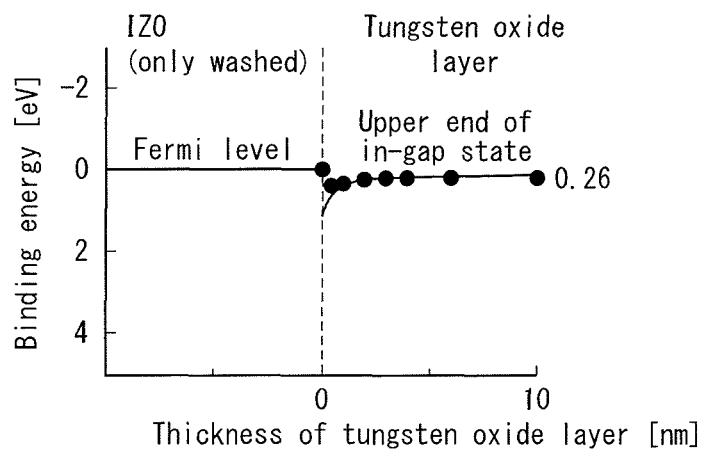
FIG. 29 is a diagram illustrating an energy state at an interface between the hole injection layer according to the present invention and an IZO anode cleaned with pure water.
Figure 30:
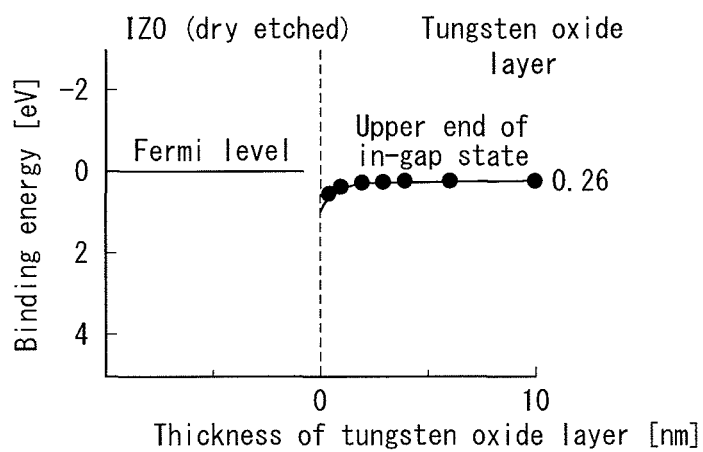
FIG. 30 is a diagram illustrating an energy state at an interface between the hole injection layer according to the present invention and an IZO anode cleaned with pure water and subsequently dry etched.

FIGS. 29 and 30 show the case of forming the anode from IZO. Like FIGS. 25 and 26, the surface of the anode was only cleaned with pure water in FIG. 29, whereas dry etching was performed on the surface of the anode after cleaning with pure water in FIG. 30. The hole injection layer according to the present invention was then laminated on the anodes manufactured in this way.

Figure 31:
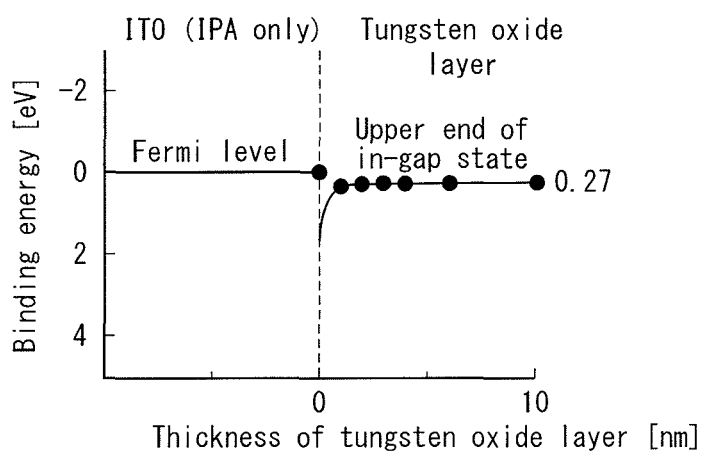
FIG. 31 is a diagram illustrating an energy state at an interface between the hole injection layer according to the present invention and an ITO anode cleaned with IPA.
Figure 32:
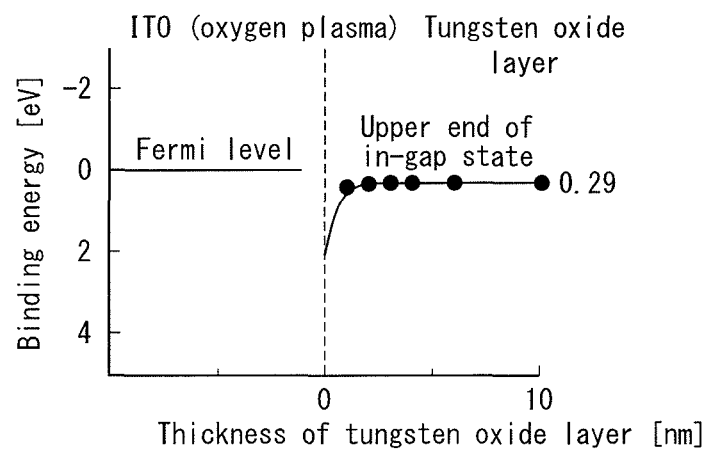
FIG. 32 is a diagram illustrating an energy state at an interface between the hole injection layer according to the present invention and an ITO anode cleaned with IPA and subsequently subject to oxygen plasma treatment.

FIGS. 31 and 32 show the case of forming the anode from ITO. Like FIGS. 27 and 28, the surface of the anode was only cleaned with IPA in FIG. 31, whereas the anode was treated with oxygen plasma after cleaning with IPA in FIG. 32. The hole injection layer according to the present invention was then laminated on the anodes manufactured in this way.

Figure 33:
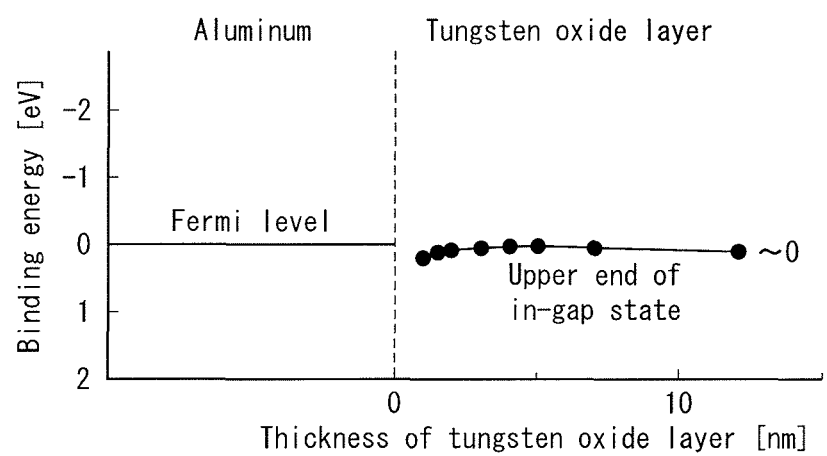
FIG. 33 is a diagram illustrating an energy state at an interface between the hole injection layer according to the present invention and an aluminum anode.

Furthermore, FIG. 33 shows the case of forming the anode from Al. After forming the anode, the hole injection layer according to the present invention was layered thereon without the anode being exposed to the atmosphere, so as to prevent the surface from undergoing natural oxidation.

The following conclusions can be drawn from the results shown in FIGS. 29-33.

First, in every one of FIGS. 29-33, when the thickness of the hole injection layer is less than 2 nm, the binding energy at the upper end of the in-gap state, which is the position at which the occupied energy level near the Fermi surface begins to rise, has a relatively sharp inclination. At a thickness of 2 nm or greater, however, the binding energy is nearly constant. The value of the binding energy upon becoming nearly constant is extremely close to the Fermi level of the anode, the difference being within a range of ±0.3 eV. In other words, in all of FIGS. 29-33, the width of the Schottky barrier between the anode and the hole injection layer according to the present invention is approximately 2 nm, meaning that excellent Schottky ohmic contact is achieved.

Furthermore, for the IZO anodes in FIGS. 29 and 30, as well as the ITO anodes in FIGS. 31 and 32, the difference in binding energy between the Fermi level of the anode and the upper end of the in-gap state when the thickness of the hole injection layer is 2 nm or greater does not depend on the surface conditions of the anode, but rather is nearly the same value (at most a difference of 0.02 eV).

The following conclusions can therefore be drawn. First of all, for all of the anode materials IZO, ITO, and Al, if the thickness of the hole injection layer according to the present invention is 2 nm or greater, the anode and the hole injection layer are in Schottky ohmic contact. Furthermore, if the surface conditions of the anode have at least undergone one of the above treatments, then this contact is not only preserved well, but the degree of contact (the above difference in binding energy) does not depend on differences in surface conditions of the anode, thereby maintaining an extremely stable, constant state.

Based on these results, using the hole injection layer composed of tungsten oxide according to the present invention promises excellent hole injection efficiency from the anodes to the hole injection layer without the need for a variety of procedures to maintain the work function and the surface conditions of the anode stable. In other words, no special care need be taken to carefully select the anode material, or to maintain the surface conditions of the anode strictly constant immediately before formation of the hole injection layer.

To summarize the above considerations, the hole injection layer composed of tungsten oxide according to the present invention includes an occupied energy level near the Fermi surface, and the energy level acts to achieve Schottky ohmic contact with the anode with almost no influence from the work function or surface conditions of the anode. Specifically, at a location that is 2 nm from the surface of the anode towards the hole injection layer, the difference in binding energy between the Fermi level of the anode and the occupied energy level falls within a range of ±0.3 eV. As a result, the hole injection barrier between the anode and the hole injection layer is greatly reduced.

Due to the action of the occupied energy level, as described above, the hole injection barrier between the hole injection layer according to the present invention and the functional layer is extremely small. Accordingly, holes can be injected from the anode to the hole injection layer as well as from the hole injection layer to the functional layer with nearly no barrier. Reducing the hole injection barrier in this way not only between the hole injection layer and the functional layer, but also between the anode and the hole injection layer, allows for an even better low driving voltage for the organic EL element. Furthermore, improving the hole injection efficiency reduces the burden on the organic EL element during driving thereof, thereby promising an increase in the operating lifetime of the organic EL element.

2. Confirmation of Stability of the Schottky Ohmic Contact

As described above, when the thickness of the hole injection layer composed of tungsten oxide according to the present invention is 2 nm or greater, a stable Schottky ohmic contact forms between the hole injection layer and the anode. This has also been confirmed based on characteristics of the organic EL element.

First, using the above-described hole-only devices HOD-a, the degree to which the hole injection efficiency from the anode to the hole injection layer is dependent on film thickness was assessed for the hole injection layer according to the present invention.

The hole injection layer in the hole-only device 1B was formed under the above film forming conditions A, with a thickness in a range between 5 nm and 30 nm. For comparison, a device in which the hole injection layer was omitted, i.e. a device in which the anode and the buffer layer were directly laminated together, was also manufactured (hereinafter referred to as a "film thickness of 0 nm"). The structure of other layers was the same as in the section "Conditions for Forming Tungsten Oxide Layer", Except for the device with a film thickness of 0 nm, the hole injection layer was formed under film forming conditions A in all of the hole-only devices 1B. Therefore, the hole injection efficiency from the hole injection layer to the buffer layer is assumed to be equivalent in all of the devices. Furthermore, the structures were identical except for the thickness of the hole injection layer. Accordingly, the main factors influencing the characteristics of the hole-only devices 1B are expected to be the thickness of the hole injection layer and the extent of formation of the Schottky ohmic contact between the anode and the hole injection layer.

First, the influence of the electric resistance of the hole injection layer might be considered. The resistance of the hole injection layer increases in proportion to the thickness of the hole injection layer. The resistivity of the hole injection layer under film forming conditions A, however, is 1/100 or less that of the buffer layer and the light-emitting layer 6B, as was confirmed by a separate experiment. Therefore, differences in resistance due to differences in the thickness of the hole injection layer make nearly no contribution to the characteristics of the hole-only devices 1B.

Accordingly, except for the device with the film thickness of 0 nm, the hole-only devices 1B should all have approximately the same characteristics as long as a stable Schottky ohmic contact is formed between the anode and the hole injection layer.

The hole-only devices 1B manufactured to have a hole injection layer with respective thicknesses of 0 nm, 5 nm, and 30 nm were connected to a direct current power supply, and voltage was applied thereto. Furthermore, by changing the applied voltage, an electric current value per unit surface area (current density) was calculated for different voltages. Note that hereinafter, the expression "driving voltage" refers to different voltages applied when the current density value is 10 mA/cm$^2$.

Table 5 shows the driving voltage for each of the hole-only devices 1B.

TABLE 5

| Thickness of Hole Injection Layer [nm] | Driving Voltage [V] |
|---|---|
| 0 | 30.0 |
| 5 | 20.1 |
| 30 | 20.2 |

The driving voltage for the element with a film thickness of 0 nm is quite high. This is considered to be because a large hole injection barrier forms between the anode and the buffer layer, due to the absence of the hole injection layer according to the present invention. On the other hand, in the devices 1B with a film thickness of 5 nm and 30 nm, the driving voltage is kept low. Furthermore, the driving voltage is nearly equal for both devices 1B, thus clearly not depending on film thickness. Based on this table, it can be concluded that when the thickness of the hole injection layer is at least 5 nm, a nearly constant Schottky ohmic contact forms between the anode and the hole injection layer according to the present invention, thereby achieving excellent hole injection efficiency from the anode to the hole injection layer.

Next, the degree to which the hole injection efficiency from the anode to the hole injection layer is dependent on film thickness was assessed for the hole injection layer according to the present invention in the organic EL element 1 as well. The thickness of the hole injection layer was in a range between 2 nm and 30 nm.

Since the structure of the organic EL elements 1 was the same except for the thickness of the hole injection layer, the elements should all have approximately the same characteristics as long as a stable Schottky ohmic contact is formed between the anode and the hole injection layer.

Organic EL elements 1 manufactured to have a hole injection layer with respective thicknesses of 2 nm, 5 nm, 15 nm, 20 nm, and 30 nm were connected to a direct current power supply, and voltage was applied thereto. Furthermore, by changing the applied voltage, an electric current value per unit surface area (current density) was calculated for different voltages. Note that hereinafter, the expression "driving voltage" refers to different voltages applied when the current density value is 10 mA/cm$^2$.

Table 6 shows the driving voltage for each of the organic EL elements 1.

TABLE 6

| Thickness of Hole Injection Layer [nm] | Driving Voltage [V] |
|---|---|
| 2 | 8.6 |
| 5 | 8.4 |
| 15 | 8.7 |
| 20 | 8.7 |
| 30 | 8.4 |

Each of the driving voltages is a good, low value. Taking into consideration variations in the thickness of each layer that naturally occur during manufacturing of the elements, these driving voltages can be concluded not to depend on the thickness of the layers and to be sufficiently equivalent. Therefore, as with the hole-only devices 1B, it can be assumed that a nearly constant Schottky ohmic contact forms between the anode and the hole injection layer according to the present invention in the organic EL elements 1 as well when the thickness of the hole injection layer is 2 nm or greater.

Next, the relationship between the thickness of the hole injection layer according to the present invention and the operating lifetime of the organic EL element was assessed using organic EL elements 1.

The organic EL elements 1 were manufactured with the same structure as in Table 6, with the thickness of the hole injection layer being in a range between 2 nm and 30 nm. For comparison, an organic EL element 1 with a film thickness of 0 nm, i.e. an element without a hole injection layer, was also manufactured.

Since the structure of the organic EL elements 1 was the same except for the thickness of the hole injection layer, the elements are expected to have approximately the same lifetime as long as a stable Schottky ohmic contact is formed between the anode and the hole injection layer.

The organic EL elements 1 respectively manufactured to have hole injection layers with a thickness of 0 nm, 2 nm, 5 nm, and 30 nm were connected to a direct current power supply and were driven at a constant current with a current density of 10 mA/cm$^2$. Changes in the luminance of the emitted light in accordance with driving time were measured.

For each organic EL element 1, Table 7 shows the time from the start of driving for the luminance to decrease to 60%.

TABLE 7

| | Thickness of Hole Injection Layer (nm) | | | |
|---|---|---|---|---|
| | 0 | 2 | 5 | 30 |
| Time for Decrease in Luminance (hours) | 100 | 150 | 150 | 170 |

From Table 7, it is clear that the luminance of the organic EL element 1 with a film thickness of 0 nm decreases quickly, i.e. that the lifetime is short. This is considered to be because a large hole injection barrier forms between the anode and the buffer layer, due to the absence of the hole injection layer according to the present invention. It thus becomes necessary to apply a high driving voltage in order to maintain constant current, increasing the burden on the organic EL element 1 and thereby greatly affecting the lifetime.

On the other hand, in the organic EL elements 1 with a film thickness of 2 nm, 5 nm, and 30 nm, the decrease in luminance is lower than the organic EL element 1 with a film thickness of 0 nm, i.e. the lifetime is longer. This is considered to be because the hole injection layer according to the present invention effectively reduces the hole injection barrier, thereby reducing the necessary driving voltage and lessening the burden on the organic EL elements 1.

The results were good for the organic EL elements 1 with respective film thicknesses of 2 nm, 5 nm, 30 nm, which all had an approximately equivalent decrease in luminance. Accordingly, it can be inferred that if the thickness of the hole injection layer is 2 nm or greater, a nearly constant Schottky ohmic contact forms between the anode and the hole injection layer according to the present invention, and therefore that any organic EL element 1 with a hole injection layer that is at least 2 nm thick will have an approximately equivalent driving voltage and an approximately equivalent lifetime.

The above experiments confirm, based on characteristics of the organic EL elements, that when the thickness of the hole injection layer composed of tungsten oxide according to the present invention is 2 nm or greater, a stable Schottky ohmic contact forms between the hole injection layer and the anode.

Note that in all the organic EL elements 1 shown in Table 1 and FIGS. 12-15, the Schottky ohmic contact forms between the anode and the hole injection layer, regardless of the film forming conditions for the hole injection layer. The Schottky ohmic contact forms as a result of a surface treatment on the ITO anode. Details concerning this point are provided in the following.

Like the method used in FIG. 22, repeating the cycle of forming the hole injection layer, under the respective film forming conditions described above, on the ITO anode and performing UPS measurement confirmed the existence of a spectral protrusion near the Fermi surface for hole injection layers having a thickness within approximately 2 nm, regardless of the film forming conditions, and confirmed the formation of Schottky ohmic contact with the anode. As the film thickness increased, however, the presence of a spectral protrusion near the Fermi surface depended on the film forming conditions, as in FIG. 18.

The following is considered to be the reason for this. Before formation of the hole injection layer, argon ion sputtering was performed on the surface of the ITO anode followed by cleaning of the ITO anode, so that oxygen vacancies formed on the surface of the ITO anode.

That is, since oxygen vacancies form on the surface of the ITO anode, it is made easier for oxygen atoms in the tungsten oxide to be pulled towards the ITO anode immediately after the start of formation of the hole injection layer. This results in the formation of numerous structures similar to an oxygen vacancy in the hole injection layer only near the interface. The Schottky ohmic contact according to the present invention thus forms between the anode and the hole injection layer.

Once the thickness of the hole injection layer reaches several nanometers immediately after the start of formation of the hole injection layer, the layer proceeds to form uniformly with the properties determined by the film forming conditions. Therefore, the characteristics shown in Table 1 and in FIGS. 12-15, in which the hole injection layer has a thickness of 30 nm, depend on the film forming conditions.

(Analysis of the Auxiliary Wiring and Schottky Ohmic Contact Between the Electron Injection Layer and the Hole Injection Layer)

Thus far, from the perspective of analyzing the anode of the hole injection layer and the organic EL element, carriers have been represented as holes, and current has been considered as flowing only from the anode to the hole injection layer. The Schottky ohmic contact between the electrode, such as the anode, and the hole injection layer according to the present invention is not limited to when current flows only from the electrode to the hole injection layer.

As described above, the occupied energy level near the Fermi surface is produced within a structure similar to an oxygen vacancy by an electron in the 5d orbital of a tungsten atom not bound with an oxygen atom. Unlike electrons in the valence band or electrons of organic molecules, these carriers can move relatively freely. In other words, the occupied energy level near the Fermi surface is a donor energy level or a metallic energy level of an n-type semiconductor in which electrons flow easily. Accordingly, electrons can be easily exchanged with the electrode in both directions ("electrons" being replaceable by "holes"). It is precisely this ease of exchange that allows for Schottky ohmic contact. With a separate experiment, the inventors confirmed that electrons flow ohmically in both directions in a double layered structure composed of the hole injection layer according to the present invention and each of ITO, IZO, Al, and Ba.

The above Schottky ohmic contact between the electrode and the hole injection layer according to the present invention of course also forms between the auxiliary wiring and the hole injection layer, as well as between the hole injection layer and the electron injection layer. Carriers can therefore easily be exchanged between these layers. As a result, although located between the auxiliary wiring and the electron injection layer, the hole injection layer according to the present invention does not block the injection of electrons from the hole injection layer to the electron injection layer nor from the auxiliary wiring to the hole injection layer. With respect to this point, the hole injection layer according to the present invention differs greatly from a hole injection layer formed, for example, from copper phthalocyanine, PEDOT, or the like, in which injection of electrons from the auxiliary wiring is difficult.

As compared to when the auxiliary wiring and the electron injection layer are directly connected, the resistance of the connecting portion does increase due to the hole injection layer according to the present invention being located between the auxiliary wiring and the electron injection layer. Since the resistivity of the hole injection layer according to the present invention, however, is sufficiently low as compared to a typical functional layer composed of an organic substance. Furthermore, the thickness of the layer is at most several dozen nanometers in a typical organic EL element. Therefore, the contribution to resistance made by the hole injection layer according to the present invention is extremely small in view of the resistance of the entire organic EL display panel including the light-emitting cells and the wiring portions. Accordingly, the interposition of the hole injection layer according to the present invention in the connecting portion does not cause a substantial increase in the resistance of the wiring portion. An organic EL display panel adopting the hole injection layer according to the present invention therefore does not require a step to prevent formation of the hole injection layer on the auxiliary wiring.

In the present embodiment, the electron injection layer is layered onto the hole injection layer according to the present invention in the connecting portion, yet the electron injection layer in the connecting portion is not absolutely necessary, and may be omitted. In this case, the hole injection layer and the common electrode are in direct Schottky ohmic contact, which again does not lead to an increase in the resistance of the wiring portion.

After forming the light-emitting layers, an electron transport layer composed mainly of organic material or inorganic material may be formed to be continuous on the light-emitting cells and the connecting portions. In this case, the hole injection layer according to the present invention and the electron transport layer are adjacent in the connecting portions. As described above, the hole injection layer according to the present invention has the characteristics of an n-type semiconductor or a metal due to an occupied energy level near the Fermi surface. Therefore, a so-called p-n junction does not occur at the interface with the electron transport layer, thus yielding an interface with a small energy barrier at which it is relatively easy to inject electrons to the electron transport layer from the hole injection layer according to the present invention. With respect to this point as well, the hole injection layer according to the present invention differs greatly from a hole injection layer formed, for example, from copper phthalocyanine, PEDOT, or the like, in which the exchange of electrons with the electron transport layer is difficult.

Note that in the organic EL display panel 110 of the present embodiment, the anode 20 (first electrode) and the auxiliary wiring 30 provided above the substrate 10 are in parallel with one another, with the hole injection layer 40 therebetween. Yet, since the anode 20 and the auxiliary wiring 30 are separated by several dozen micrometers, the problem does not arise of an anode 20 and auxiliary wiring 30 with opposite polarities causing a short circuit across the hole injection layer 40.

(Additional Matters)

While an organic EL display panel and organic EL display apparatus according to the present invention have been concretely described, the above embodiments are merely examples for clearly illustrating the operations and advantageous effects of the present invention. The present invention is in no way limited to the above embodiments. For example, the size and the material listed for each component are merely typical examples to facilitate comprehension; the present invention is in no way limited to these sizes and materials.

An organic EL display panel according to an aspect of the present invention may be either a top emission type panel or a bottom emission type panel.

In a top emission type panel, instead of the structure shown in FIGS. 1A and 1B, the structure in which the pixel electrodes and the auxiliary wirings are only a metal film may be adopted. In this case, the light-emitting cell is composed, for example, of the following in order from the substrate: pixel electrode (metal film)/hole injection layer/buffer layer/light-emitting layer/electron injection layer/common electrode (transparent conductive film). The connecting portion is composed, for example, of the following in order from the substrate: auxiliary wiring (metal film)/hole injection layer/electron injection layer/common electrode (transparent conductive film).

On the other hand, in a bottom emission type panel, the pixel electrodes and the auxiliary wirings are, for example, formed by a transparent conductive film, whereas the common electrode is formed by a metal film. The light-emitting cell is composed, for example, of the following in order from the substrate: pixel electrode (transparent conductive film)/hole injection layer/buffer layer/light-emitting layer/electron injection layer/common electrode (metal film). The connecting portion is composed, for example, of the following in order from the substrate: auxiliary wiring (transparent conductive film)/hole injection layer/electron injection layer/common electrode (metal film).

Furthermore, the present invention may also be adopted in a double-sided emission type panel. In this case, the light-emitting cell is composed, for example, of the following in order from the substrate: pixel electrode (transparent conductive film)/hole injection layer/buffer layer/light-emitting layer/electron injection layer/common electrode (transparent conductive film). The connecting portion is composed, for example, of the following in order from the substrate: auxiliary wiring (transparent conductive film)/hole injection layer/electron injection layer/common electrode (transparent conductive film). A structure may also be adopted that partially provides a metal film as the auxiliary wiring.

In the above embodiments, the electron injection layer below the common electrode is not limited to being a metal layer. Either or both of an electron injection layer and an electron transport layer composed mainly of an organic material or an inorganic material may be adopted.

Furthermore, as one aspect of the present invention, the hole injection layer may be separated on the pixel electrodes and on the auxiliary wirings.

Furthermore, the method of driving organic EL display panel according to the present invention is not limited to the active-matrix method. For example, a passive matrix method may alternatively be used.

INDUSTRIAL APPLICABILITY

An organic EL display panel manufactured with the manufacturing method for an organic EL element according to an aspect of the present invention can be used as a display element for mobile phone displays and TVs, and as a light source for various applications. Regardless of the specific use thereof, the organic EL element is applicable as an organic EL element having a wide range of luminous intensity from low luminous intensity to high luminous intensity for the use as a light source or the like, and which can be driven at a low voltage. For having such a high level of performance, the organic EL element may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST 1 organic EL element (assessment device)
1A sample device for photoelectron spectroscopy measurement
1B hole-only element
2, 20, 20C first electrode (anode)
4, 12, 40, 40C, 40D hole injection layer (tungsten oxide layer)
6A, 60, 60C buffer layer
6B, 70, 70C light-emitting layer (organic layer)
8A barium layer
8B aluminum layer
8C cathode (Au)
9, 95C sealing layer
10, 10C substrate
11 conductive silicon substrate 17C planarizing layer
20X Al alloy thin film
25C ITO layer
25D IZO layer
25X IZO thin film
30, 30C auxiliary wiring (wiring)
35 connection aperture
40X thin film (tungsten oxide film)
40a, 40b concavity
45 pixel aperture
50, 50C bank
50A photoresist
50X bank material layer
51 mask
80, 85C metal layer (electron injection layer)
90, 90C second electrode (cathode)
95 light-emitting cell
95A light-emitting pixel
100 organic EL display apparatus
110, 110C organic EL display panel
110A intermediate product
120 drive control unit
121-124 drive circuit
125 control circuit

The invention claimed is:

1. An organic EL display panel comprising:
a substrate;
at least one first electrode on or in the substrate;
auxiliary wiring on or in the substrate at a distance from the first electrode;
a functional layer, including at least a light-emitting layer, above the first electrode;
a hole injection layer for injecting holes to the functional layer, the hole injection layer being between the first electrode and the functional layer; and
a second electrode above the functional layer, wherein
the hole injection layer and the second electrode are both disposed to be continuous above the first electrode and above the auxiliary wiring,
the second electrode and the auxiliary wiring are electrically connected by the hole injection layer, and
the hole injection layer contains tungsten oxide and has, in an electronic state thereof, an occupied energy level in a range between 1.8 electron volts and 3.6 electron volts lower than a lowest energy level of a valence band of the hole injection layer in terms of a binding energy.

2. The organic EL display panel according to claim 1, wherein
the second electrode is a transparent electrode.

3. The organic EL display panel according to claim 2, wherein
the transparent electrode is one of ITO and IZO.

4. The organic EL display panel according to claim 1, wherein
the second electrode contains one of Al and Ag as a primary component.

5. The organic EL display panel according to claim 1, further comprising:
a metal layer that is continuous above the first electrode and above the auxiliary wiring, wherein
above the first electrode, the metal layer is between the second electrode and the light-emitting layer, and
above the auxiliary wiring, the metal layer is between the second electrode and the hole injection layer.

6. The organic EL display panel according to claim 5, wherein
the metal layer is an electron injection layer that, above the first electrode, injects electrons from the second electrode to the light-emitting layer.

7. The organic EL display panel according to claim 6, wherein
the metal layer includes barium.

8. The organic EL display panel according to claim 1, wherein
the auxiliary wiring is one of ITO and IZO.

9. The organic EL display panel according to claim 1, wherein
the hole injection layer above the auxiliary wiring has properties identical to the hole injection layer above the first electrode.

10. The organic EL display panel according to claim 1, wherein
at least above the auxiliary wiring, the hole injection layer is at least 4 nanometers thick.

11. The organic EL display panel according to claim 1, further comprising:
a bank on the hole injection layer defining at least one aperture exposing the first electrode and including a region exposing the auxiliary wiring, wherein
the light-emitting layer is disposed above the first electrode in the aperture defined by the bank.

12. The organic EL display panel according to claim 11, wherein
the at least one first electrode comprises a plurality of first electrodes, one per pixel, and
the at least one aperture in the bank comprises a plurality of apertures in one-to-one correspondence with the first electrodes.

13. The organic EL display panel according to claim 11, wherein
the at least one first electrode comprises a plurality of first electrodes, one per pixel, arranged in lines, and
the at least one aperture in the bank comprises a plurality of apertures, one for each of the lines of the first electrodes.

14. The organic EL display panel according to claim 1, wherein
at an interface between the hole injection layer and the first electrode, a gap between the occupied energy level of the hole injection layer and an energy level of a highest occupied molecular orbital of the first electrode is at most 0.3 electron volts in terms of the binding energy.

15. The organic EL display panel according to claim 1, wherein
the hole injection layer is at least 2 nanometers thick.

16. The organic EL display panel according to claim 1, wherein
a UPS spectrum of the hole injection layer exhibits an upward protrusion in the range between 1.8 electron volts and 3.6 electron volts lower than the lowest energy level of the valence band in terms of the binding energy.

17. The organic EL display panel according to claim 1, wherein
an XPS spectrum of the hole injection layer exhibits an upward protrusion in the range between 1.8 electron volts and 3.6 electron volts lower than the lowest energy level of the valence band in terms of the binding energy.

18. The organic EL display panel according to claim 1, wherein
a differential spectrum obtained by differentiating a UPS spectrum of the hole injection layer exhibits a shape expressed by a non-exponential function throughout a range between 2.0 electron volts and 3.2 electron volts lower than the lowest energy level of the valence band in terms of the binding energy.

19. The organic EL display panel according to claim 1, wherein
the occupied energy level of the hole injection layer is in a range between 2.0 electron volts and 3.2 electron volts lower than the lowest energy level of the valence band in terms of the binding energy.

20. The organic EL display panel according to claim 1, wherein
at an interface between the hole injection layer and the functional layer, the occupied energy level of the hole injection layer causes a highest occupied molecular orbital of the functional layer, to be approximately equal to the occupied energy level in terms of the binding energy.

21. The organic EL display panel according to claim 20, wherein
at the interface between the hole injection layer and the functional layer, a gap between the occupied energy level and the highest occupied molecular orbital of the functional layer is at most 0.3 electron volts in terms of the binding energy.

22. The organic EL display panel according to claim 1, wherein
at an interface between the first electrode and the hole injection layer, the occupied energy level of the hole injection layer causes the binding energy of the occupied energy level to be approximately equal to a Fermi level of the first electrode.

23. The organic EL display panel according to claim 22, wherein
at the interface between the first electrode and the hole injection layer, a gap between the occupied energy level of the hole injection layer and the Fermi level of the first electrode is at most 0.3 electron volts in terms of the binding energy.

24. The organic EL display panel according to claim 1, wherein
at an interface between the auxiliary wiring and the hole injection layer, the occupied energy level of the hole injection layer causes the binding energy of the occupied energy level to be approximately equal to a Fermi level of the auxiliary wiring.

25. The organic EL display panel according to claim 24, wherein
at the interface between the auxiliary wiring and the hole injection layer, a gap between the occupied energy level of the hole injection layer and the Fermi level of the auxiliary wiring is at most 0.3 electron volts in terms of the binding energy.

26. The organic EL display panel according to claim 1, wherein
at an interface between the hole injection layer and the second electrode, the occupied energy level of the hole injection layer causes the binding energy of the occupied energy level to be approximately equal to a Fermi level of the second electrode.

27. The organic EL display panel according to claim 26, wherein
at the interface between the hole injection layer and the second electrode, a gap between the occupied energy level of the hole injection layer and the Fermi level of the second electrode is at most 0.3 electron volts in terms of the binding energy.

28. The organic EL display panel according to claim 1, wherein
at an interface between the hole injection layer and the electron injection layer, the occupied energy level of the hole injection layer causes the binding energy of the occupied energy level to be approximately equal to a Fermi level of the electron injection layer.

29. The organic EL display panel according to claim 28, wherein
at the interface between the hole injection layer and the electron injection layer, a gap between the occupied energy level of the hole injection layer and the Fermi level of the electron injection layer is at most 0.3 electron volts in terms of the binding energy.

30. An organic EL display apparatus comprising:
the organic EL display panel of claim 1.

31. An organic EL display panel comprising:
a substrate;
at least one first electrode on or in the substrate;
wiring on or in the substrate at a distance from the first electrode;
an organic layer above the first electrode, the organic layer containing organic material;
a tungsten oxide layer between the organic layer and the first electrode, the tungsten oxide layer containing tungsten oxide; and
a second electrode above the organic layer, wherein
the tungsten oxide layer and the second electrode are both disposed to be continuous above the first electrode and above the wiring,
the second electrode and the wiring are electrically connected by the tungsten oxide layer, and
the tungsten oxide layer has, in an electronic state thereof, an occupied energy level in a range between 1.8 electron volts and 3.6 electron volts lower than a lowest energy level of a valence band of the tungsten oxide layer in terms of the binding energy.

32. A manufacturing method for an organic EL display panel, the manufacturing method comprising:
a first step of forming a first electrode on or in a substrate;
a second step of forming auxiliary wiring on or in the substrate at a distance from the first electrode;
a third step of forming a hole injection layer to be continuous above the first electrode and above the auxiliary wiring;
a fourth step of forming, above the first electrode, a functional layer including at least a light-emitting layer; and
a fifth step of forming a second electrode to be continuous above the functional layer and above the hole injection layer formed above the auxiliary wiring, wherein
the second electrode and the auxiliary wiring are electrically connected by the hole injection layer, and
the hole injection layer contains tungsten oxide and has, in an electronic state thereof, an occupied energy level in a range between 1.8 electron volts and 3.6 electron volts lower than a lowest energy level of a valence band of the hole injection layer in terms of a binding energy.

33. The manufacturing method according to claim 32, further comprising:
between the third step and the fourth step, a step of forming a bank on the hole injection layer defining at least one aperture exposing the first electrode and including a region exposing the auxiliary wiring, wherein
in the fourth step, the functional layer is formed within the aperture defined by the bank.

34. The manufacturing method according to claim 32, wherein
in the third step, the hole injection layer formed above the auxiliary wiring has identical properties to the hole injection layer formed above the first electrode.

35. A manufacturing method for an organic EL display panel, the manufacturing method comprising:
a first step of forming a first electrode on or in a substrate;
a second step of forming wiring on or in the substrate at a distance from the first electrode;
a third step of foaming a tungsten oxide layer, containing tungsten oxide, to be continuous above the first electrode and above the wiring;
a fourth step of forming an organic layer, containing organic material, above the first electrode;

a fifth step of forming a second electrode to be continuous above the functional layer and above the tungsten oxide layer formed above the wiring, wherein the second electrode and the wiring are electrically connected by the tungsten oxide layer, and the tungsten oxide layer has, in an electronic state thereof, an occupied energy level in a range between 1.8 electron volts and 3.6 electron volts lower than a lowest energy level of a valence band of the tungsten oxide layer in terms of a binding energy.

* * * * *